US006870524B2

(12) United States Patent
Katsutani

(10) Patent No.: US 6,870,524 B2
(45) Date of Patent: Mar. 22, 2005

(54) DRIVING APPARATUS AND METHOD OF LIQUID CRYSTAL DISPLAY APPARATUS

(75) Inventor: Masafumi Katsutani, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 310 days.

(21) Appl. No.: 09/955,118

(22) Filed: Sep. 19, 2001

(65) Prior Publication Data

US 2002/0039096 A1 Apr. 4, 2002

(30) Foreign Application Priority Data

Sep. 29, 2000 (JP) ....................................... 2000-300970

(51) Int. Cl.[7] ................................................ G09G 3/36

(52) U.S. Cl. ........................................ 345/98; 345/100

(58) Field of Search ............................. 345/87, 88, 89, 345/98, 99, 100, 101, 103, 95, 96, 97, 204, 205, 208, 209

(56) References Cited

U.S. PATENT DOCUMENTS 5,093,655 A * 3/1992 Tanioka et al. ............... 345/96
5,233,340 A * 8/1993 Yamaguchi et al. ........ 345/690
5,365,284 A * 11/1994 Matsumoto et al. ........ 348/793
6,166,725 A * 12/2000 Isami et al. ................. 345/209
6,331,846 B1 * 12/2001 Nakao ......................... 345/96
6,388,653 B1 * 5/2002 Goto et al. ................... 345/98

FOREIGN PATENT DOCUMENTS

JP 5-56374 3/1993
JP A11249623 9/1999
JP A11249624 9/1999
JP 11-305735 11/1999

* cited by examiner

*Primary Examiner*—Xiao Wu
(74) *Attorney, Agent, or Firm*—Birch, Stewart, Kolasch & Birch, LLP

(57) ABSTRACT

A driving apparatus of liquid crystal display apparatus of the present invention has a changeover control circuit for controlling each switching of the inputs and outputs of first and second amplifier circuits. In the changeover control circuit, an offset voltage applied to a pixel by the first and second amplifier circuits is changed in its polarity for every predetermined number of frames in accordance with a switch changeover signal for operational amplifier and an alternation switch changeover signal input and the offset voltage is canceled by frames whose number is twice as many as the predetermined number of frames. This allows the circuit to cancel the offset voltage by the frames and to avoid that the display unevenness is discernible by human eyes, thereby ensuring to provide driving apparatus and driving method of liquid crystal display apparatus that can carry out the display with high quality.

20 Claims, 41 Drawing Sheets

VOLTAGE APPLIED TO PIXEL①-①

| FRAME | ① | ② | ③ | ④ | ⑤ | ⑥ | ⑦ | ⑧ | ⑨ | ⑩ | ⑪ | ⑫ | ⑬ | ⑭ |
|---|---|---|---|---|---|---|---|---|---|---|---|---|---|---|
| | +A | −B | +A | −B | +A | −B | +A | +B | −A | +B | −A | +B | −A | +B |

7 FRAME 7 FRAME

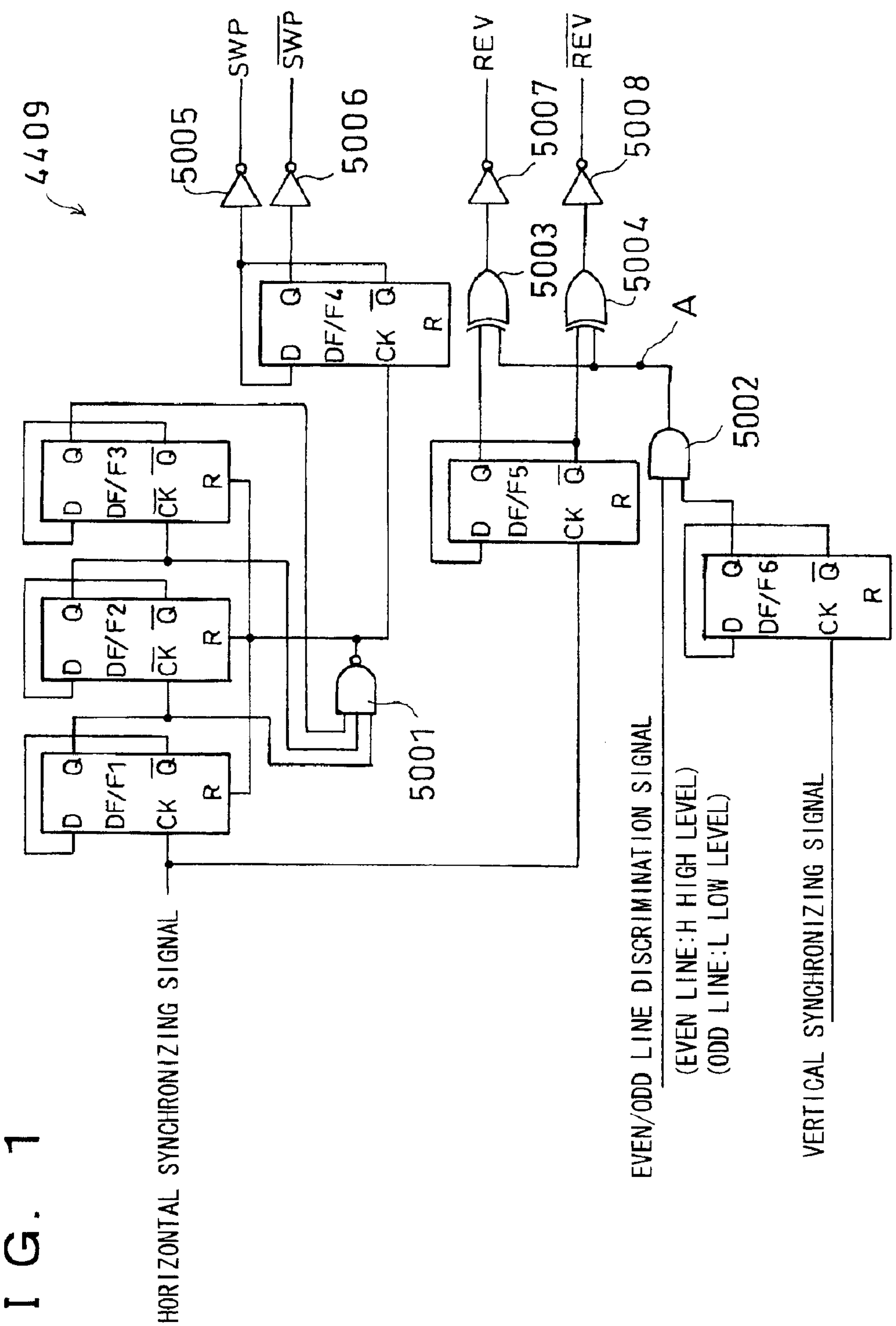
F I G. 1

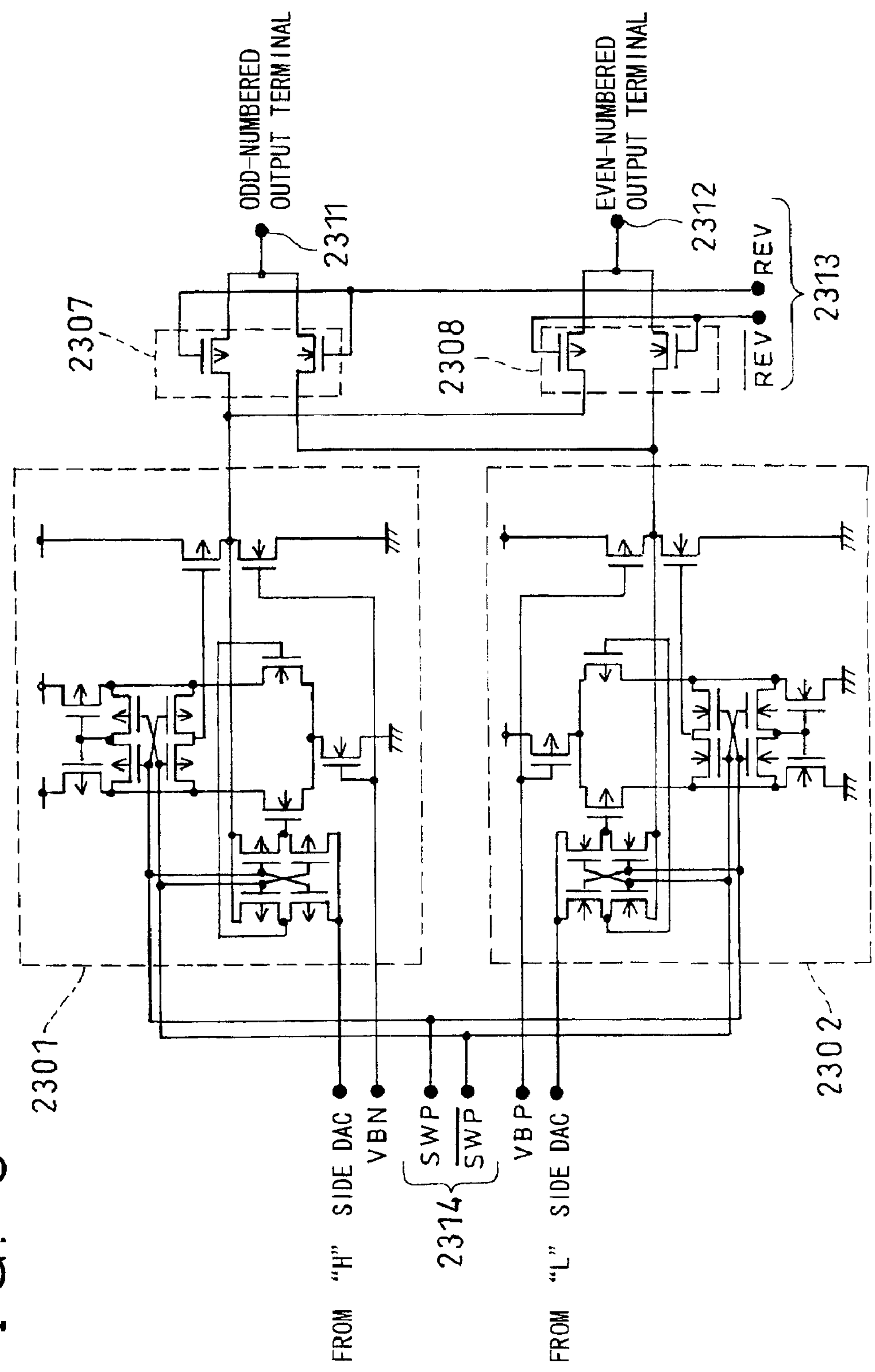
F I G. 3

FIG. 5

① FRAME

EVEN LINE

| | ① | ② | ③ | ④ | ⑤ | ⑥ | ⑦ | ⑧ | REV | SWP |
|---|---|---|---|---|---|---|---|---|---|---|
| ① | +A | +B | +A | +B | +A | +B | +A | +B | L | L |
| ② | +B | +A | +B | +A | +B | +A | +B | +A | H | L |
| ③ | +A | +B | +A | +B | +A | +B | +A | +B | L | L |
| ④ | +B | +A | +B | +A | +B | +A | +B | +A | H | L |
| ⑤ | +A | +B | +A | +B | +A | +B | +A | +B | L | L |
| ⑥ | +B | +A | +B | +A | +B | +A | +B | +A | H | L |
| ⑦ | +A | +B | +A | +B | +A | +B | +A | +B | L | L |
| ⑧ | -B | -A | -B | -A | -B | -A | -B | -A | H | H |

② FRAME

| | ① | ② | ③ | ④ | ⑤ | ⑥ | ⑦ | ⑧ | REV | SWP |
|---|---|---|---|---|---|---|---|---|---|---|
| ① | -B | -A | -B | -A | -B | -A | -B | -A | H | H |
| ② | -A | -B | -A | -B | -A | -B | -A | -B | L | H |
| ③ | -B | -A | -B | -A | -B | -A | -B | -A | H | H |
| ④ | -A | -B | -A | -B | -A | -B | -A | -B | L | H |
| ⑤ | -B | -A | -B | -A | -B | -A | -B | -A | H | H |
| ⑥ | -A | -B | -A | -B | -A | -B | -A | -B | L | H |
| ⑦ | +B | +A | +B | +A | +B | +A | +B | +A | H | L |
| ⑧ | +A | +B | +A | +B | +A | +B | +A | +B | L | L |

③ FRAME

| | ① | ② | ③ | ④ | ⑤ | ⑥ | ⑦ | ⑧ | REV | SWP |
|---|---|---|---|---|---|---|---|---|---|---|
| ① | +A | +B | +A | +B | +A | +B | +A | +B | L | L |
| ② | +B | +A | +B | +A | +B | +A | +B | +A | H | L |
| ③ | +A | +B | +A | +B | +A | +B | +A | +B | L | L |
| ④ | +B | +A | +B | +A | +B | +A | +B | +A | H | L |
| ⑤ | +A | +B | +A | +B | +A | +B | +A | +B | L | L |
| ⑥ | -B | -A | -B | -A | -B | -A | -B | -A | H | H |
| ⑦ | -A | -B | -A | -B | -A | -B | -A | -B | L | H |
| ⑧ | -B | -A | -B | -A | -B | -A | -B | -A | H | H |

④ FRAME

| | ① | ② | ③ | ④ | ⑤ | ⑥ | ⑦ | ⑧ | REV | SWP |
|---|---|---|---|---|---|---|---|---|---|---|
| ① | -B | -A | -B | -A | -B | -A | -B | -A | H | H |
| ② | -A | -B | -A | -B | -A | -B | -A | -B | L | H |
| ③ | -B | -A | -B | -A | -B | -A | -B | -A | H | H |
| ④ | -A | -B | -A | -B | -A | -B | -A | -B | L | H |
| ⑤ | +B | +A | +B | +A | +B | +A | +B | +A | H | L |
| ⑥ | +A | +B | +A | +B | +A | +B | +A | +B | L | L |
| ⑦ | +B | +A | +B | +A | +B | +A | +B | +A | H | L |
| ⑧ | +A | +B | +A | +B | +A | +B | +A | +B | L | L |

⑤ FRAME

| | ① | ② | ③ | ④ | ⑤ | ⑥ | ⑦ | ⑧ | REV | SWP |
|---|---|---|---|---|---|---|---|---|---|---|
| ① | +A | +B | +A | +B | +A | +B | +A | +B | L | L |
| ② | +B | +A | +B | +A | +B | +A | +B | +A | H | L |
| ③ | +A | +B | +A | +B | +A | +B | +A | +B | L | L |
| ④ | -B | -A | -B | -A | -B | -A | -B | -A | H | H |
| ⑤ | -A | -B | -A | -B | -A | -B | -A | -B | L | H |
| ⑥ | -B | -A | -B | -A | -B | -A | -B | -A | H | H |
| ⑦ | -A | -B | -A | -B | -A | -B | -A | -B | L | H |
| ⑧ | -B | -A | -B | -A | -B | -A | -B | -A | H | H |

⑥ FRAME

| | ① | ② | ③ | ④ | ⑤ | ⑥ | ⑦ | ⑧ | REV | SWP |
|---|---|---|---|---|---|---|---|---|---|---|
| ① | -B | -A | -B | -A | -B | -A | -B | -A | H | H |
| ② | -A | -B | -A | -B | -A | -B | -A | -B | L | H |
| ③ | +B | +A | +B | +A | +B | +A | +B | +A | H | L |
| ④ | +A | +B | +A | +B | +A | +B | +A | +B | L | L |
| ⑤ | +B | +A | +B | +A | +B | +A | +B | +A | H | L |
| ⑥ | +A | +B | +A | +B | +A | +B | +A | +B | L | L |
| ⑦ | +B | +A | +B | +A | +B | +A | +B | +A | H | L |
| ⑧ | +A | +B | +A | +B | +A | +B | +A | +B | L | L |

⑦ FRAME

| | ① | ② | ③ | ④ | ⑤ | ⑥ | ⑦ | ⑧ | REV | SWP |
|---|---|---|---|---|---|---|---|---|---|---|
| ① | +A | +B | +A | +B | +A | +B | +A | +B | L | L |
| ② | -B | -A | -B | -A | -B | -A | -B | -A | H | H |
| ③ | -A | -B | -A | -B | -A | -B | -A | -B | L | H |
| ④ | -B | -A | -B | -A | -B | -A | -B | -A | H | H |
| ⑤ | -A | -B | -A | -B | -A | -B | -A | -B | L | H |
| ⑥ | -B | -A | -B | -A | -B | -A | -B | -A | H | H |
| ⑦ | -A | -B | -A | -B | -A | -B | -A | -B | L | H |
| ⑧ | -B | -A | -B | -A | -B | -A | -B | -A | H | H |

A:VOLTAGE HAVING POSITIVE POLARITY
B:VOLTAGE HAVING NEGATIVE POLARITY

+:POSITIBE OFFSET
-:NEGATIVE OFFSET

⑧ FRAME

| | ① | ② | ③ | ④ | ⑤ | ⑥ | ⑦ | ⑧ | REV | SWP |
|---|---|---|---|---|---|---|---|---|---|---|
| ① | +B | +A | +B | +A | +B | +A | +B | +A | H | L |
| ② | +A | +B | +A | +B | +A | +B | +A | +B | L | L |
| ③ | +B | +A | +B | +A | +B | +A | +B | +A | H | L |
| ④ | +A | +B | +A | +B | +A | +B | +A | +B | L | L |
| ⑤ | +B | +A | +B | +A | +B | +A | +B | +A | H | L |
| ⑥ | +A | +B | +A | +B | +A | +B | +A | +B | L | L |
| ⑦ | +B | +A | +B | +A | +B | +A | +B | +A | H | L |
| ⑧ | -A | -B | -A | -B | -A | -B | -A | -B | L | H |

⑨ FRAME

| | ① | ② | ③ | ④ | ⑤ | ⑥ | ⑦ | ⑧ | REV | SWP |
|---|---|---|---|---|---|---|---|---|---|---|
| ① | -A | -B | -A | -B | -A | -B | -A | -B | L | H |
| ② | -B | -A | -B | -A | -B | -A | -B | -A | H | H |
| ③ | -A | -B | -A | -B | -A | -B | -A | -B | L | H |
| ④ | -B | -A | -B | -A | -B | -A | -B | -A | H | H |
| ⑤ | -A | -B | -A | -B | -A | -B | -A | -B | L | H |
| ⑥ | -B | -A | -B | -A | -B | -A | -B | -A | H | H |
| ⑦ | +A | +B | +A | +B | +A | +B | +A | +B | L | L |
| ⑧ | +B | +A | +B | +A | +B | +A | +B | +A | H | L |

⑩ FRAME

| | ① | ② | ③ | ④ | ⑤ | ⑥ | ⑦ | ⑧ | REV | SWP |
|---|---|---|---|---|---|---|---|---|---|---|
| ① | +B | +A | +B | +A | +B | +A | +B | +A | H | L |
| ② | +A | +B | +A | +B | +A | +B | +A | +B | L | L |
| ③ | +B | +A | +B | +A | +B | +A | +B | +A | H | L |
| ④ | +A | +B | +A | +B | +A | +B | +A | +B | L | L |
| ⑤ | +B | +A | +B | +A | +B | +A | +B | +A | H | L |
| ⑥ | -A | -B | -A | -B | -A | -B | -A | -B | L | H |
| ⑦ | -B | -A | -B | -A | -B | -A | -B | -A | H | H |
| ⑧ | -A | -B | -A | -B | -A | -B | -A | -B | L | H |

⑪ FRAME

| | ① | ② | ③ | ④ | ⑤ | ⑥ | ⑦ | ⑧ | REV | SWP |
|---|---|---|---|---|---|---|---|---|---|---|
| ① | -A | -B | -A | -B | -A | -B | -A | -B | L | H |
| ② | -B | -A | -B | -A | -B | -A | -B | -A | H | H |
| ③ | -A | -B | -A | -B | -A | -B | -A | -B | L | H |
| ④ | -B | -A | -B | -A | -B | -A | -B | -A | H | H |
| ⑤ | +A | +B | +A | +B | +A | +B | +A | +B | L | L |
| ⑥ | +B | +A | +B | +A | +B | +A | +B | +A | H | L |
| ⑦ | +A | +B | +A | +B | +A | +B | +A | +B | L | L |
| ⑧ | +B | +A | +B | +A | +B | +A | +B | +A | H | L |

⑫ FRAME

| | ① | ② | ③ | ④ | ⑤ | ⑥ | ⑦ | ⑧ | REV | SWP |
|---|---|---|---|---|---|---|---|---|---|---|
| ① | +B | +A | +B | +A | +B | +A | +B | +A | H | L |
| ② | +A | +B | +A | +B | +A | +B | +A | +B | L | L |
| ③ | +B | +A | +B | +A | +B | +A | +B | +A | H | L |
| ④ | -A | -B | -A | -B | -A | -B | -A | -B | L | H |
| ⑤ | -B | -A | -B | -A | -B | -A | -B | -A | H | H |
| ⑥ | -A | -B | -A | -B | -A | -B | -A | -B | L | H |
| ⑦ | -B | -A | -B | -A | -B | -A | -B | -A | H | H |
| ⑧ | -A | -B | -A | -B | -A | -B | -A | -B | L | H |

⑬ FRAME

| | ① | ② | ③ | ④ | ⑤ | ⑥ | ⑦ | ⑧ | REV | SWP |
|---|---|---|---|---|---|---|---|---|---|---|
| ① | -A | -B | -A | -B | -A | -B | -A | -B | L | H |
| ② | -B | -A | -B | -A | -B | -A | -B | -A | H | H |
| ③ | +A | +B | +A | +B | +A | +B | +A | +B | L | L |
| ④ | +B | +A | +B | +A | +B | +A | +B | +A | H | L |
| ⑤ | +A | +B | +A | +B | +A | +B | +A | +B | L | L |
| ⑥ | +B | +A | +B | +A | +B | +A | +B | +A | H | L |
| ⑦ | +A | +B | +A | +B | +A | +B | +A | +B | L | L |
| ⑧ | +B | +A | +B | +A | +B | +A | +B | +A | H | L |

⑭ FRAME

| | ① | ② | ③ | ④ | ⑤ | ⑥ | ⑦ | ⑧ | REV | SWP |
|---|---|---|---|---|---|---|---|---|---|---|
| ① | +B | +A | +B | +A | +B | +A | +B | +A | H | L |
| ② | -A | -B | -A | -B | -A | -B | -A | -B | L | H |
| ③ | -B | -A | -B | -A | -B | -A | -B | -A | H | H |
| ④ | -A | -B | -A | -B | -A | -B | -A | -B | L | H |
| ⑤ | -B | -A | -B | -A | -B | -A | -B | -A | H | H |
| ⑥ | -A | -B | -A | -B | -A | -B | -A | -B | L | H |
| ⑦ | -B | -A | -B | -A | -B | -A | -B | -A | H | H |
| ⑧ | -A | -B | -A | -B | -A | -B | -A | -B | L | H |

F I G. 6

VOLTAGE APPLIED TO PIXEL①−①

| FRAME | ① | ② | ③ | ④ | ⑤ | ⑥ | ⑦ | ⑧ | ⑨ | ⑩ | ⑪ | ⑫ | ⑬ | ⑭ |
|---|---|---|---|---|---|---|---|---|---|---|---|---|---|---|
| | +A | −B | +A | −B | +A | −B | +A | +B | −A | +B | −A | +B | −A | +B |

7 FRAME　　7 FRAME

F I G. 7
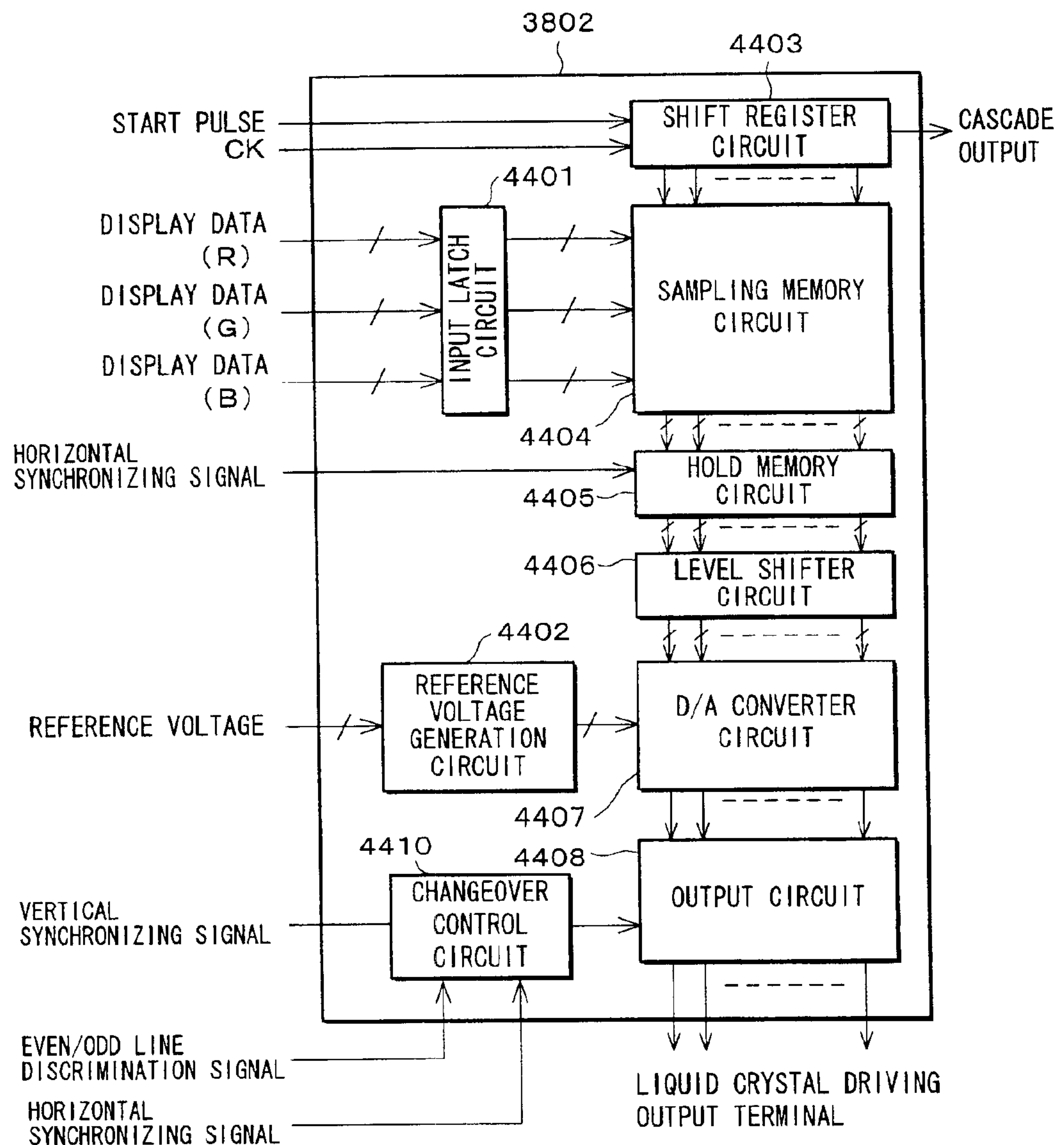

FIG. 9

1 FRAME

| | ① | ② | ③ | ④ | ⑤ | ⑥ | ⑦ | ⑧ | REV | SWP |
|---|---|---|---|---|---|---|---|---|---|---|
| ① | +A | +B | +A | +B | +A | +B | +A | +B | L | L |
| ② | +B | +A | +B | +A | +B | +A | +B | +A | H | L |
| ③ | +A | +B | +A | +B | +A | +B | +A | +B | L | L |
| ④ | +B | +A | +B | +A | +B | +A | +B | +A | H | L |
| ⑤ | +A | +B | +A | +B | +A | +B | +A | +B | L | L |
| ⑥ | +B | +A | +B | +A | +B | +A | +B | +A | H | L |
| ⑦ | +A | +B | +A | +B | +A | +B | +A | +B | L | L |
| ⑧ | +B | +A | +B | +A | +B | +A | +B | +A | H | L |

2 FRAME

| | ① | ② | ③ | ④ | ⑤ | ⑥ | ⑦ | ⑧ | REV | SWP |
|---|---|---|---|---|---|---|---|---|---|---|
| ① | +B | +A | +B | +A | +B | +A | +B | +A | H | L |
| ② | +A | +B | +A | +B | +A | +B | +A | +B | L | L |
| ③ | +B | +A | +B | +A | +B | +A | +B | +A | H | L |
| ④ | +A | +B | +A | +B | +A | +B | +A | +B | L | L |
| ⑤ | +B | +A | +B | +A | +B | +A | +B | +A | H | L |
| ⑥ | +A | +B | +A | +B | +A | +B | +A | +B | L | L |
| ⑦ | +B | +A | +B | +A | +B | +A | +B | +A | H | L |
| ⑧ | +A | +B | +A | +B | +A | +B | +A | +B | L | L |

3 FRAME

| | ① | ② | ③ | ④ | ⑤ | ⑥ | ⑦ | ⑧ | REV | SWP |
|---|---|---|---|---|---|---|---|---|---|---|
| ① | −A | −B | −A | −B | −A | −B | −A | −B | L | H |
| ② | −B | −A | −B | −A | −B | −A | −B | −A | H | H |
| ③ | −A | −B | −A | −B | −A | −B | −A | −B | L | H |
| ④ | −B | −A | −B | −A | −B | −A | −B | −A | H | H |
| ⑤ | −A | −B | −A | −B | −A | −B | −A | −B | L | H |
| ⑥ | −B | −A | −B | −A | −B | −A | −B | −A | H | H |
| ⑦ | −A | −B | −A | −B | −A | −B | −A | −B | L | H |
| ⑧ | −B | −A | −B | −A | −B | −A | −B | −A | H | H |

4 FRAME

| | ① | ② | ③ | ④ | ⑤ | ⑥ | ⑦ | ⑧ | REV | SWP |
|---|---|---|---|---|---|---|---|---|---|---|
| ① | −B | −A | −B | −A | −B | −A | −B | −A | H | H |
| ② | −A | −B | −A | −B | −A | −B | −A | −B | L | H |
| ③ | −B | −A | −B | −A | −B | −A | −B | −A | H | H |
| ④ | −A | −B | −A | −B | −A | −B | −A | −B | L | H |
| ⑤ | −B | −A | −B | −A | −B | −A | −B | −A | H | H |
| ⑥ | −A | −B | −A | −B | −A | −B | −A | −B | L | H |
| ⑦ | −A | −B | −A | −B | −A | −B | −A | −B | H | H |
| ⑧ | −B | −A | −B | −A | −B | −A | −B | −A | L | H |

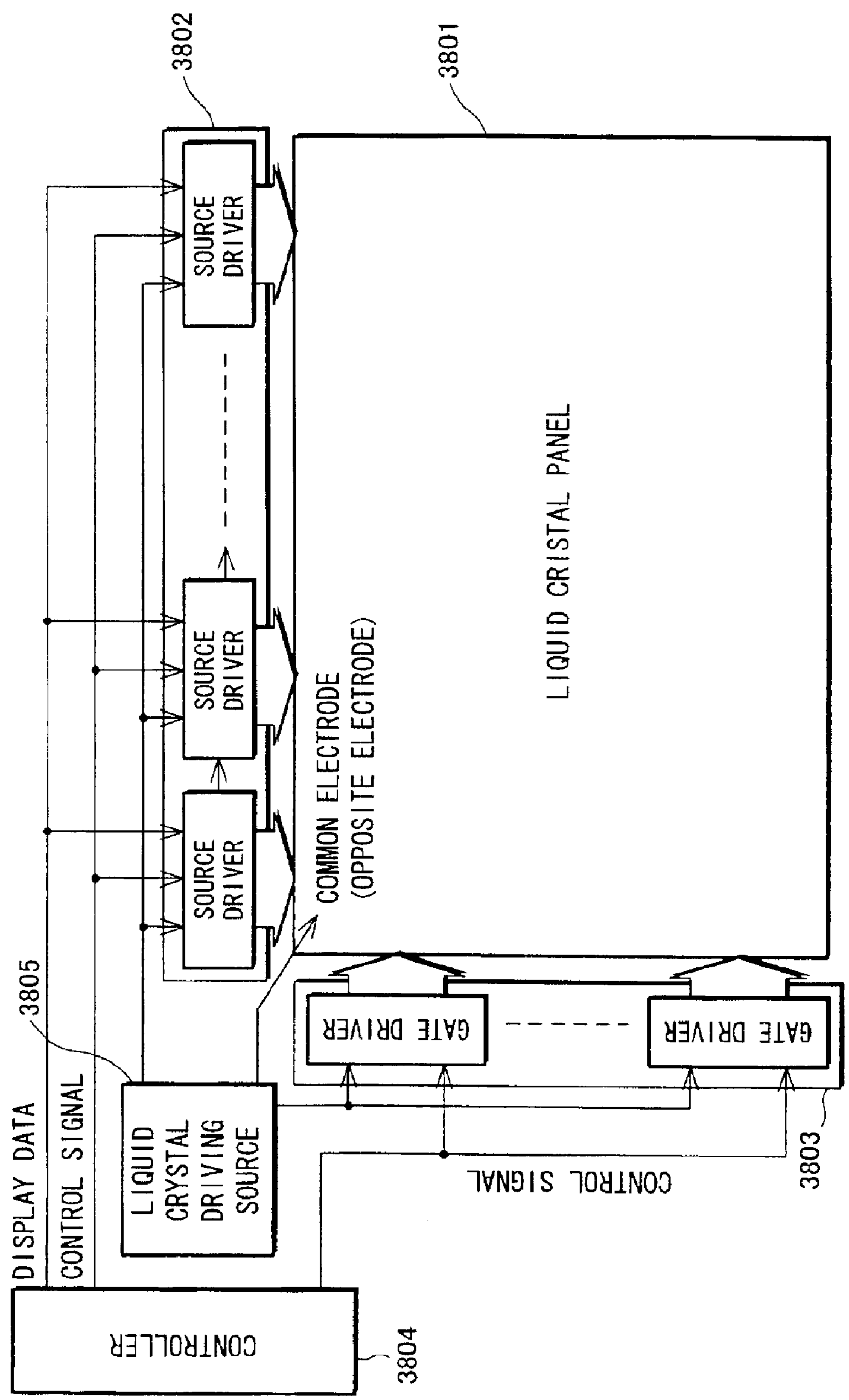
F I G. 1 1
3802
3801
SOURCE DRIVER
SOURCE DRIVER
SOURCE DRIVER
COMMON ELECTRODE
(OPPOSITE ELECTRODE)
LIQUID CRISTAL PANEL
3805
DISPLAY DATA
CONTROL SIGNAL
LIQUID CRYSTAL DRIVING SOURCE
GATE DRIVER
GATE DRIVER
CONTROL SIGNAL
3803
CONTROLLER
3804

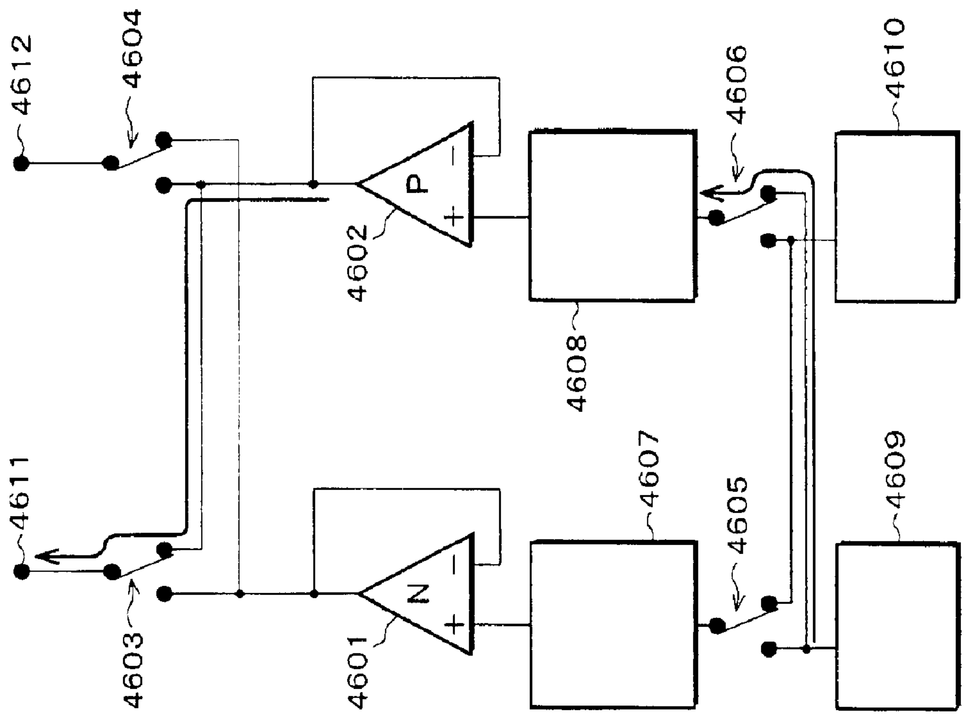
SWITCHING BY FRAME INVERSION
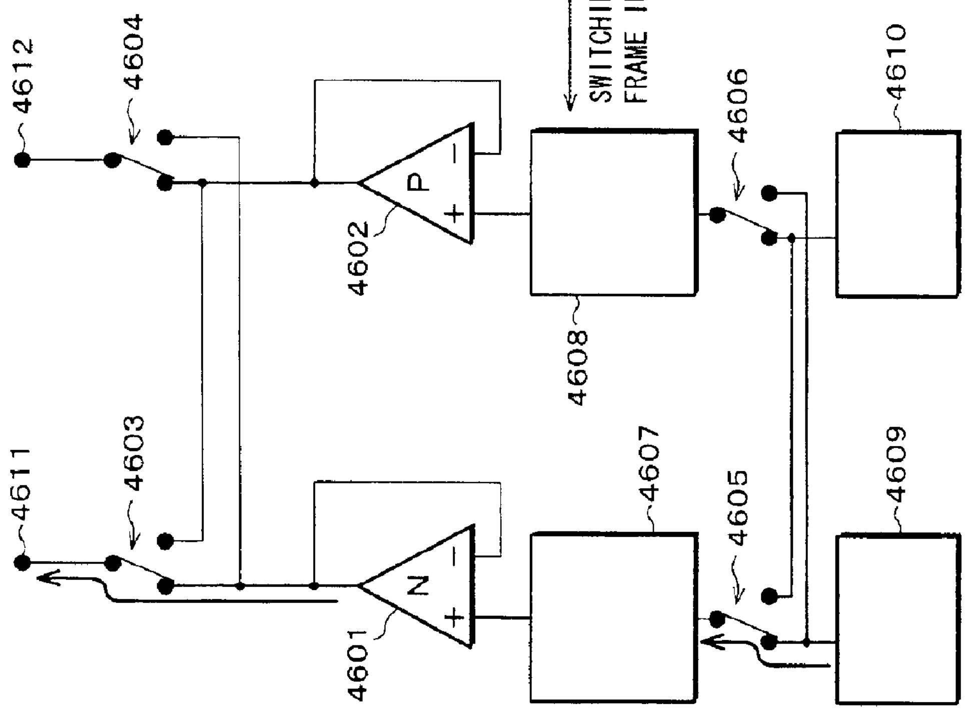

$$\text{AVERAGE PIXEL VOLTAGES} = \{(VH+A)+(VL-B)+(VH+A)+(VL-B)\} \div 4 = \frac{VH+VL}{2} + \frac{A-B}{2}$$

F I G. 2 6
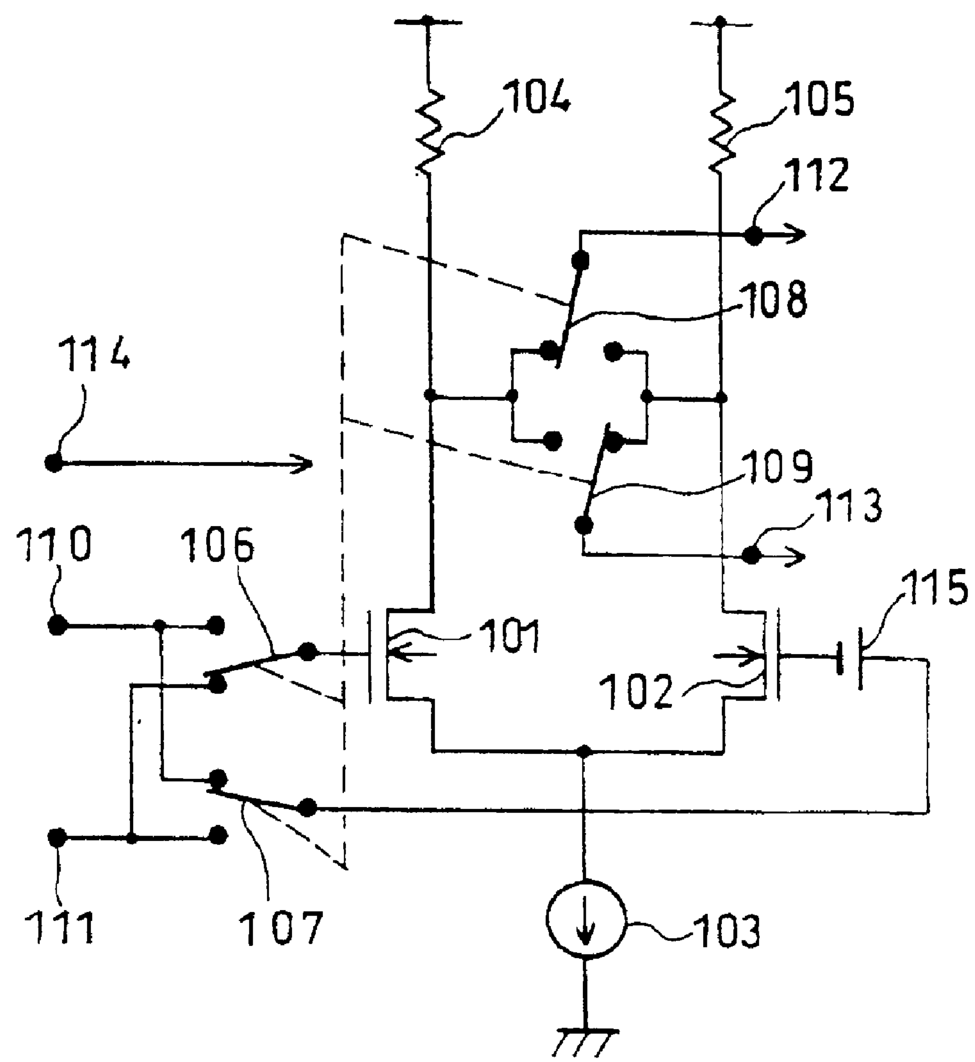

F I G. 2 8
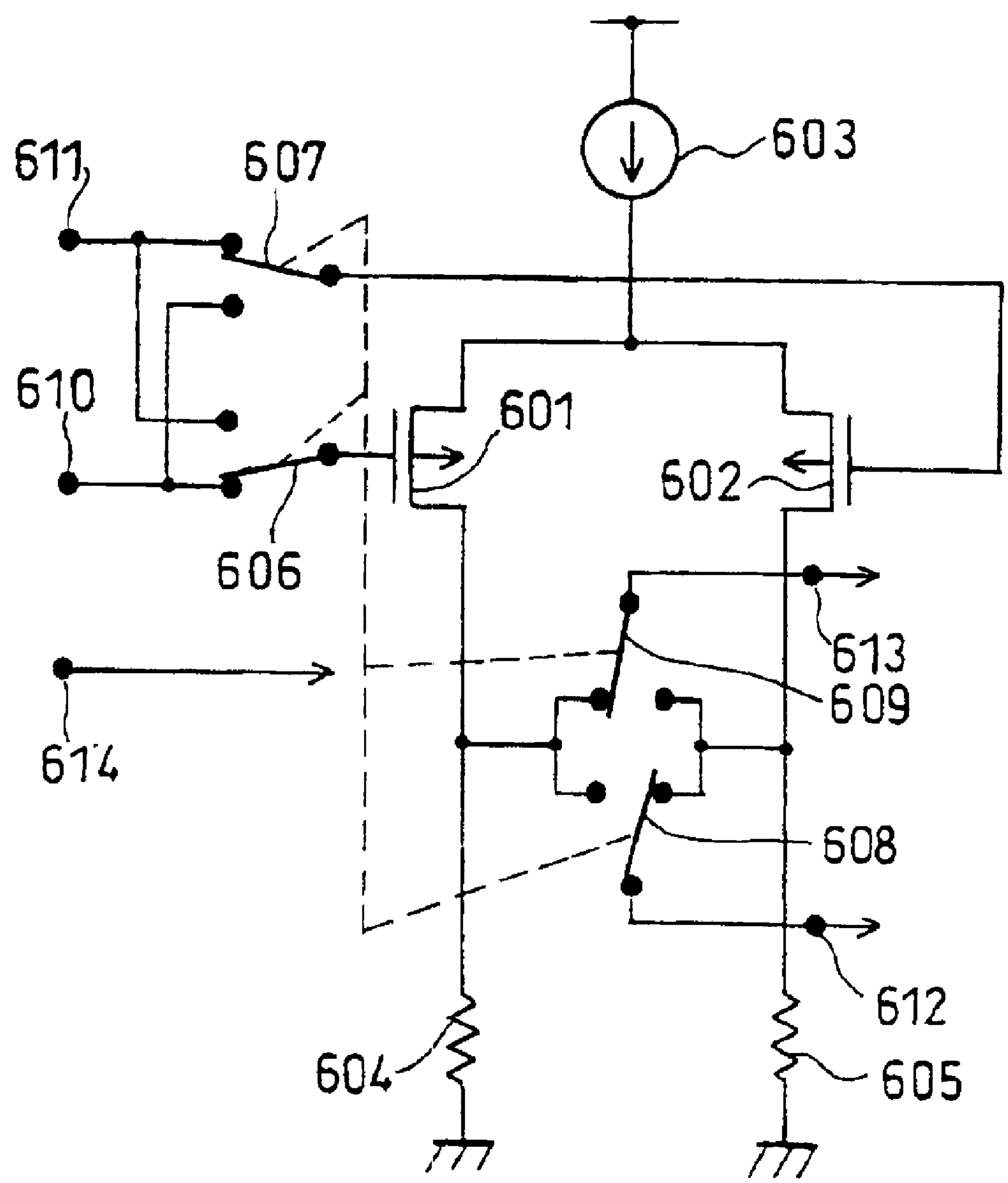

F I G. 2 9
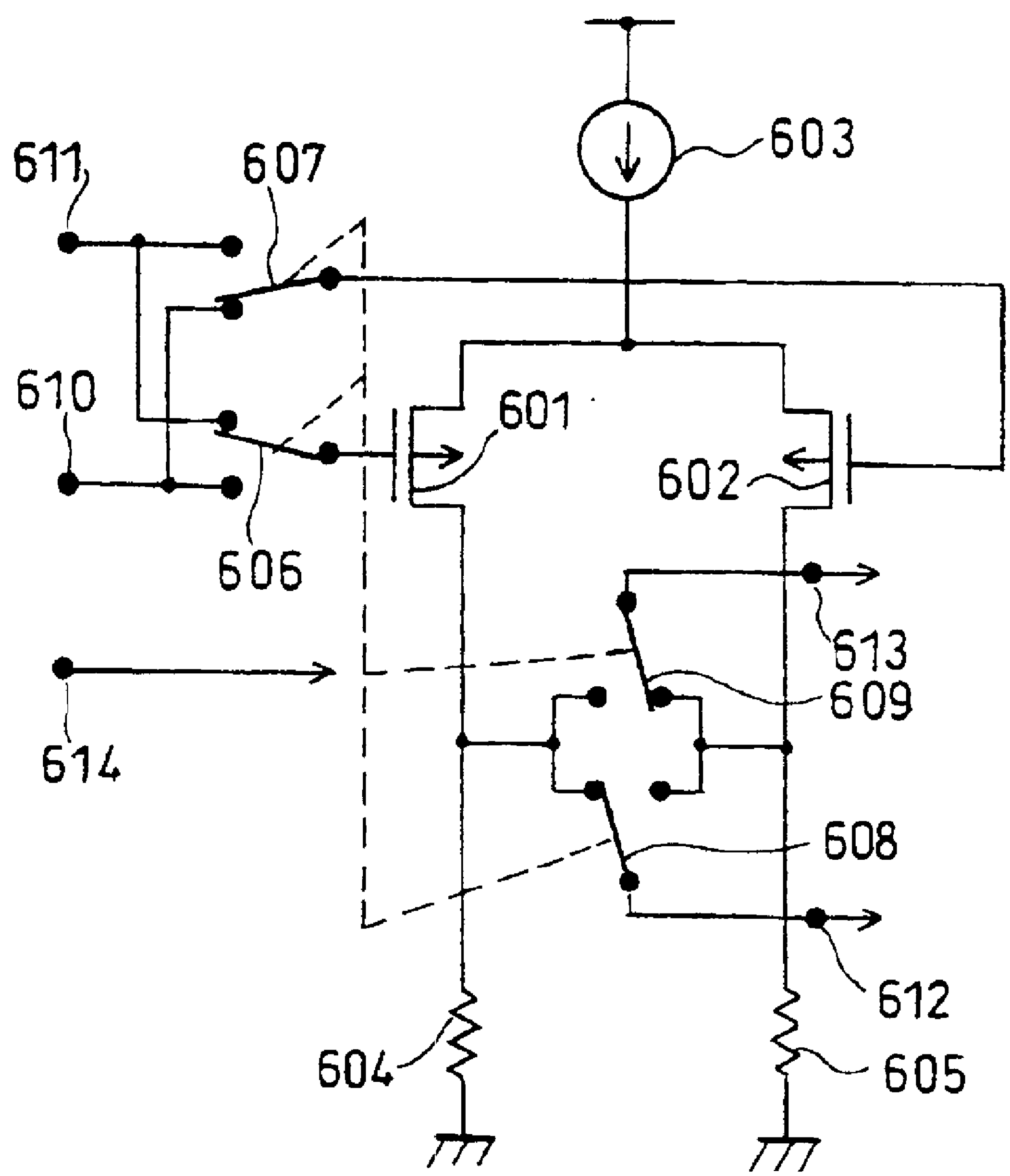

F I G. 3 0
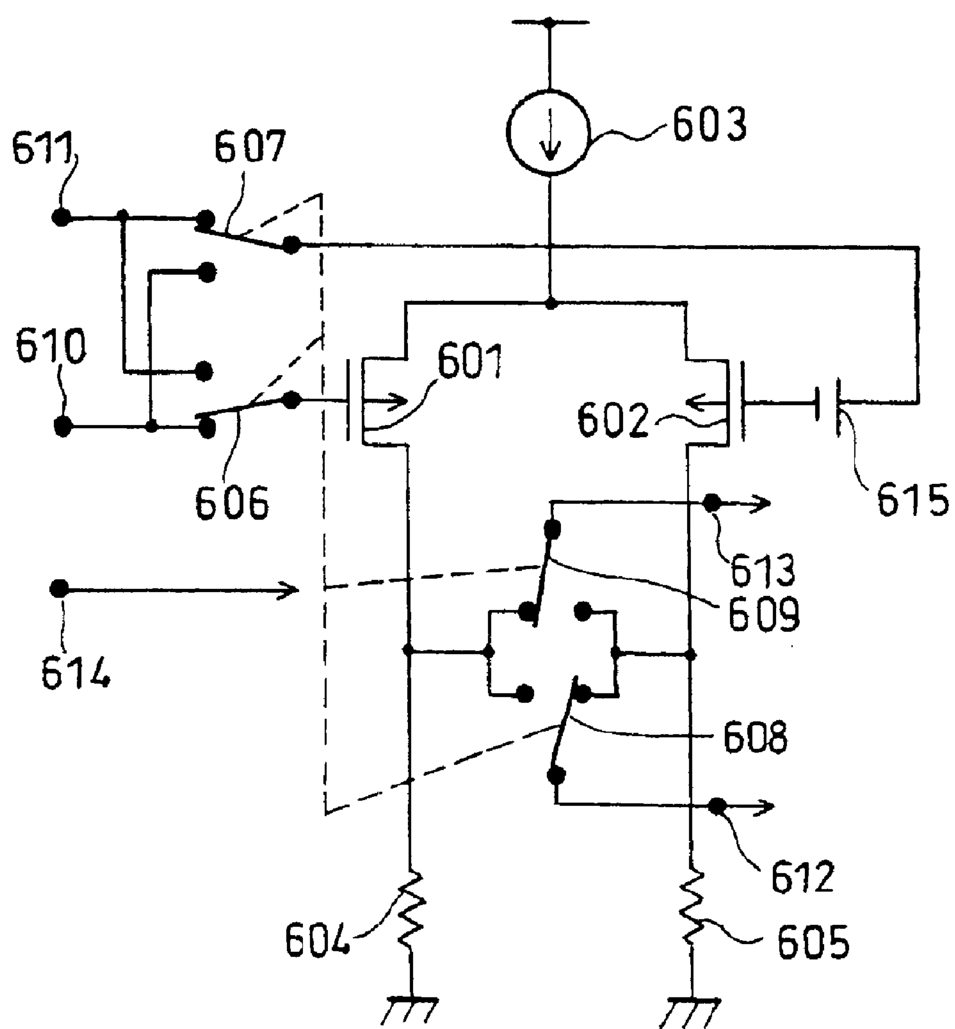

F I G. 3 2
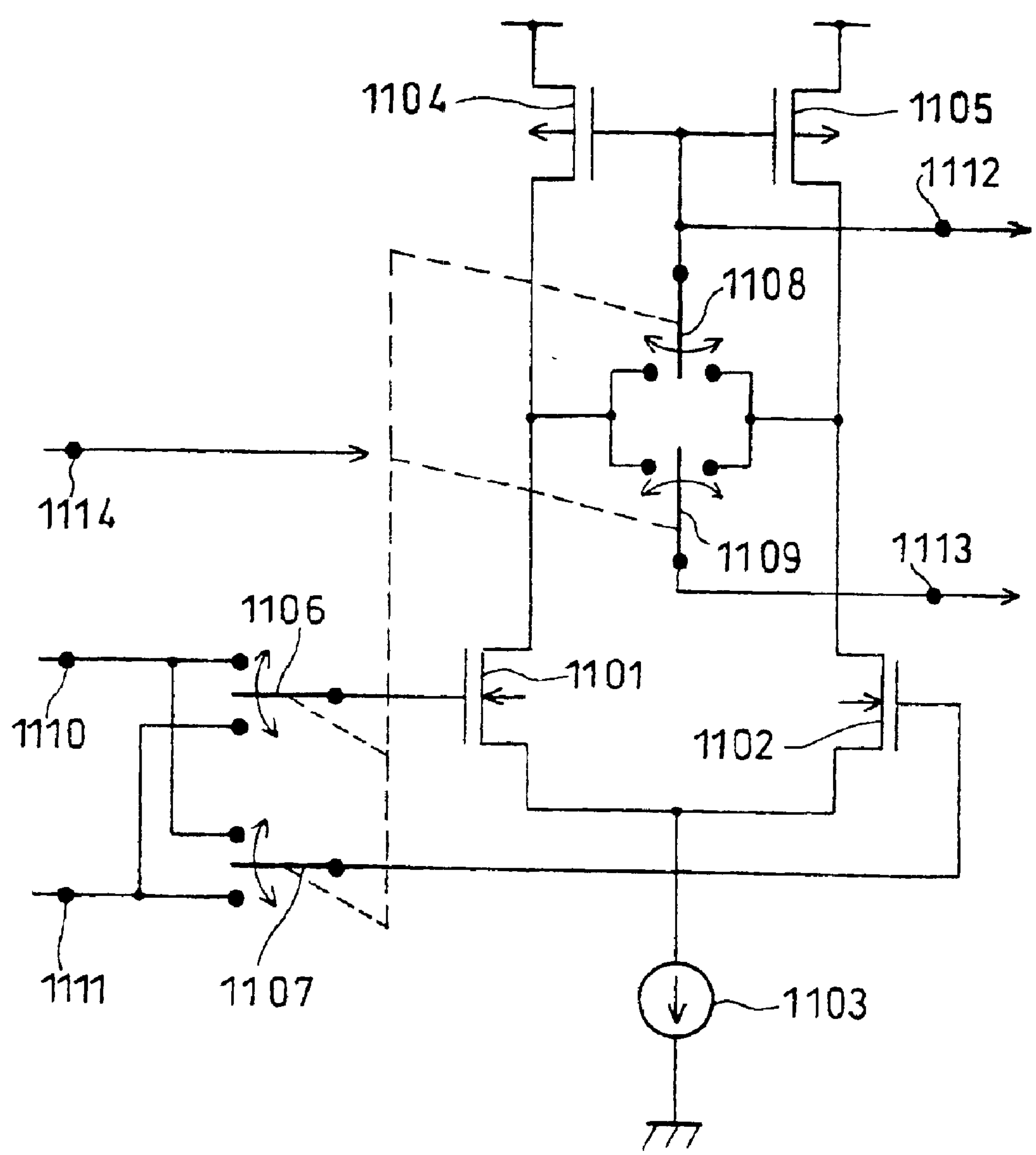

F I G. 3 6
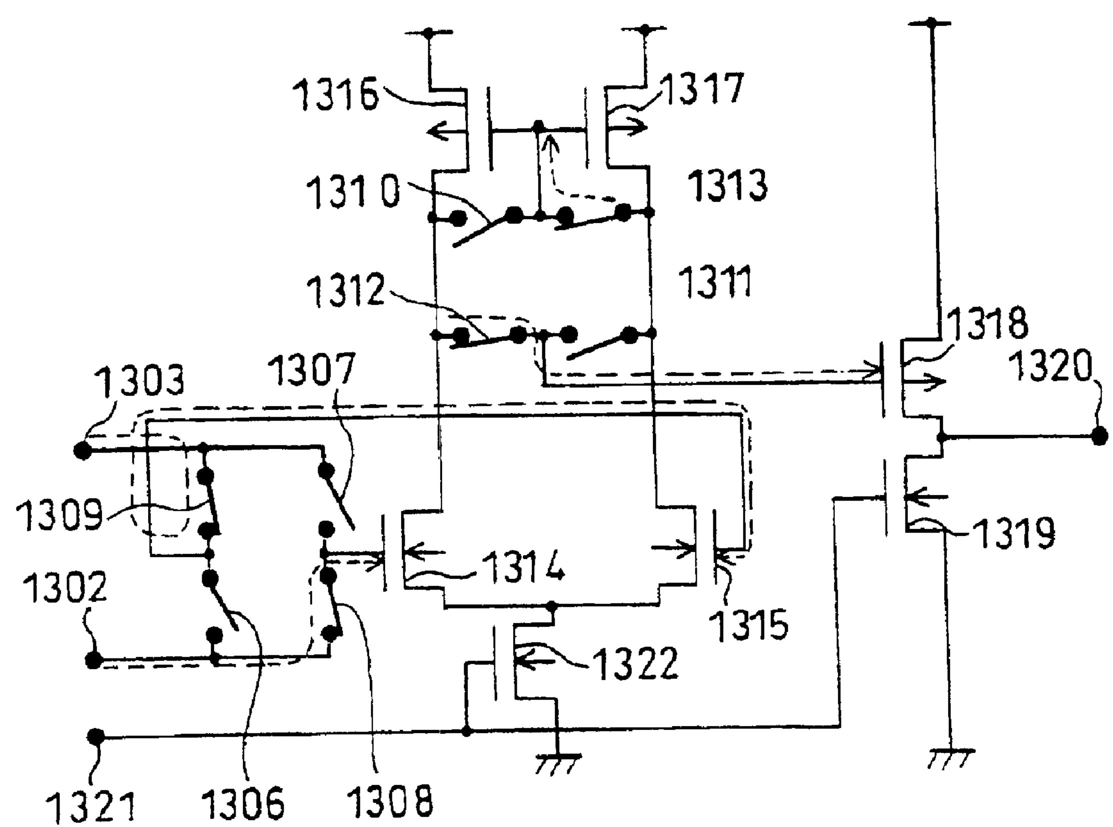

F I G. 37
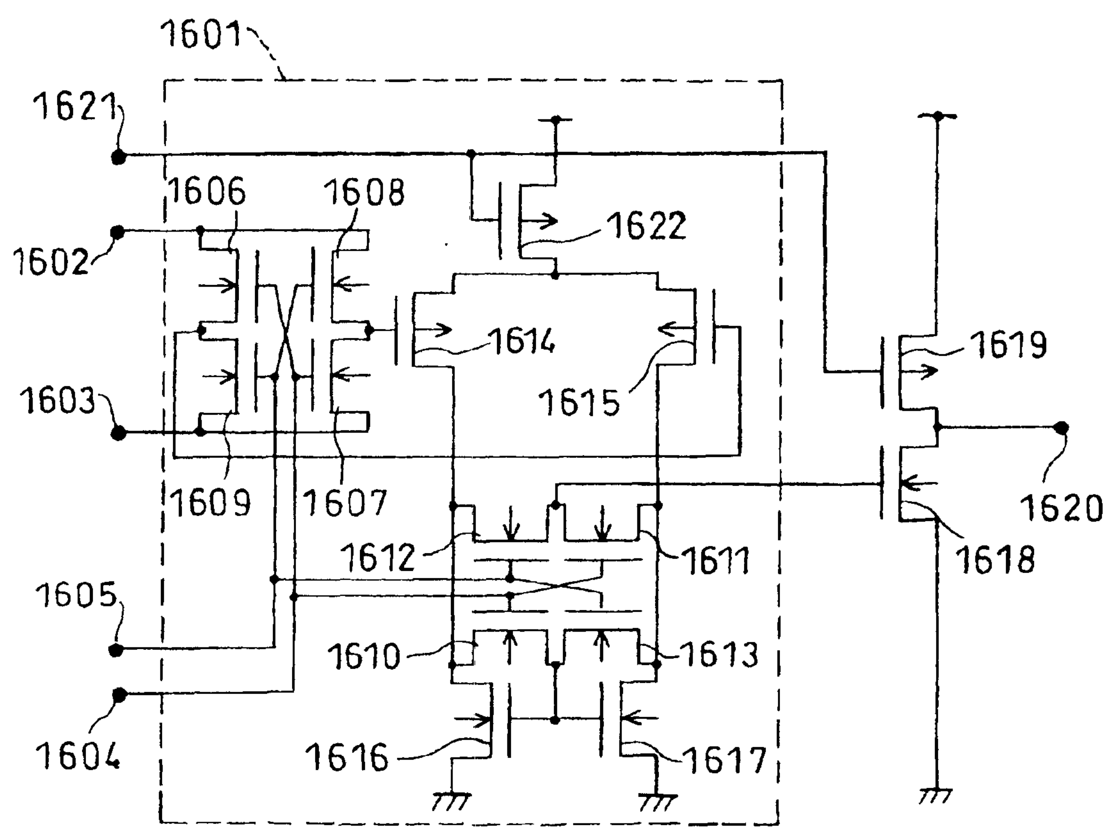

F I G. 3 9
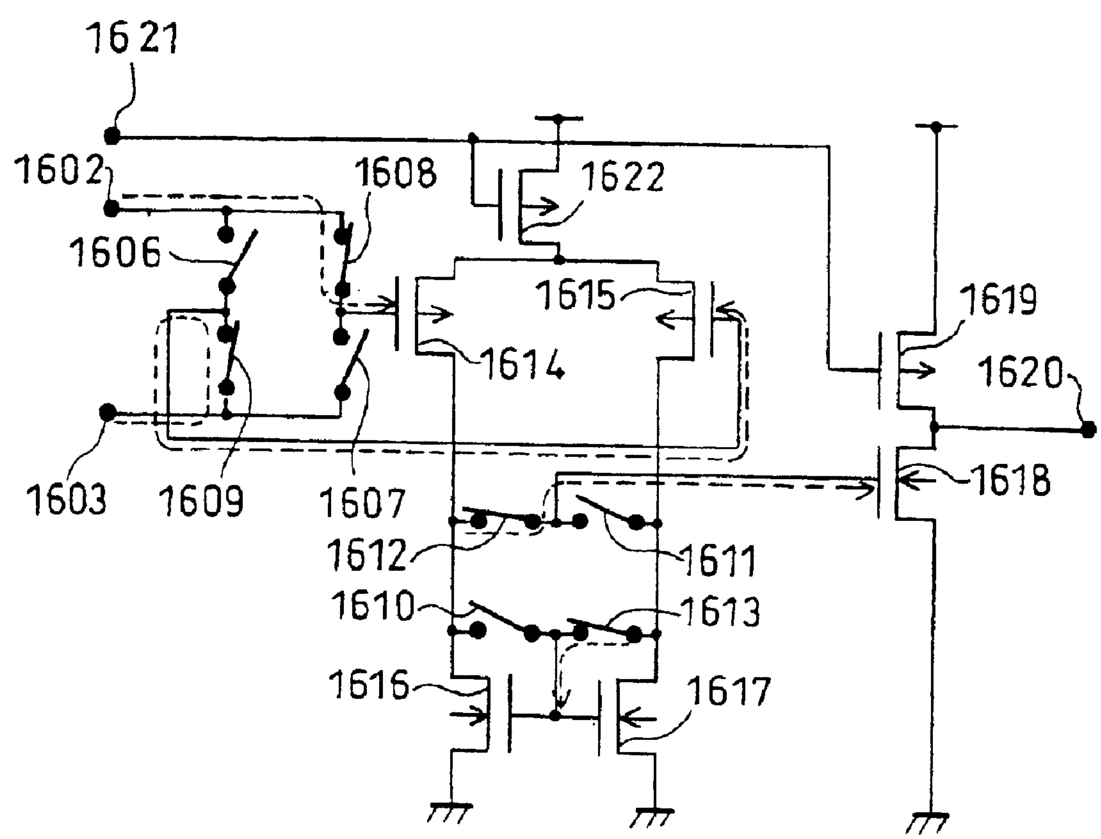

F I G. 4 0
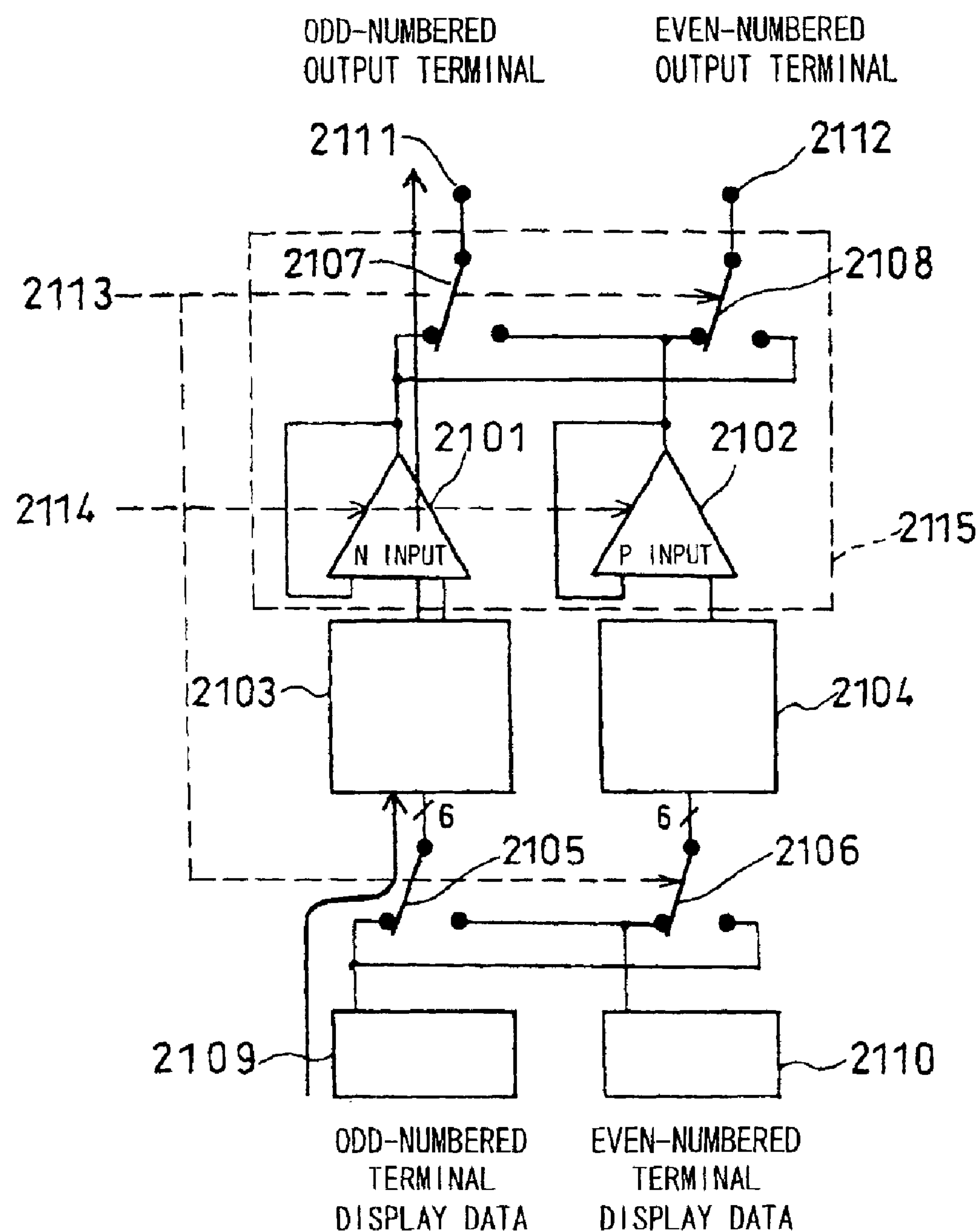

REV
SWP
VOLTAGE
TIME
2602
2601
A
B
−A
−B
FIRST FRAME
SECOND FRAME
THIRD FRAME
FOURTH FRAME

DRIVING APPARATUS AND METHOD OF LIQUID CRYSTAL DISPLAY APPARATUS

FIELD OF THE INVENTION

The present invention relates to driving apparatus and driving method of liquid crystal display apparatus (a) that can suppress the scale of a circuit and reduce the power consumption of the circuit and (b) that is provided with a differential amplifier which is not affected by an offset voltage that happens to be generated due to the characteristic unevenness occurred by the manufacturing process.

BACKGROUND OF THE INVENTION

FIG. 11 is a block diagram showing a typical liquid crystal display apparatus, having TFTs (Thin Film Transistors), of active matrix type. 3801 shows a TFT liquid crystal panel, 3802 shows a source driver IC (Integrated Circuit) having a plurality of source drivers, 3803 shows a gate driver IC having a plurality of gate drivers, 3804 shows a control circuit, and 3805 shows a liquid crystal driving power source (a power source circuit).

The control circuit 3804 sends a vertical synchronizing signal to the gate driver IC 3803, and sends a horizontal synchronizing signal to the source driver IC 3802 and the gate driver IC 3803, respectively. Display data (respective display data that are separated to R, G, and B) that have been externally applied are sent to the source driver IC 3802 in a form of digital signal via the control circuit 3804. In the source driver IC 3802, the display data that have been inputted are latched in a time sharing manner, and then, are subjected to digital to analog conversion in synchronization with the horizontal synchronizing signal outputted from the control circuit 3804 so as to output an analog voltage for the gradation display via a liquid crystal driving output terminal.

FIG. 12 is a structural diagram of the TFT liquid crystal panel. 3901 shows a pixel electrode, 3902 shows a pixel capacitance, 3903 shows a TFT switch (switching device), 3904 shows a source signal line, 3905 shows a gate signal line, and 3906 shows an opposite electrode.

To the source signal line 3904 a gradation display voltage that varies depending on the brightness of the display pixel is applied from the source driver IC 3802. To the gate signal lines 3905 scanning signals are applied from the gate driver IC 3803 so that the TFTs 3903 that are provided in a longitudinal direction are successively turned on. Voltages on the respective source signal lines 3904 are applied to the pixel electrodes 3901 that are connected with drains of the respective TFTs 3903 via the TFTs 3903 that are turned on. This causes the pixel capacitance 3902 formed between the pixel electrodes 3901 and the opposite electrode 3906 is charged, thereby resulting in that the light transmittance of the liquid crystal changes so as to carry out the display in accordance with the change in the light transmittance.

FIGS. 13 and 14 exemplify how the wave form of the liquid crystal driving voltage changes. 4001 and 4101 show wave forms of the driving voltages outputted from the source driver, respectively. 4002 and 4102 show wave forms of the driving voltages outputted from the gate driver, respectively. 4003 and 4103 show voltages (electric potentials) of the opposite electrodes. 4004 and 4104 show a voltage wave form of the pixel electrode.

The voltage (see the oblique lines in FIGS. 13 and 14) which is applied to the liquid crystal material is equal to the voltage difference between the pixel electrode 3901 and the opposite electrode 3906. It is necessary that the liquid crystal panel is driven by an alternating current voltage in order to secure the reliability for a long time. FIG. 13 shows the following case. More specifically, when the output voltage of the source driver is greater than the voltage of the opposite electrode 3906, the TFT 3903 is turned on in response to the output signal of the gate driver. A voltage showing a positive polarity with respect to the opposite electrode 3906 is applied to the pixel electrode 3901. Then, the TFT 3903 is turned off, so that such a voltage is maintained.

In contrast, FIG. 14 shows the following case. More specifically, when the output voltage of the source driver is smaller than the voltage of the opposite electrode 3906, the TFT 3903 is turned on in response to the output signal of the gate driver. A voltage showing a negative polarity with respect to the opposite electrode 3906 is applied to the pixel electrode 3901. Then, the TFT 3903 is turned off, so that such a voltage is maintained. Thus, when the wave form voltages of FIGS. 13 and 14 are alternately applied, it is possible that the liquid crystal material is driven by the applied voltage that is an alternating voltage.

FIG. 15 exemplifies the polarity arrangement, on the liquid crystal panel 3801, for the alternating of the driving voltage. This is called as a dot reverse driving. According to this type of driving, within a single display screen (frame), the positive polarity and negative polarity are alternated in a right and left direction and in an up and down direction, and the polarities are reversed for every frame. According to the driving, in the source driver IC 3802, when the voltage having a positive polarity is outputted via the odd-numbered output terminal for example, the voltage having a negative polarity is outputted via the even-numbered output terminal. In contrast, when the voltage having a negative polarity is outputted via the odd-numbered output terminal, the voltage having a positive polarity is outputted via the even-numbered output terminal.

FIG. 16 exemplifies a driving wave form of the source driver in the dot reverse driving. In FIG. 16, 4301 shows the output voltage wave form of the odd-numbered output terminal. 4302 shows the output voltage wave form of the even-numbered output terminal. 4303 shows the voltage of the opposite electrode 3906. As shown in FIG. 16, the voltages showing reverse polarities with respect to the opposite electrode 3906 are always outputted from the odd-numbered output terminal and the even-numbered output terminal, respectively.

FIG. 17 is one example of the block showing a structure of the source driver IC 3802. Here, the following description only deals with the associated source driver. Note that since a well known gate driver is adopted, the explanation thereof is omitted here. The respective display data (R, G, B) of the digital signal that has been inputted are stored in a sampling memory 4404 in response to a shift register 4403 in a time sharing manner, and then are transmitted to a hold memory 4405 in synchronization with the horizontal synchronizing signal in a lump. The shift register 4403 operates in response to a start pulse and a clock (CK). The data of the hold memory 4405 are sent via a level shifter circuit 4406 to a D/A (Digital to Analog) converter circuit 4407 so as to be converted into analog voltages, respectively. Such analog voltages are sent to an output circuit 4408 from which driving voltages for the gradation display (liquid crystal driving voltages) are outputted via respective liquid crystal output terminals. The respective display data are latched and maintained by the hold memory 4405 for a horizontal synchronizing period. Then, the display data are fetched and latched in synchronization with the next horizontal synchronizing signal.

FIGS. 18(*a*) and 18(*b*) are block diagrams exemplifying the output circuit of the source driver IC that carries out the dot reverse driving in accordance with a conventional art (the first conventional art) and showing the operation thereof. In FIGS. 18(*a*) and 18(*b*), only the blocks of the respective reference numerals 4405, 4407, and 4408 among the circuit elements shown in FIG. 17 are shown as circuits corresponding to two output terminals.

In FIGS. 18(*a*) and 18(*b*), 4501 shows a voltage follower which adopts operational amplifiers and is an output circuit that drives the odd-numbered output terminal. 4502 shows a voltage follower which adopts the same operational amplifiers as those of the voltage follower 4501 and is an output circuit that drives the even-numbered output terminal. Reference numerals 4503, 4504, 4505, and 4506 show switches for the output alternating that switches the polarity of the output voltage of the liquid crystal driving output, respectively. 4507 shows a D/A converter circuit in which a voltage having a positive polarity is subjected to the digital to analog conversion. 4508 shows a D/A converter circuit in which a voltage having a negative polarity is subjected to the digital to analog conversion. Reference numerals 4509 and 4510 show hold memories that hold the display data, respectively. 4511 shows the odd-numbered output terminal, and 4512 shows the even-numbered output terminal. In the operational amplifier 4501, a reference numeral 4513 is an operational amplifier of an N-channel MOS (Metal Oxide Semiconductor) input type. In the operational amplifier 4502, a reference numeral 4514 is an operational amplifier of an N-channel MOS input type. In the operational amplifier 4501, a reference numeral 4515 is an operational amplifier of a P-channel MOS input type. In the operational amplifier 4502, a reference numeral 4516 is an operational amplifier of a P-channel MOS input type.

The following description deals with how the circuit having the foregoing structure carries out the alternating of the wave form of the liquid crystal driving.

When the switches 4503 through 4506 for the output alternating are in the states shown in FIG. 18(*a*), the display data for the odd-numbered output terminal 4511 that have been stored in the hold memory 4509 are sent to the D/A converter circuit 4507 for the positive polarity, and are subjected to the digital to analog conversion so as to output an analog voltage to a liquid crystal panel 3801 from the odd-numbered output terminal 4511 via the voltage follower 4501. In this case, the output voltage becomes a liquid crystal driving voltage having a positive polarity.

In contrast, when the switches 4503 through 4506 for the output alternating are in the states shown in FIG. 18(*b*), the display data for the odd-numbered output terminal 4511 that have been stored in the hold memory 4509 are sent to the D/A converter circuit 4508 for the negative polarity, and are subjected to the digital to analog conversion so as to output an analog voltage to the liquid crystal panel from the odd-numbered output terminal 4511 via the voltage follower 4501. In this case, the output voltage becomes a liquid crystal driving voltage having a negative polarity.

The polarity of the driving voltage of the even-numbered output terminal 4512 is reversed to that of the odd-numbered output terminal 4511. Namely, when the switches 4503 through 4506 for the output alternating are in the states shown in FIG. 18(*a*), the display data for the even-numbered output terminal 4512 that have been stored in the hold memory 4510 are sent to the D/A converter circuit 4508 for the negative polarity, and are subjected to the digital to analog conversion so as to output an analog voltage to the liquid crystal panel from the even-numbered output terminal 4512 via the voltage follower 4502. In this case, the output voltage becomes a liquid crystal driving voltage having a negative polarity.

In contrast, when the switches 4503 through 4506 for the output alternating are in the states shown in FIG. 18(*b*), the display data for the even-numbered output terminal 4512 that have been stored in the hold memory 4510 are sent to the D/A converter circuit 4507 for the positive polarity, and are subjected to the digital to analog conversion so as to output an analog voltage to the liquid crystal panel from the even-numbered output terminal 4512 via the voltage follower 4502. In this case, the output voltage becomes a liquid crystal driving voltage having a positive polarity. In FIGS. 18(*a*) and 18(*b*), the signal flowing of the odd-numbered output terminal is shown among the foregoing operations. Thus, the states shown in FIGS. 18(*a*) and 18(*b*) are alternately switched by the switches 4503 through 4506 for the output alternating in accordance with the frame reversion, thereby carrying out the alternating of the driving wave form required for driving the liquid crystal panel 3801.

According to the circuit configuration shown in FIGS. 18(*a*) and 18(*b*), a single output terminal is always driven by the same operational amplifiers both for the case of the output of the voltage having a positive polarity and the output of the voltage having a negative polarity. In general, as one of the important functions of the output terminal of the liquid crystal driving circuit, the output dynamic range having a full range of the operating power source voltages is required. When it is assumed to use MOS transistors of enhance type that are used in a general LSI, in order not to have areas in which the MOS transistors do not appropriately operate with their threshold voltages, as shown in FIGS. 18(*a*) and 18(*b*), it is necessary that a single voltage follower circuit 4501 has both the operational amplifier 4513 of N-channel MOS transistor input type and the operational amplifier 4515 of P-channel MOS transistor input type. This causes the scale of the circuit to become large so as to result in the increase of the chip size in the case where the output circuit is subjected to the LSI. Furthermore, the power consumption of the circuit becomes large because two operational amplifier circuits are provided per one output.

FIGS. 19(*a*) and 19(*b*) are block diagrams exemplifying the output circuit of the source driver IC that carries out the dot reverse driving in accordance with another conventional art (the second conventional art) and showing the operation thereof. In FIGS. 19(*a*) and 19(*b*), only the blocks of the respective reference numerals 4405, 4407, and 4408 among the circuit elements (the respective blocks) shown in FIG. 17 are shown as circuits corresponding to two output terminals.

In FIGS. 19(*a*) and 19(*b*), 4601 shows a voltage follower using an operational amplifier of N-channel MOS transistor input type. 4602 shows a voltage follower using an operational amplifier of P-channel MOS transistor input type. Reference numerals 4603, 4604, 4605, and 4606 show switches for switching the polarity of the liquid crystal driving output voltage. 4607 shows a D/A converter circuit in which a voltage having a positive polarity is subjected to the digital to analog conversion. 4608 shows a D/A converter circuit in which a voltage having a negative polarity is subjected to the digital to analog conversion. Reference numerals 4609 and 4610 show hold memories that hold the display data, respectively. 4611 shows the odd-numbered output terminal, and 4612 shows the even-numbered output terminal.

The alternating of the output voltage shown in FIGS. 19(*a*) and 19(*b*), like the case shown in FIGS. 18(*a*) and

18(*b*), is carried out by the switches 4603 through 4606 for the output alternating. The difference therebetween resides in the following points (a) through (c). Namely, (a) the output signal of the D/A converter circuit 4607 for the positive polarity is directly sent to the operational amplifier 4601 of N-channel MOS transistor input type, (b) the output signal of the D/A converter circuit 4608 for the negative polarity is directly sent to the operational amplifier 4602 of P-channel MOS transistor input type, and (c) the output signals of the respective operational amplifiers are sent to target output terminals via the switches 4603 and 4604.

Note that it is necessary to only provide a circuit of N-channel input type as the operational amplifier because the D/A converter circuit 4607 for the positive polarity outputs a signal having a voltage of not less than the half of the operating power source voltage. Similarly, it is necessary to only provide a circuit of P-channel input type as the operational amplifier because the D/A converter circuit 4608 for the positive polarity outputs a signal having a voltage of not more than the half of the operating power source voltage. According to the structure shown in FIGS. 19(*a*) and 19(*b*), the number of the operational amplifiers for each output terminal is reduced to half of the structure shown in FIGS. 18(*a*) and 18(*b*). This allows to reduce the size of a chip and ensure the low power consumption.

However, according to the structure shown in FIGS. 19(*a*) and 19(*b*), different operational amplifiers that drive a single output are used depending on whether it is of positive polarity type or of negative polarity type. More specifically, the output terminal for the liquid crystal driving shown in FIGS. 19(*a*) and 19(*b*) is driven by the operational amplifier 4601 when a voltage having positive polarity should be outputted (see FIG. 19(*a*)), while the output terminal is driven by the operational amplifier 4602 when a voltage having negative polarity should be outputted (see FIG. 19(*b*)). The following description deals with a case where the operational amplifiers 4601 and 4602 have offset voltages that happen to be generated due to the reason such as the unevenness of the characteristics occurred by the manufacturing process, respectively.

FIG. 20 shows wave forms of the liquid crystal voltage in the case where the operational amplifier 4601 has an offset voltage A that happens to be generated and the operational amplifier 4602 has an offset voltage B that happens to be generated. As shown in FIG. 20, the deviations from respective expectation voltages vary depending on whether a voltage having positive or negative polarity should be outputted. Accordingly, the average voltage of the driving voltages that are applied to the liquid crystal display pixel contains a component of (A–B) indicative of the difference between the two deviations as an error voltage. The error voltage happens to be generated for every driving output terminals. This allows the difference in the voltages applied to the respective pixels in the liquid crystal display apparatus to occur and causes the unevenness of display.

For comparison, FIG. 21 shows the wave form of the liquid crystal driving voltage for the structure shown in FIGS. 18(*a*) and 18(*b*). According to the structure shown in FIGS. 18(*a*) and 18(*b*), a single output circuit drives the voltages having positive and negative polarities, respectively. This results in that the deviations from the respective expectation voltages are always equal to each other. The deviations are functioned to be canceled between the voltages having positive and negative polarities which are applied to the pixel. According to the structure shown in FIGS. 18(*a*) and 18(*b*), the unevenness of the deviations among the output terminals for the liquid crystal driving is averaged in the display pixel. Thus, no problem arises during the display.

The foregoing second conventional art (see FIG. 19) deals with the case where the voltages having positive and negative polarities should be outputted by the separate operational amplifier circuits, respectively. In contrast, well known is the third conventional art (for example, see Japanese unexamined patent publication No. 11-305735 (publication date: Nov. 5, 1999) in which the respective further reductions of the circuit scale and the power consumption are realized. The following description deals with the third conventional art with reference to FIG. 22.

FIG. 22 exemplifies the structure of a differential amplifier circuit in accordance with the third conventional art. Note that FIG. 22 shows the case where N-channel MOS transistors are used as the inputting transistors.

In FIG. 22, the reference numerals 101 and 102 indicate the input transistors of N-channel MOS type, respectively. The reference numeral 103 indicates a constant current source that supplies the differential amplifier circuit with the operational current. The reference numeral 104 indicates a load resistor (resistor element) of the input transistor 101. The reference numeral 105 indicates a load resistor (resistor element) of the input transistor 102. The reference numerals 106 and 107 indicate switches for respectively switching the input signal. The reference numerals 108 and 109 indicate switches for respectively switching the output signal. The reference numeral 110 indicates a noninverted input terminal (common-mode input terminal). The reference numeral 111 indicates an inverted input terminal (reverse-phase input terminal). The reference numeral 112 indicates a noninverted output terminal. The reference numeral 113 indicates an inverted output terminal. The reference numeral 114 indicates a changeover signal input terminal via which a signal for simultaneously switching the switches 106 through 109 is inputted.

A differential amplifier circuit is composed of the input transistor 101, the load resistor 104, the input transistor 102, and the load resistor 105. The input transistors 101 and 102 constitute a differential pair. The switches 106 through 109 are controlled by the changeover signal 114 in an interlocking manner.

FIG. 23 shows one example of operation of the circuit shown in FIG. 22. FIG. 24 shows another example of operation of the circuit shown in FIG. 22. The following description deals with the operation of the differential amplifier circuit with reference to FIGS. 23 and 24.

According to the operation shown in FIG. 23, the noninverted input terminal 110 is connected with the gate of the input transistor 101 via the switch 106. An input signal inputted via the noninverted input terminal 110 is outputted by the function of the load resistor 104, that is connected with the drain of the input transistor 101, from an inverted output terminal 113 as an inverted output signal via the switch 109. The inverted input terminal 111 is connected with the gate of the input transistor 102 via the switch 107. An input signal inputted via the inverted input terminal 111 is outputted by the function of the load resistor 105, that is connected with the drain of the input transistor 102, from a noninverted output terminal 112 as a noninverted output signal via the switch 108. Namely, the noninverted input signal is amplified by the input transistor 101 and the load resistor 104, while the inverted input signal is amplified by the input transistor 102 and the load resistor 105.

In contrast, according to the operation shown in FIG. 24, the noninverted input terminal 110 is connected with the gate of the input transistor 102 via the switch 107. An input signal inputted via the noninverted input terminal 110 is outputted by the function of the load resistor 105, that is connected with the drain of the input transistor 102, from the inverted output terminal 113 as an inverted output signal via the switch 109. The inverted input terminal 111 is connected with the gate of the input transistor 101 via the switch 106. An input signal inputted via the inverted input terminal 111 is outputted by the function of the load resistor 104, that is connected with the drain of the input transistor 101, from the noninverted output terminal 112 as a noninverted output signal via the switch 108. Namely, the noninverted input signal is amplified by the input transistor 102 and the load resistor 105, while the inverted input signal is amplified by the input transistor 101 and the load resistor 104.

As mentioned above, the amplifier circuits for the noninverted input signal and for the inverted input signal are entirely changed and used according to the operations shown in FIGS. 23 and 24.

With reference to FIGS. 25 and 26, the following description deals with the case where there exists the discrepancy of the characteristics, that happens to occur due to the reason of the manufacturing process or other reasons, between the input transistors 101 and 102 and/or the load resistors 104 and 105 that constitute the differential amplifier circuit.

When the difference occurs between the two circuit elements that should have originally the same characteristic, each output voltage deviates from its ideal voltage, so that an offset voltage occurs. Such deviations can be explained by a model in which one of the input terminals is connected with a constant voltage source. FIGS. 25 and 26 show an example. The reference numeral 115 shown in FIGS. 25 and 26 is the model of the offset voltage that is realized by a single constant voltage source. Note that the switching device shown in FIG. 25 is in the same conditions as those shown in FIG. 23, and that the switching device shown in FIG. 26 is in the same conditions as those shown in FIG. 24.

In FIG. 25, the constant voltage source 115 is connected with the inverted input terminal 111 via the switch 107. In FIG. 26, the constant voltage source 115 is connected with the noninverted input terminal 110 via the switch 107. Thus, the differential amplifier circuit uses the switches 106 through 109. This allows the circuit to switch between (a) the condition in which an offset that happens to occur due to the unevenness in the differential amplifier circuit is inputted to the inverted input terminal 111 and (b) the condition in which such an offset is inputted to the noninverted input terminal 110. According to such two kinds of conditions, the offsets of the noninverted output terminal 110 and the inverted output terminal 111 have a same absolute value and have polarities that are reversed to each other.

Thus, in the case where the operational amplifier has an offset voltage that happens to be generated due to the reasons such as the characteristic unevenness occurred by the manufacturing process, (a) the deviation from the expectation voltage when the offset voltage having positive polarity should be outputted and (b) the deviation from the expectation voltage when the offset voltage having negative polarity should be outputted are equal to each other. Accordingly, when the above operational amplifier is used in a liquid crystal driving circuit, there occurs no difference in the voltages that are applied to the respective pixels of the liquid crystal display apparatus. Thus, it is ensured to avoid the display unevenness.

FIG. 27 shows another example of the differential amplifier circuit in accordance with the second conventional art. FIG. 27 shows the case in which P-channel MOS transistors are used as the input transistors.

In FIG. 27, the reference numerals 601 and 602 indicate the input transistors of P-channel MOS type, respectively. The reference numeral 603 indicates a constant current source that supplies the differential amplifier circuit with the operational current. The reference numeral 604 indicates a load resistor (resistor element) of the input transistor 601. The reference numeral 605 indicates a load resistor (resistor element) of the input transistor 602. The reference numerals 606 and 607 indicate switches for respectively switching the input signals. The reference numerals 608 and 609 indicate switches for respectively switching the output signals. The reference numeral 610 indicates a noninverted input terminal (common-mode input terminal). The reference numeral 611 indicates an inverted input terminal (reverse-phase input terminal). The reference numeral 612 indicates a noninverted output terminal. The reference numeral 613 indicates an inverted output terminal. The reference numeral 614 indicates a changeover signal input terminal via which a signal for simultaneously switching the switches 606 through 609 is inputted.

The following description deals with the operation of FIG. 27 with reference to FIGS. 28 and 29.

According to the operation shown in FIG. 28, the noninverted input terminal 610 is connected with the gate of the input transistor 601 via the switch 606. An input signal inputted via the noninverted input terminal 610 is outputted by the function of the load resistor 604, that is connected with the drain of the input transistor 601, from an inverted output terminal 613 as an inverted output signal via the switch 609. The inverted input terminal 611 is connected with the gate of the input transistor 602 via the switch 607. An input signal inputted via the inverted input terminal 611 is outputted by the function of the load resistor 605, that is connected with the drain of the input transistor 602, from a noninverted output terminal 612 as a noninverted output signal via the switch 608. Namely, the noninverted input signal is amplified by the input transistor 601 and the load resistor 604, while the inverted input signal is amplified by the input transistor 602 and the load resistor 605.

In contrast, according to the operation shown in FIG. 29, the noninverted input terminal 610 is connected with the gate of the input transistor 602 via the switch 607. An input signal inputted via the noninverted input terminal 610 is outputted by the function of the load resistor 605, that is connected with the drain of the input transistor 602, from the inverted output terminal 613 as an inverted output signal via the switch 609. The inverted input terminal 611 is connected with the gate of the input transistor 601 via the switch 606. An input signal inputted via the inverted input terminal 611 is outputted by the function of the load resistor 604, that is connected with the drain of the input transistor 601, from the noninverted output terminal 612 as a noninverted output signal via the switch 608. Namely, the noninverted input signal is amplified by the input transistor 602 and the load resistor 605, while the inverted input signal is amplified by the input transistor 601 and the load resistor 604.

As mentioned above, the amplifier circuits for the noninverted input signal and for the inverted input signal are entirely changed and used according to the operations shown in FIGS. 28 and 29.

With reference to FIGS. 30 and 31, the following description deals with the case where there exists the discrepancy of the characteristics, that happens to occur due to the reason of the manufacturing process or other reasons, between the input transistors 601 and 602 and/or the load resistors 604 and 605 that constitute the differential amplifier circuit.

When the difference occurs between the two circuit elements that should have originally the same characteristic, each output voltage deviates from its ideal voltage, so that an offset voltage occurs. Such deviations can be explained by a model in which one of the input terminals is connected with a constant voltage source. FIGS. 30 and 31 show an example. The reference numeral 615 shown in FIGS. 30 and 31 is the model of the offset voltage that is realized by a single constant voltage source. Note that the switching device shown in FIG. 30 is in the same conditions as those shown in FIG. 28, and that the switching device shown in FIG. 31 is in the same conditions as those shown in FIG. 29.

In FIG. 30, the constant voltage source 615 is connected with the inverted input terminal 611 via the switch 607. In FIG. 31, the constant voltage source 615 is connected with the noninverted input terminal 610 via the switch 607. Thus, the differential amplifier circuit uses the switches 606 through 609. This allows the circuit to switch between (a) the condition in which an offset that happens to occur due to the unevenness in the differential amplifier circuit is inputted to the inverted input terminal 611 and (b) the condition in which such an offset is inputted to the noninverted input terminal. According to such two kinds of conditions, the offsets of the noninverted output terminal 610 and the inverted output terminal 611 have a same absolute value and have polarities that are reversed to each other.

Thus, in the case where the operational amplifier has an offset voltage that happens to be generated due to the reasons such as the characteristic unevenness occurred by the manufacturing process, (a) the deviation from the expectation voltage when the offset voltage having positive polarity should be outputted and (b) the deviation from the expectation voltage when the offset voltage having negative polarity should be outputted are equal to each other. Accordingly, when the above operational amplifier is used in a liquid crystal driving circuit, there occurs no difference in the voltages that are applied to the respective pixels of the liquid crystal display apparatus. Thus, it is ensured to avoid the display unevenness.

FIG. 32 shows a circuit configuration in which the load element of the differential amplifier circuit shown in FIG. 22 is replaced with an active load having a current mirror structure. FIG. 32 shows the case where N-channel MOS transistors are used as the input transistors.

In FIG. 32, the reference numerals 1101 and 1102 indicate the input transistors of N-channel MOS type, respectively. The reference numeral 1103 indicates a constant current source that supplies the differential amplifier circuit with the operational current. The reference numeral 1104 indicates a load transistor, made of P-channel MOS, of the input transistor 1101. The reference numeral 1105 indicates a load transistor, made of P-channel MOS, of the input transistor 1102. The reference numerals 1106 and 1107 indicate switches for respectively switching the input signals. The reference numerals 1108 and 1109 indicate switches for respectively switching the output signals. The reference numeral 1110 indicates a noninverted input terminal (common-mode input terminal). The reference numeral 1111 indicates an inverted input terminal (reverse-phase input terminal). The reference numeral 1112 indicates a noninverted output terminal. The reference numeral 1113 indicates an inverted output terminal. The reference numeral 1114 indicates a changeover signal input terminal via which a signal for simultaneously switching the switches 1106 through 1109 is inputted.

The differential amplifier circuit is different from the structure (passive load) shown in FIG. 22 in that the load element is an active load having such a current mirror structure made of transistors. In the operation corresponding to the operation shown in FIG. 23, a noninverted input signal is amplified by the input transistor 1101 and the load transistor 1104, while an inverted input signal is amplified by the input transistor 1102 and the load transistor 1105. In contrast, in the operation corresponding to the operation shown in FIG. 24, a noninverted input signal is amplified by the input transistor 1102 and the load transistor 1105, while an inverted input signal is amplified by the input transistor 1101 and the load transistor 1104.

According to any one of the foregoing cases, the load transistors 1104 and 1105 constitute a current mirror structure. This allows that the current flowing through the load transistors 1104 and 1105 are always equal to each other even when the characteristic unevenness occurs between the two load transistors 1104 and 1105. This results in that the noninverted input signal and the inverted input signal are amplified in accordance with the same amplification, thereby ensuring to obtain an output wave form that is bisymmetry.

As mentioned above, the amplifier circuits for the noninverted input signal and for the inverted input signal are entirely changed and used even in the case of the structure shown in FIG. 32.

Even in the case where there exists the discrepancy of the characteristics, that happens to occur due to the reason of the manufacturing process or other reasons, between the input transistors 1101 and 1102 that constitute the differential amplifier circuit, the structure similar to that shown in FIG. 22 is realized although the detail is not described here. Thus, the differential amplifier circuit uses the switches 1106 through 1109. This allows the circuit to switch between (a) the condition in which an offset that happens to occur due to the unevenness in the differential amplifier circuit is inputted to the inverted input terminal 1111 and (b) the condition in which such an offset is inputted to the noninverted input terminal 1110. According to such two kinds of conditions, the offsets of the noninverted output terminal 1110 and the inverted output terminal 1111 have a same absolute value and have polarities that are reversed to each other.

Thus, in the case where the operational amplifier has an offset voltage that happens to be generated due to the reasons such as the characteristic unevenness occurred by the manufacturing process, (a) the deviation from the expectation voltage when the offset voltage having positive polarity should be outputted and (b) the deviation from the expectation voltage when the offset voltage having negative polarity should be outputted are equal to each other. This results in that the difference component between the two deviations is not remained as an error voltage in the average voltage of the driving voltages that are applied to the liquid crystal display pixels. Accordingly, when the above operational amplifier is used in a liquid crystal driving circuit, there occurs no difference in the voltages that are applied to the respective pixels of the liquid crystal display apparatus. Thus, it is ensured to avoid the display unevenness.

FIG. 33 shows a circuit configuration in which the load element of the differential amplifier circuit shown in FIG. 27 is replaced with an active load having a current mirror structure. FIG. 33 shows the case in which P-channel MOS transistors are used as the input transistors.

In FIG. 33, the reference numerals 1201 and 1202 indicate the input transistors of P-channel MOS type, respectively.

The reference numeral 1203 indicates a constant current source that supplies the differential amplifier circuit with the operational current. The reference numeral 1204 indicates a load transistor (resistor element) of the input transistor 1201. The reference numeral 1205 indicates a load transistor (resistor element) of the input transistor 1202. The reference numerals 1206 and 1207 indicate switches for respectively switching the input signals. The reference numerals 1208 and 1209 indicate switches for respectively switching the output signals. The reference numeral 1210 indicates a noninverted input terminal (common-mode input terminal). The reference numeral 1211 indicates an inverted input terminal (reverse-phase input terminal). The reference numeral 1212 indicates a noninverted output terminal. The reference numeral 1213 indicates an inverted output terminal. The reference numeral 1214 indicates a changeover signal input terminal via which a signal for simultaneously switching the switches 1206 through 1209 is inputted.

The circuit configuration shown in FIG. 33 is different from the structure (passive load) shown in FIG. 27 in that the load element is an active load having such a current mirror structure made of transistors. In the operation corresponding to the operation shown in FIG. 28, a noninverted input signal is amplified by the input transistor 1201 and the load transistor 1204, while an inverted input signal is amplified by the input transistor 1202 and the load transistor 1205. In contrast, in the operation corresponding to the operation shown in FIG. 29, a noninverted input signal is amplified by the input transistor 1202 and the load transistor 1205, while an inverted input signal is amplified by the input transistor 1201 and the load transistor 1204.

According to any one of the foregoing cases, the load transistors 1204 and 1205 constitute a current mirror structure. This allows that the current flowing through the load transistors 1204 and 1205 are always equal to each other even when the characteristic unevenness occurs between the two load transistors 1204 and 1205. This results in that the noninverted input signal and the inverted input signal are amplified in accordance with the same amplification, thereby ensuring to obtain an output wave form that is bisymmetry.

As mentioned above, the amplifier circuits for the noninverted input signal and for the inverted input signal are entirely changed and used even in the case of the structure shown in FIG. 33.

Even in the case where there exists the discrepancy of the characteristics, that happens to occur due to the reason of the manufacturing process or other reasons, between the input transistors 1201 and 1202 that constitute the differential amplifier circuit, the structure similar to that shown in FIG. 27 is realized although the detail is not described here. Thus, the differential amplifier circuit uses the switches 1206 through 1209. This allows to switch between (a) the condition in which an offset that happens to occur due to the unevenness in the differential amplifier circuit is inputted to the inverted input terminal 1211 and (b) the condition in which such an offset is inputted to the noninverted input terminal 1210. According to such two kinds of conditions, the offsets of the noninverted output terminal 1210 and the inverted output terminal 1211 have a same absolute value and have polarities that are reversed to each other.

Thus, in the case where the operational amplifier has an offset voltage that happens to be generated due to the reasons such as the characteristic unevenness occurred by the manufacturing process, (a) the deviation from the expectation voltage when the offset voltage having positive polarity should be outputted and (b) the deviation from the expectation voltage when the offset voltage having negative polarity should be outputted are equal to each other. This results in that the difference component between the two deviations is not remained as an error voltage in the average voltage of the driving voltages that are applied to the liquid crystal display pixels. Accordingly, when the above operational amplifier is used in a liquid crystal driving circuit, there occurs no difference of the voltages that are applied to the respective pixels of the liquid crystal display apparatus. Thus, it is ensured to avoid the display unevenness.

The following description deals with an example which embodies a differential amplifier circuit 1301 that is equivalent to the differential amplifier circuit shown in FIG. 32, switches, and an output section with reference to FIG. 34. Note that each of the operational amplifiers shown in FIG. 34 is of N-channel MOS input type.

In FIG. 34, the reference numeral 1301 indicates the differential amplifier circuit shown in FIG. 32, the reference numeral 1302 indicates a noninverted input terminal, the reference numeral 1303 indicates an inverted input terminal. The reference numerals 1304 and 1305 indicate switch changeover signal input terminals, respectively. The reference numerals 1306 through 1309 indicate switches, respectively. The reference numerals 1310 through 1313 indicate switches, respectively. The reference numerals 1314 and 1315 are input transistors of N-channel MOS type, respectively. The reference numerals 1316 and 1317 indicate load transistors of P-channel MOS type that are active loads for the input transistors, respectively. The reference numeral 1318 indicates an output transistor of P-channel MOS type. The reference numeral 1319 indicates an output transistor of N-channel MOS type. The reference numeral 1320 indicates an output terminal. The reference numeral 1321 indicates a bias voltage input terminal for providing an operating point of the operational amplifier. A circuit in which the differential amplifier circuit 1301 is replaced with the load resistor shown in FIG. 22 carries out the same operations as the following description. Therefore, the detail explanation is omitted here.

In FIG. 34, the reference numerals 1304 and 1305 correspond to the switch changeover signal input terminal 1114 shown in FIG. 32. The terminals 1304 and 1305 receive respective signals whose polarities are reversed to each other. The following description deals with the circuit operation in accordance with the switch changeover signal with reference to FIGS. 35 and 36.

In FIG. 34, the input transistors 1314 and 1315 correspond to the input transistors 1101 and 1102 shown in FIG. 32, respectively. The load transistors 1316 and 1317 correspond to the load transistors 1104 and 1105 shown in FIG. 32, respectively.

In FIG. 34, the reference numerals 1307 and 1309 correspond to the switch 1106 shown in FIG. 32, the reference numerals 1306 and 1308 correspond to the switch 1107 shown in FIG. 32, the reference numerals 1310 and 1313 correspond to the switch 1108 shown in FIG. 32, the reference numerals 1311 and 1312 correspond to the switch 1109 shown in FIG. 32, and a transistor 1322 corresponds to the constant current source 1103 shown in FIG. 32.

When a signal of "L" level (low level) is applied to the switch changeover signal input terminal 1304, the switches 1306, 1307, 1310, and 1311 are turned on, because the switches are P-channel MOS transistors as shown in FIG. 35. In this case, since a signal of "H" level (high level) is applied to the switch changeover signal input terminal 1305, the switches 1308, 1309, 1312, and 1313 are turned off. A noninverted input signal 1302 is sent to the input transistor 1315 via the switch 1306. An inverted input signal 1303 is sent to the input transistor 1314 via the switch 1307. A gate signal is sent to the load transistors 1316 and 1317 via the switch 1310. A gate signal is sent to the output transistor 1318 via the switch 1311. In the case of FIG. 35, the noninverted input signal is amplified by the circuit that is constituted by the input transistor 1315 and the load transistor 1317, while the inverted input signal is amplified by the circuit that is constituted by the input transistor 1314 and the load transistor 1316.

When a signal of "L" level is applied to the switch changeover signal input terminal 1305, the switches 1308, 1309, 1312, and 1313 are turned on, in FIG. 36. In this case, since a signal of "H" level is applied to the switch changeover signal input terminal 1304, the switches 1306, 1307, 1310, and 1311 are turned off. The noninverted input signal at terminal 1302 is sent to the input transistor 1314 via the switch 1308. The inverted input signal at terminal 1303 is sent to the input transistor 1315 via the switch 1309. The gate signal is sent to the load transistors 1316 and 1317 via the switch 1313. The gate signal is sent to the output transistor 1318 via the switch 1312. In the case of FIG. 36, the noninverted input signal is amplified by the circuit that is constituted by the input transistor 1314 and the load transistor 1316, while the inverted input signal is amplified by the circuit that is constituted by the input transistor 1315 and the load transistor 1317.

As shown in FIGS. 35 and 36, the present differential amplifier circuit switches the switches 1306 through 1313 so that the amplifier circuits for the noninverted input signal and for the inverted input signal can be replaced with each other. This allows that even when offsets that happen to occur due to the unevenness in the manufacturing process of the differential amplifier circuit is generated, the offsets have a same absolute value and have polarities that are reversed to each other for the foregoing two conditions. Accordingly, it can be realized by changing the switches 1306 through 1313 that the offsets, having the unevenness, occurred in the operational amplifier have a same absolute value and have polarities that are reversed to each other. This allows to cancel the offsets.

The following description deals with an example which embodies a differential amplifier circuit 1601 that is equivalent to the differential amplifier circuit shown in FIG. 33, switches, and an output section with reference to FIG. 37. Note that FIG. 37 shows an operational amplifier of P-channel MOS input type.

In FIG. 37, the reference numeral 1602 indicates a noninverted input terminal. The reference numeral 1603 indicates an inverted input terminal. The reference numerals 1604 and 1605 indicate switch changeover signal input terminals, respectively. The reference numerals 1606 through 1609 indicate switches, respectively. The reference numerals 1610 through 1613 indicate switches, respectively. The reference numerals 1614 and 1615 are input transistors of P-channel MOS type, respectively. The reference numerals 1616 and 1617 indicate load transistors of N-channel MOS type that are active loads for the input transistors, respectively. The reference numeral 1618 indicates an output transistor of N-channel MOS type. The reference numeral 1619 indicates an output transistor of P-channel MOS type. The reference numeral 1620 indicates an output terminal. The reference numeral 1621 indicates a bias voltage input terminal for providing an operating point of the operational amplifier. A circuit in which the differential amplifier circuit 1601 is replaced with the load resistor shown in FIG. 27 carries out the same operations as follows. Therefore, the detail explanation is omitted here.

In FIG. 37, the input transistors 1614 and 1615 correspond to the input transistors 1201 and 1202 shown in FIG. 33, respectively. The load transistors 1616 and 1617 correspond to the load transistors 1204 and 1205 shown in FIG. 33, respectively. In FIG. 37, the reference numerals 1607 and 1609 correspond to the switch 1206 shown in FIG. 33, the reference numerals 1606 and 1608 correspond to the switch 1207 shown in FIG. 33, the reference numerals 1611 and 1612 correspond to the switch 1209 shown in FIG. 33, and the reference numeral 1622 corresponds to the constant current source 1203 in FIG. 33.

When a signal of "H" level (high level) is applied to the switch changeover signal input terminal 1604, the switches 1606, 1607, 1610, and 1611 are turned on, because the switches are N-channel MOS type transistors as shown in FIG. 38. In this case, since a signal of "L" level (low level) is applied to the switch changeover signal input terminal 1605, the, switches 1608, 1609, 1612, and 1613 are turned off. A noninverted input signal at terminal 1602 is sent to the input transistor 1615 via the switch 1606. An inverted input signal at terminal 1603 is sent to the input transistor 1614 via the switch 1607. A gate signal is sent to the load transistors 1616 and 1617 via the switch 1610. A gate signal is sent to the output transistor 1618 via the switch 1611. In the case of FIG. 38, the noninverted input signal is amplified by the circuit that is constituted by the input transistor 1615 and the load transistor 1617, while the inverted input signal is amplified by the circuit that is constituted by the input transistor 1614 and the load transistor 1616.

When a signal of "H" level (high level) is applied to the switch changeover signal input terminal 1605, the switches 1608, 1609, 1612, and 1613 are turned on, in FIG. 39. In this case, since a signal of "L" level is applied to the switch changeover signal input terminal 1604, the switches 1606, 1607, 1610, and 1611 are turned off. The noninverted input signal at terminal 1602 is sent to the input transistor 1614 via the switch 1608. The inverted input signal at terminal 1603 is sent to the input transistor 1615 via the switch 1609. The gate signal is sent to the load transistors 1616 and 1617 via the switch 1613. The gate signal is sent to the output transistor 1618 via the switch 1612. In the case of FIG. 39, the noninverted input signal is amplified by the circuit that is constituted by the input transistor 1614 and the load transistor 1616, while the inverted input signal is amplified by the circuit that is constituted by the input transistor 1615 and the load transistor 1617.

As shown in FIGS. 38 and 39, the present differential amplifier circuit switches the respective switches 1606 through 1613 so that the amplifier circuits for the noninverted input signal and for the inverted input signal can be replaced with each other. This allows that even when offsets that happen to occur due to the unevenness in the manufacturing process of the differential amplifier circuit is generated, the offsets have a same absolute value and have polarities that are reversed to each other for the foregoing two conditions. Accordingly, it can be realized by changing the switches 1606 through 1613 that the offsets, having the unevenness, occurred in the operational amplifier have a same absolute value and have polarities that are reversed to each other. Note that a dotted line indicates the flow of the signals in FIGS. 38 and 39.

FIGS. 40 and 41 are block diagrams showing a liquid crystal driving circuit that adopts the foregoing differential amplifier circuit and carries out the dot reverse driving. FIGS. 40 and 41 respectively show only the part of two neighboring output circuits, and show the respective operations for the case where the polarity of the liquid crystal driving voltage is changed.

In FIGS. 40 and 41, the reference numeral 2101 indicates the operational amplifier of N-channel MOS transistor input type shown in FIG. 34, the reference numeral 2102 indicates the operational amplifier of P-channel MOS transistor input type shown in FIG. 37. The reference numeral 2103 indicates a D/A converter circuit that generates a liquid crystal driving voltage having a positive polarity. The reference numeral 2104 indicates a D/A converter circuit that generates a liquid crystal driving voltage having a negative polarity. The reference numerals 2105 through 2108 indicate switches by which the liquid crystal driving voltage is made to be an A.C. voltage. The reference numeral 2109 indicates a latch circuit that stores the display data of the odd-numbered output terminals, and the reference numeral 2110 indicates a latch circuit that stores the display data of the even-numbered output terminals. The reference numeral 2111 indicates the odd-numbered output terminal, and the reference numeral 2112 indicates the even-numbered output terminal. The reference numeral 2113 indicates an alternation switch changeover signal input, and the reference numeral 2114 indicates the switch changeover signal for the operational amplifier shown in FIGS. 34 and 37. Note that the latch circuits 2109 and 2110 indicate the hold memory shown in FIG. 17 and the explanation is made without a level shifter circuit (with omitting a level shifter circuit).

The following description deals with the operation of the odd-numbered output terminal with reference to these drawings. As to the even-numbered output terminal, the same operation is carried out except for the fact that the polarity of the driving voltage is reversed to that of the odd-numbered output terminal. Therefore, the detail explanation is omitted here.

FIG. 40 shows the case where (a) a driving voltage having positive polarity is outputted via the odd-numbered output terminal 2111 and (b) a driving voltage having negative polarity via the even-numbered output terminal 2112. In this case, the display data of the odd-numbered output terminal is sent from the latch circuit 2109 to the positive-polarity D/A converter circuit 2103 via the switch 2105. The output signal of the positive-polarity D/A converter circuit 2103 is sent to the operational amplifier 2101 so as to be outputted from the odd-numbered output terminal 2111 via the switch 2107 (see the thick line shown in FIG. 40).

FIG. 41 shows the case where (a) a driving voltage having negative polarity is outputted via the odd-numbered output terminal 2111 and (b) a driving voltage having positive polarity via the even-numbered output terminal 2112. In this case, the display data of the even-numbered output terminal is sent from the latch circuit 2109 to the negative-polarity D/A converter circuit 2104 via the switch 2106. The output signal of the negative-polarity D/A converter circuit 2104 is sent to the operational amplifier 2102 so as to be outputted from the odd-numbered output terminal 2111 via the switch 2107 (see the thick line shown in FIG. 41).

The following description deals with the case where each operational amplifier has an offset voltage that happens to be generated by the characteristic unevenness due to the reason occurred in the manufacturing process of the operational amplifier or other reasons. As has been described, the switch changeover signal allows the polarity of the offset voltage in the operational amplifier to be reversed. In this case, since the absolute values of the offset voltages are equal to each other, it is assumed that (a) the changing into an offset voltage <u>A</u> or an offset voltage −A is made by the operational amplifier 2101 and (b) the changing into an offset voltage <u>B</u> or an offset voltage −B is made by the operational amplifier 2102. Under the above assumptions (a) and (b), the output voltage of the odd-numbered output terminal has the offset voltage <u>A</u> or −A when an output voltage having positive polarity should be outputted from the odd-numbered output terminal, and the output voltage of the odd-numbered output terminal has the offset voltage <u>B</u> or −B when an output voltage having negative polarity should be outputted from the odd-numbered output terminal. The polarity of the offset voltage is selected in accordance with the switch changeover signal of the foregoing operational amplifier.

FIG. 3 shows a concrete example of the structure of the differential amplifier circuit 2115 shown in FIGS. 40 and 41. In FIG. 3, the reference numeral 2301 corresponds to the operational amplifier of N-channel MOS transistor input type shown in FIG. 34, the reference numeral 2302 corresponds to the operational amplifier of P-channel MOS transistor input type shown in FIG. 37. In FIG. 3, the reference numerals 2307 and 2308 respectively correspond to the switches 2107 and 2108 shown in FIGS. 40 and 41. Output terminals 2311 and 2312 of FIG. 3 respectively correspond to the output terminals 2111 and 2112 shown in FIGS. 40 and 41. VBN and VBP shown in FIG. 3 indicate the bias voltage input terminals for providing the operating points of the operational amplifiers, respectively. In FIG. 3, the reference numerals 2313 corresponds to the reference numeral 2113 (the alternation switch changeover signal input REV), the reference numerals 2314 corresponds to the reference numeral 2114 (the switch changeover signal SWP of the operational amplifier shown in FIGS. 34 and 37) shown in FIGS. 40 and 41.

FIG. 42 and Table 1 show the relation among an alternation switch changeover signal REV, a switch changeover signal SWP of the operational amplifier, and the outputs.

In FIG. 42, the reference numeral 2601 indicates an idealistic pixel voltage that is driven by the output voltage outputted from the odd-numbered output terminal. The reference numeral 2602 indicates an actual pixel voltage including an offset voltage. The alternation switch changeover signal REV is inverted for every frame, and the switch changeover signal SWP of the operational amplifier is inverted for every two frames. As a result, the difference between the idealistic pixel voltage and the actual pixel voltage changes for every frame, i.e., successively changes as A, B, −A, and −B in this order. Accordingly, it takes four frames for the difference to return to the original state.

The deviation between the first frame and the third frame and the deviation between the second frame and the fourth frame have a same value and have polarities that are reversed to each other, respectively. When the period (cycle) of the frame is short enough compared to the reaction time of the liquid crystal material, (a) the deviations are canceled between the first and third frames and (b) the deviations are canceled between the second and fourth frames. At the even-numbered output terminals, similarly, the deviations are canceled for every four frames. Table 1 shows the fact.

TABLE 1

| INPUT SIGNAL | | OUTPUT TERMINAL | |
|---|---|---|---|
| SWP | REV | ODD-NUMBERED | EVEN-NUMBERED |
| LOW LEVEL | LOW LEVEL | POSITIVE POLARITY (DEVIATION A) | NEGATIVE POLARITY (DEVIATION B) |
| LOW LEVEL | HIGH LEVEL | NEGATIVE POLARITY (DEVIATION B) | POSITIVE POLARITY (DEVIATION A) |
| HIGH LEVEL | LOW LEVEL | POSITIVE POLARITY (DEVIATION −A) | NEGATIVE POLARITY (DEVIATION −B) |
| HIGH LEVEL | HIGH LEVEL | NEGATIVE POLARITY (DEVIATION −B) | POSITIVE POLARITY (DEVIATION −A) |

Thus, the unevenness of the deviations that are occurred for every liquid crystal driving output terminal is canceled in each display pixel, thereby ensuring that the display of high quality is carried out without being discerned as the display unevenness by the human eyes.

However, according to the foregoing conventional arts, each offset voltage happens to be generated due to the reasons such as the unevenness of the structural conditions in the differential amplifier (operational amplifier circuit) that constitutes the output circuit section (see FIG. 17) of the source driver. Each offset voltage is mainly generated in the differential section constituting the inputting stage of the differential amplifier. Each offset voltage causes an error with respect to an idealistic driving voltage to be applied to the liquid crystal display device, thereby resulting in that the display image is not appropriately displayed. This results in the display unevenness that causes the lowering of the display quality.

According to the first conventional art, the operational amplifier having an N-channel MOS transistor as its inputting stage and the operational amplifier having a P-channel MOS transistor as its inputting stage are provided so as to output a voltage having positive polarity and a voltage having negative polarity via a single output terminal (i.e., in a full range), respectively. This allows to cancel, in two frames, the deviations A and −A derived from the offset voltage as shown in FIG. 21.

However, since the circuit configuration requires two operational amplifiers for each output terminal, the problem that the scale of the circuit becomes large and its chip size becomes larger arises. In addition, since the number of operational amplifier circuits whose power consumption is relatively large increases, the low power consumption is hard to achieve.

Meanwhile, according to the second conventional art, (a) a voltage having positive polarity is outputted from the operational amplifier in which N-channel MOS transistors are adopted as its inputting stage, (b) a voltage having negative polarity is outputted from the operational amplifier in which P-channel MOS transistors are adopted as its inputting stage, and (c) the voltage having positive polarity and the voltage having negative polarity are switched by the changeover switch so as to output the output voltage in a full range. This allows that the number of the operational amplifiers is reduced by half, thereby realizing the reduction of the circuit scale and the low power consumption.

However, according to the second conventional art as shown in FIG. 20, it is not possible to cancel (a) the deviation A derived from the offset voltage that is generated by the operational amplifier circuit adopting N-channel MOS transistors with (b) the deviation B derived from the offset voltage that is generated by the operational amplifier circuit adopting P-channel MOS transistors, and (c) it is not also possible to cancel the error with respect to the idealistic driving voltage to be applied to the liquid crystal display device. This causes that the display image is not appropriately displayed, i.e., a so-called display unevenness occurs. These deficiencies were main reasons why the display quality is lowered.

According to the third conventional art, (a) a voltage having positive polarity is outputted from the operational amplifier in which N-channel MOS transistors are adopted as its inputting stage, (b) a voltage having negative polarity is outputted from the operational amplifier in which P-channel MOS transistors are adopted as its inputting stage, (c) the voltage having positive polarity and the voltage having negative polarity are switched by the changeover switch so as to output the output voltage in a full range, and (d) the noninverted input signal or inverted input signal is switched and inputted as the input signal to the input terminals (noninverted input terminal or inverted terminal) so as to newly generate another voltage having positive polarity and a further voltage having negative polarity (that are resultants of inversion of the foregoing respective voltages having positive and negative polarities) in accordance with the above changing of the input signals, in addition to the foregoing voltages having positive and negative polarities, thereby resulting in that the deviations A, B, −A, and −B are changed for every frame so as to cancel the deviations in four frames (see FIG. 42 and Table 1). The deviations A and −A are derived from the offset voltage that has been generated in the operational amplifier adopting the N-channel MOS transistors, and the deviations B and −B are derived from the offset voltage that has been generated in the operational amplifier adopting the P-channel MOS transistors. Thus, a so-called display unevenness can be eliminated.

SUMMARY OF THE INVENTION

In view of the foregoing problem, the present invention is made. It is an object of the present invention to provide driving apparatus and driving method of liquid crystal display apparatus in which an operational amplifier for outputting an output voltage having a positive polarity and an operational amplifier for outputting an output voltage having a negative polarity are separately provided so that a noninverted input signal and an inverted input signal are changed and outputted via the operational amplifiers, and in which the source driver can be configured by further providing a simple circuit and the unevenness of the deviations for the respective liquid crystal driving output terminals is indiscernible by cancellation operation among the frames in each display pixel without affecting the miniaturization and low power consumption of the source driver, thereby ensuring to carry out the display with good quality.

In order to achieve the foregoing object, a driving apparatus of liquid crystal display apparatus in accordance with the present invention is provided with (a) first and second amplifier circuits that amplify a noninverted input signal or an inverted input signal, (b) a first changeover circuit that selectively switches and outputs the noninverted and inverted input signals to be outputted to the first and second amplifier circuits, (b) a second changeover circuit that selectively switches and outputs output signals of the respective first and second amplifier circuits to pixels provided in a matrix manner in accordance with an alternation signal, and (c) a changeover control circuit that controls switching of the first and second changeover circuits so that polarity of an offset voltage to be applied to the pixel by the first and second changeover circuits is changed for every predetermined number of frames and the offset voltage is canceled for frames whose number is twice as many as the predetermined number of frames.

With the driving apparatus, the noninverted input signal and the inverted input signal are switched by the first changeover circuit, and the output signals of the first and second amplifier circuits are switched by the second changeover circuit, respectively. This switching allows to output the output signals that have been switched to the pixels provided in a matrix manner so as to drive the liquid crystal display apparatus.

When the difference of the circuit characteristics occurs between the two circuits that should have originally the same characteristic due to the characteristic unevenness occurred by the manufacturing process, it is most likely that an offset voltage occurs.

In view of the deficiency, according to the present invention, the first and second changeover circuits are switched by the changeover control circuit so that (a) the polarity of the offset voltage to be applied to the pixel is changed for every predetermined number of frames and (b) the offset voltage is canceled for frames whose number is twice as many as the predetermined number of frames.

The unevenness of the offset voltages for the respective liquid crystal output terminals is thus indiscernible by the human eyes. This is because the offset voltage is canceled in each pixel for the predetermined number of frames. This allows to carry out the display with good quality. Thus, it is possible to provide a driving apparatus of liquid crystal display apparatus with extremely high reliability.

A driving method of liquid crystal display apparatus in accordance with the present invention, in order to achieve the foregoing object, in which (a) noninverted and inverted input signals of first and second amplifier circuits are switched in accordance with a changeover signal and (b) output signals of the first and second amplifier circuits are switched and outputted to pixels provided in a matrix manner in accordance with an alternation signal, comprises the steps of: (1) controlling the changeover signal and the alternation signal so that polarity of each offset voltage to be applied to the pixel is changed for every predetermined number of frames, and (2) canceling the offset voltage for frames whose number is twice as many as the predetermined number of frames.

With the driving method of liquid crystal display apparatus, the noninverted and inverted input signals of first and second amplifier circuits are switched in accordance with the changeover signal and the output signals of the first and second amplifier circuits are switched and outputted to the pixels provided in a matrix manner in accordance with the alternation signal, respectively.

By the way, the first and second amplifier circuits originally should have the same circuit characteristic. However, it can not be avoided that there occurs a difference between the circuit characteristics due to the reasons such as the unevenness in the process of manufacturing the amplifier circuits. This causes the occurrence of an offset voltage.

In view of the deficiency, according to the present invention, the changeover signal and the alternation signal are controlled so that the polarity of each offset voltage to be applied to the pixel is changed for every predetermined number of frames, and so that the offset voltage is canceled for frames whose number is twice as many as the predetermined number of frames.

The unevenness of the offset voltages for the respective liquid crystal output terminals is thus indiscernible by the human eyes. This is because the offset voltage is canceled in each pixel for the predetermined number of frames. This allows the circuit to carryout the display with good quality. Thus, it is possible to provide a driving method of liquid crystal display apparatus with extremely high reliability.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description. The present invention will become more fully understood from the detailed description given hereinbelow and the accompanying drawings which are given by way of illustration only, and thus, are not limitative of the present invention.

BRIEF DESCRIPTION OF THE DRAWINGS

FIG. 1 is a circuit diagram showing a structure of a changeover control circuit in a driving apparatus of liquid crystal display apparatus in accordance with the present invention.

FIG. 3 is a circuit diagram explaining both the present invention and a conventional art and showing in detail an output circuit of the driving apparatus of liquid crystal display apparatus.

FIG. 5 is an explanatory diagram showing how offset voltages, which are applied to pixels on a liquid crystal display panel, disperse.

FIG. 6 is an explanatory diagram showing an offset voltage of a pixel located at the first row and the first column shown in FIG. 5.

FIG. 7 is a block diagram showing a structure of a main part of another driving apparatus of liquid crystal display apparatus.

FIG. 9 is an explanatory diagram showing how offset voltages, which are applied to pixels on a liquid crystal display panel shown in FIG. 8, disperse.

FIG. 11 shows both of the present invention and the conventional art, and is an example of a block diagram showing a TFT liquid crystal display apparatus that is a typical one of an active matrix type.

FIGS. 19(*a*) and 19(*b*) are block diagrams showing the structure of an output circuit in the source driver IC that carries out the dot inversion driving of the second conventional art.

FIG. 26 is an explanatory diagram showing the operation of the case where the discrepancy of characteristics that happens to occur due to the reason of the manufacturing process occurs between the transistors that constitute the differential amplifier circuit shown in FIG. 24 and/or between the load resistors.

FIG. 28 is an explanatory diagram showing an operation of the differential amplifier circuit shown in FIG. 27.

FIG. 29 is an explanatory diagram showing another operation of the differential amplifier circuit shown in FIG. 27.

FIG. 30 is an explanatory diagram showing the operation of the case where the discrepancy of characteristics that happens to occur due to the reason of the manufacturing process occurs between the transistors that constitute the differential amplifier circuit shown in FIG. 28 and/or between the load resistors.

FIG. 32 is a circuit diagram showing a structure of the circuit in which the load element of the differential amplifier circuit shown in FIG. 22 is replaced with the active load having a current mirror structure.

FIG. 36 is a circuit diagram showing another operation of the operational amplifier shown in FIG. 34.

FIG. 37 is a circuit diagram showing an example which embodies a differential amplifier circuit equivalent to that shown in FIG. 33, switches, and an output section.

FIG. 39 is a circuit diagram showing another operation of the operational amplifier shown in FIG. 37.

FIG. 40 is an output block diagram showing a liquid crystal driving circuit that adopts the differential amplifier circuit and carries out the dot inversion driving, and shows the case where a driving voltage having positive polarity is outputted via an odd-numbered output terminal while a driving voltage having negative polarity is outputted via an even-numbered output terminal.

DESCRIPTION OF THE EMBODIMENTS

The following description deals with one embodiment of the present invention with reference to FIGS. 1 through 10.

A liquid crystal display apparatus adopting TFTs in accordance with the present invention has basically the circuit configuration that has been shown in FIG. 11. The distinction over the conventional art resides in that a vertical synchronizing signal and an even/odd line discrimination signal are further supplied as the control signal to be outputted to the source driver.

Note that a processing circuit for the vertical synchronizing signal and the even/odd line discrimination signal is built in a controller, and when it is assumed that a line of a node A shown in FIG. 1 is a signal line, for example, it is only necessary to provide one more line for a control signal than the conventional art (later described).

Figure 2:
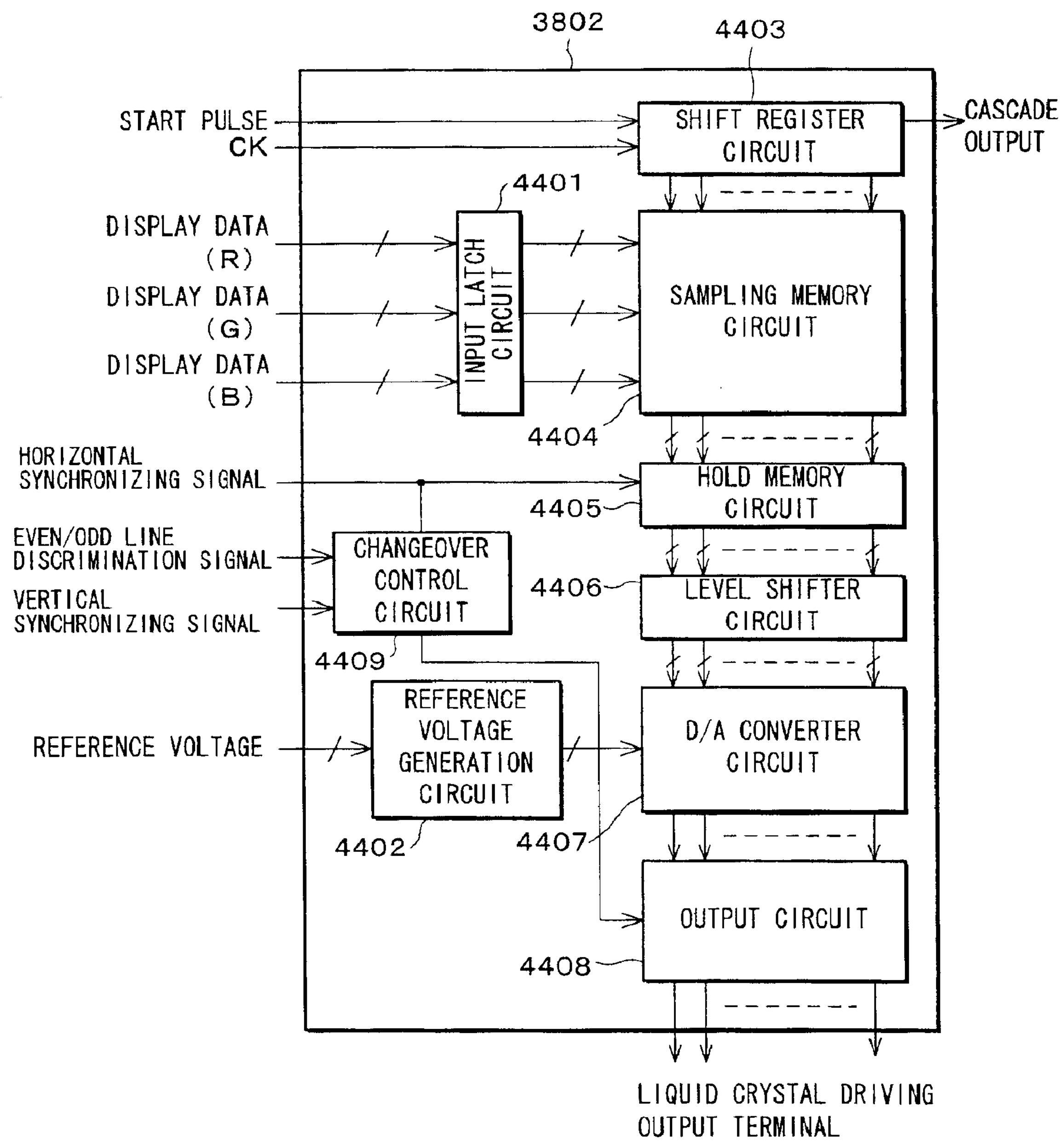
FIG. 2 is a block diagram showing a structure of a main part of the driving apparatus of liquid crystal display apparatus.

FIG. 2 is a block diagram of the source driver 3802 shown in FIG. 11.

Figure 17:
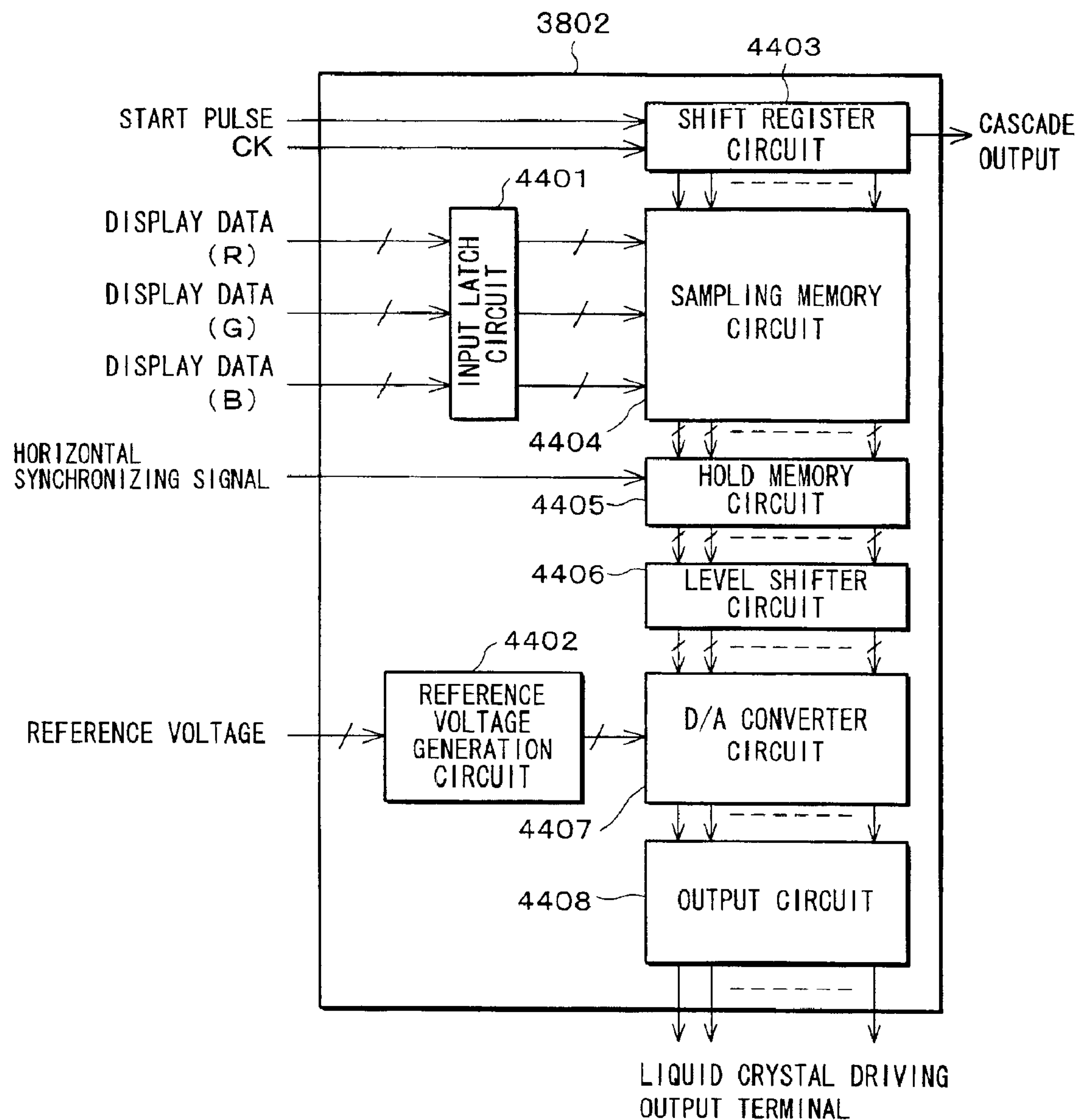
FIG. 17 is a block diagram of an example of the structure of a conventional source driver IC.
Figure 18:
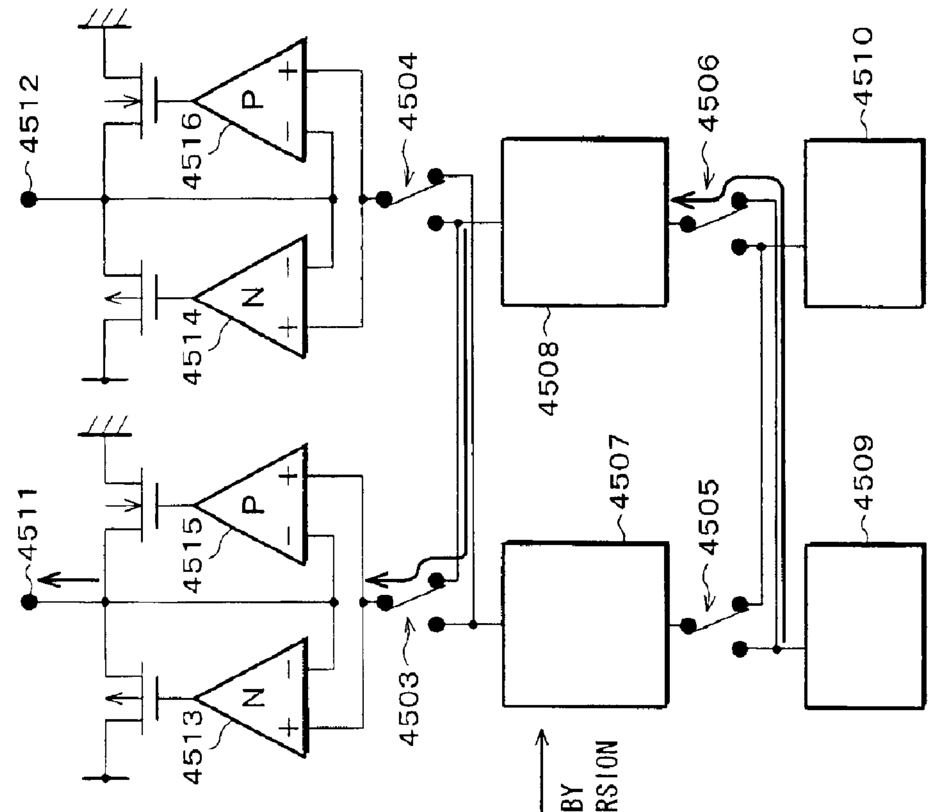
FIGS. 18(*a*) and 18(*b*) are block diagrams showing the structure of an output circuit in the source driver IC that carries out the dot inversion driving of the first conventional art.
Figure 18:
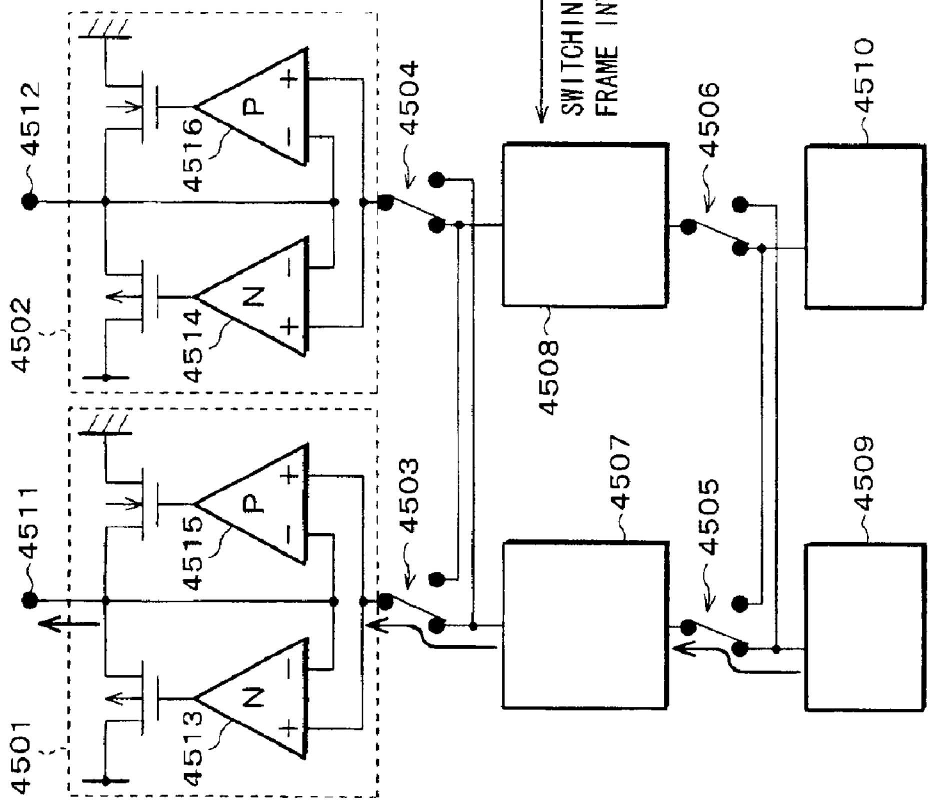
Figure 20:
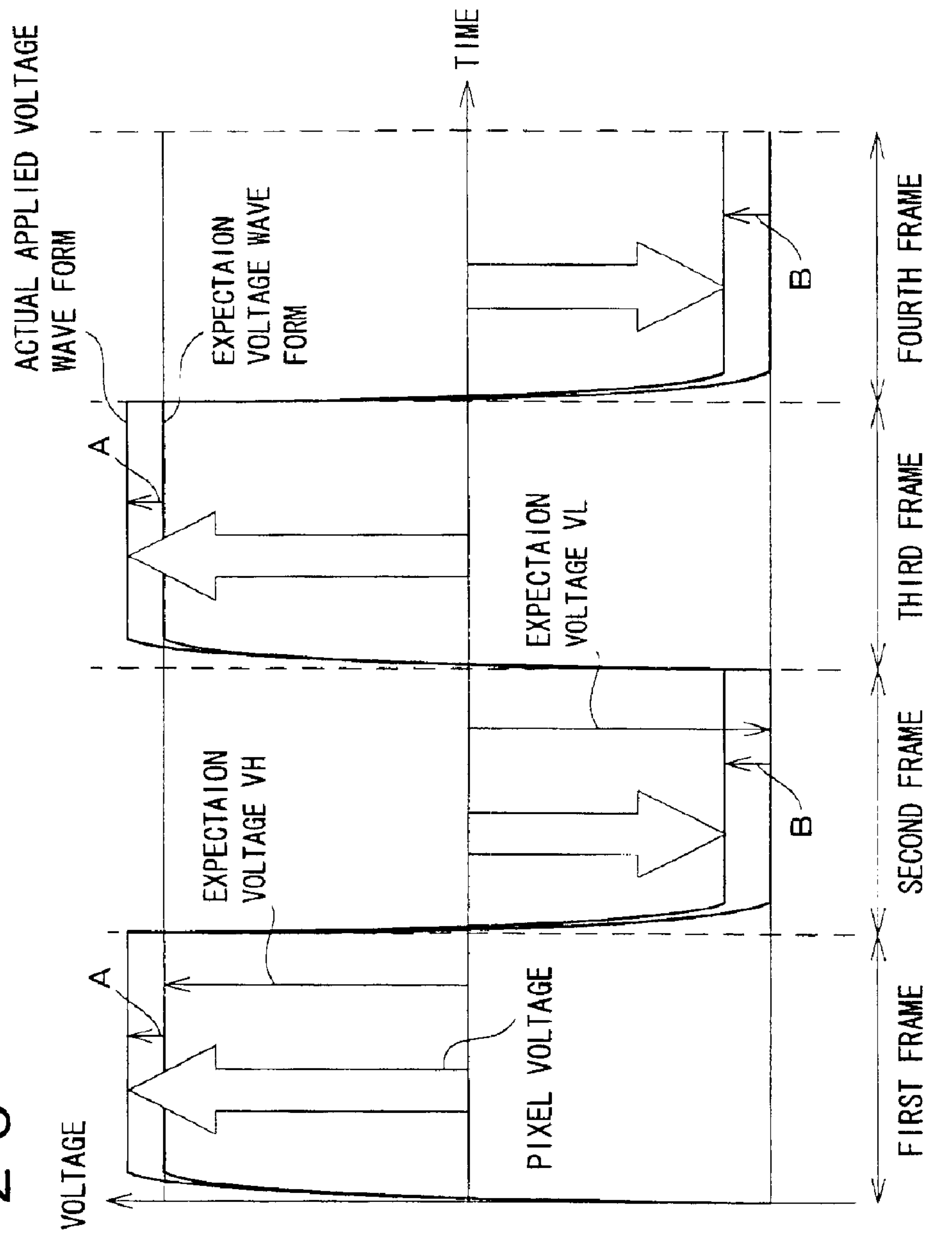
FIG. 20 is a wave form diagram showing an example of the wave form of the liquid crystal driving voltage in the case where a conventional operational amplifier happens to have an offset voltage.
Figure 21:
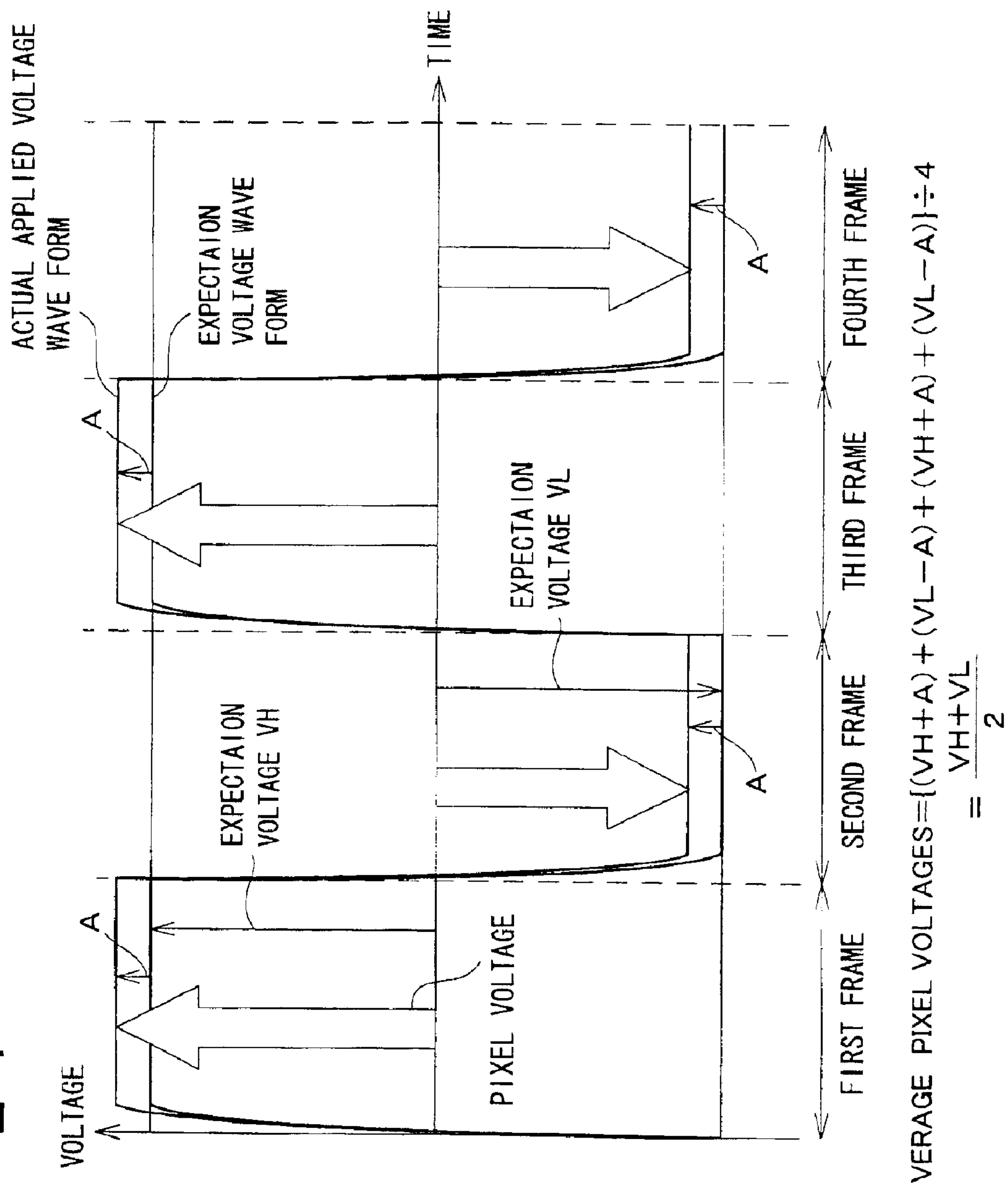
FIG. 21 is the wave form diagram showing the wave form of the liquid crystal driving voltage in the case of the structure shown in FIGS. 18(*a*) and 18(*b*).
Figure 22:
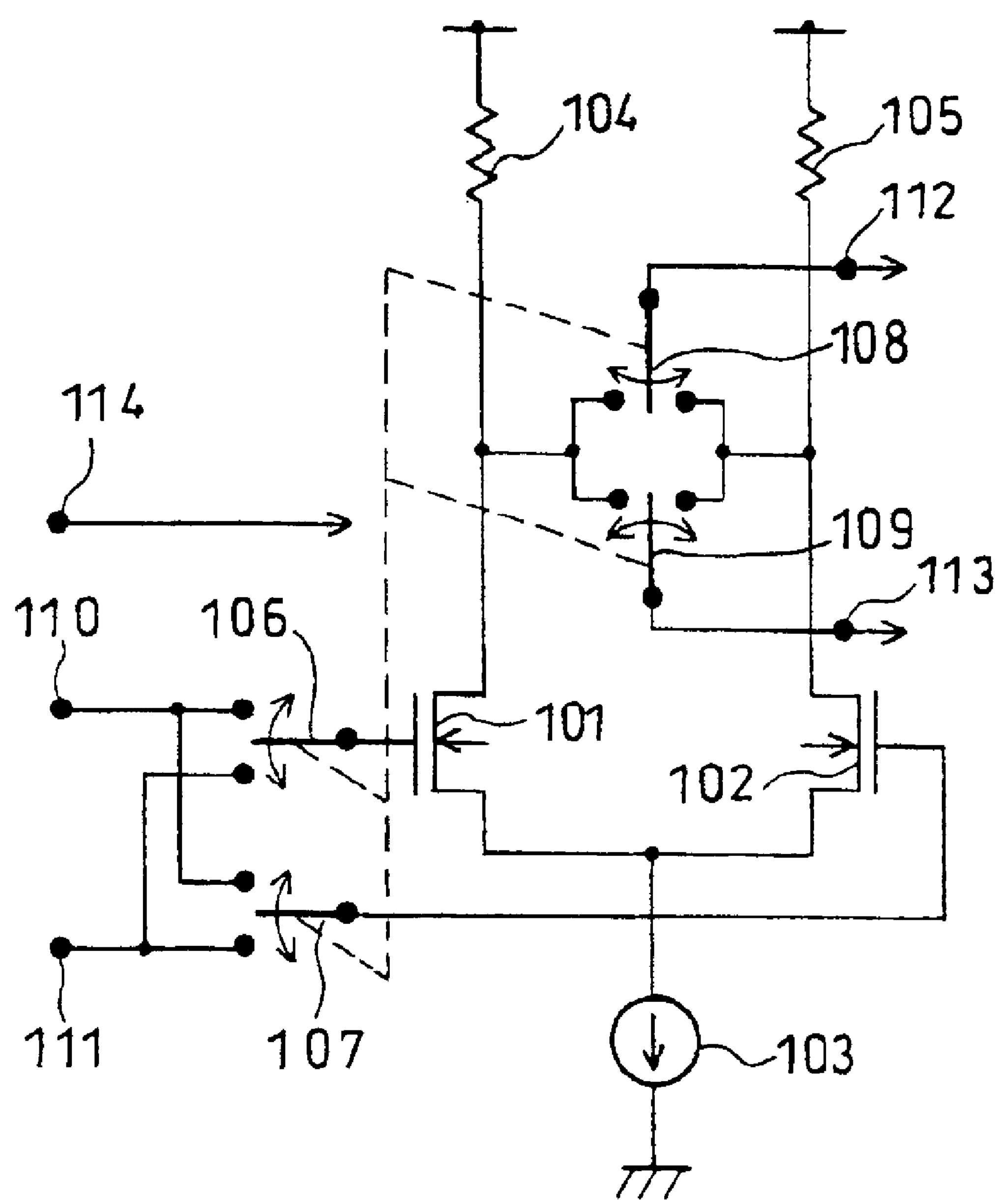
FIG. 22 is a circuit diagram showing an example of the structure of a differential amplifier circuit in accordance with the third conventional art.
Figure 23:
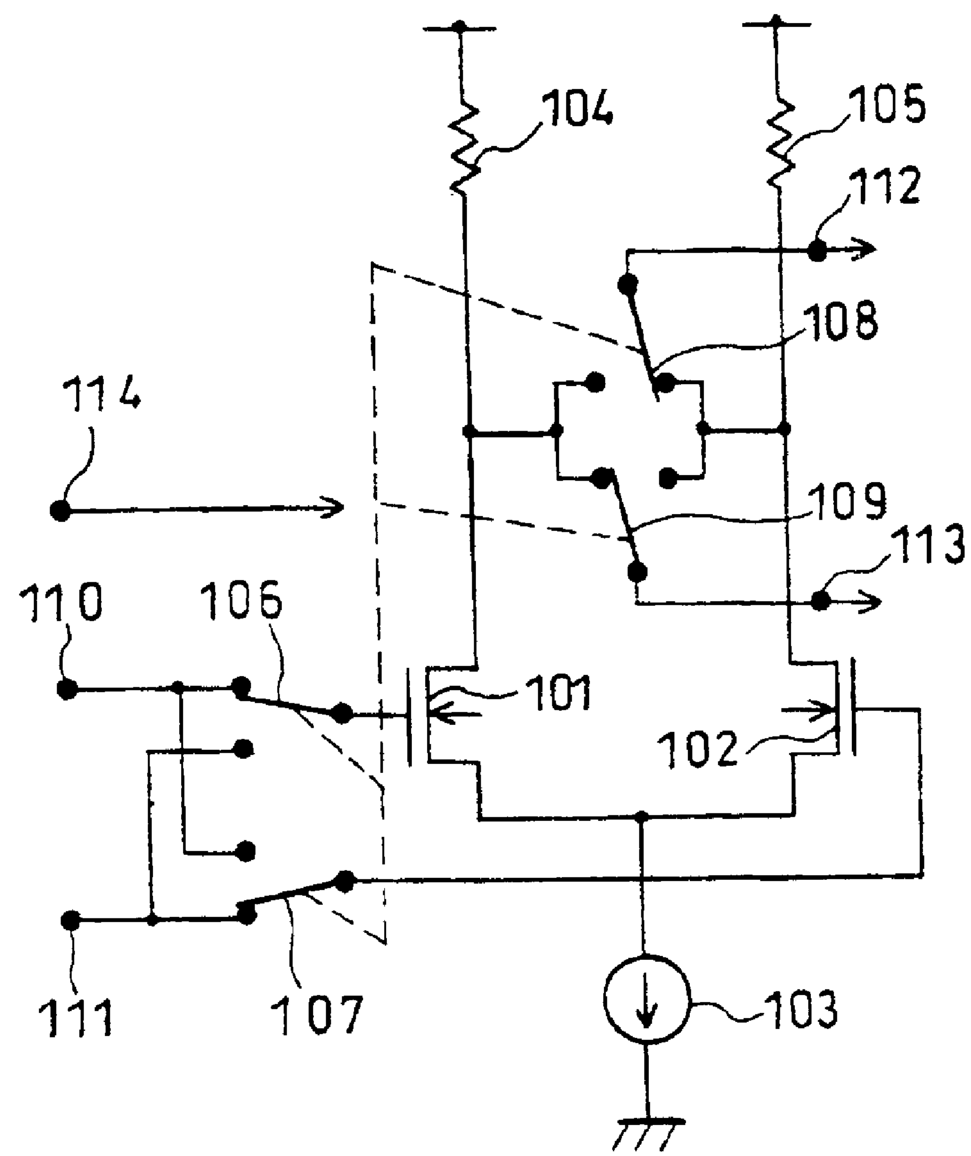
FIG. 23 is an explanatory diagram showing an operation of the differential amplifier circuit shown in FIG. 22.
Figure 24:
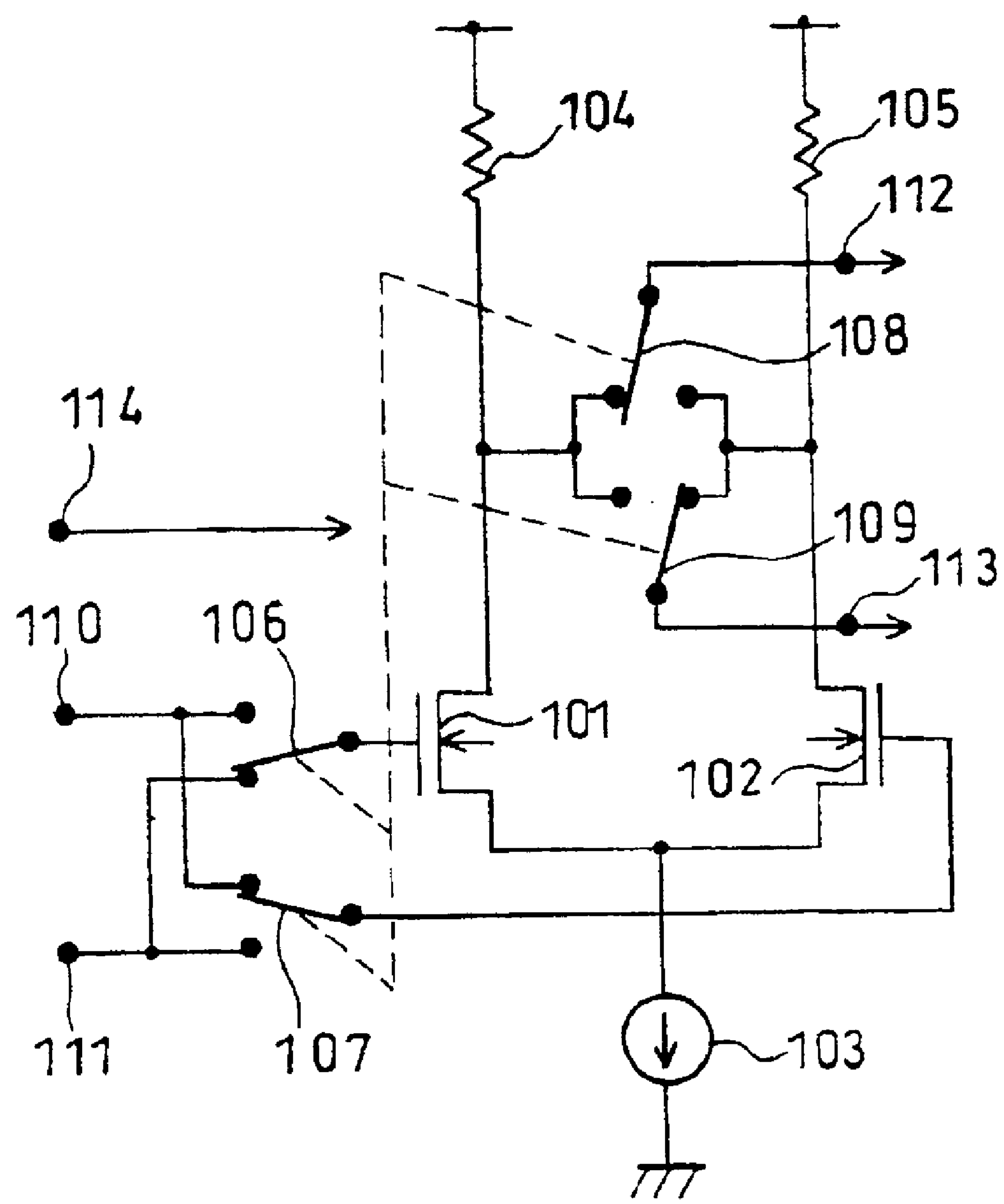
FIG. 24 is an explanatory diagram showing another operation of the differential amplifier circuit shown in FIG. 22.
Figure 25:
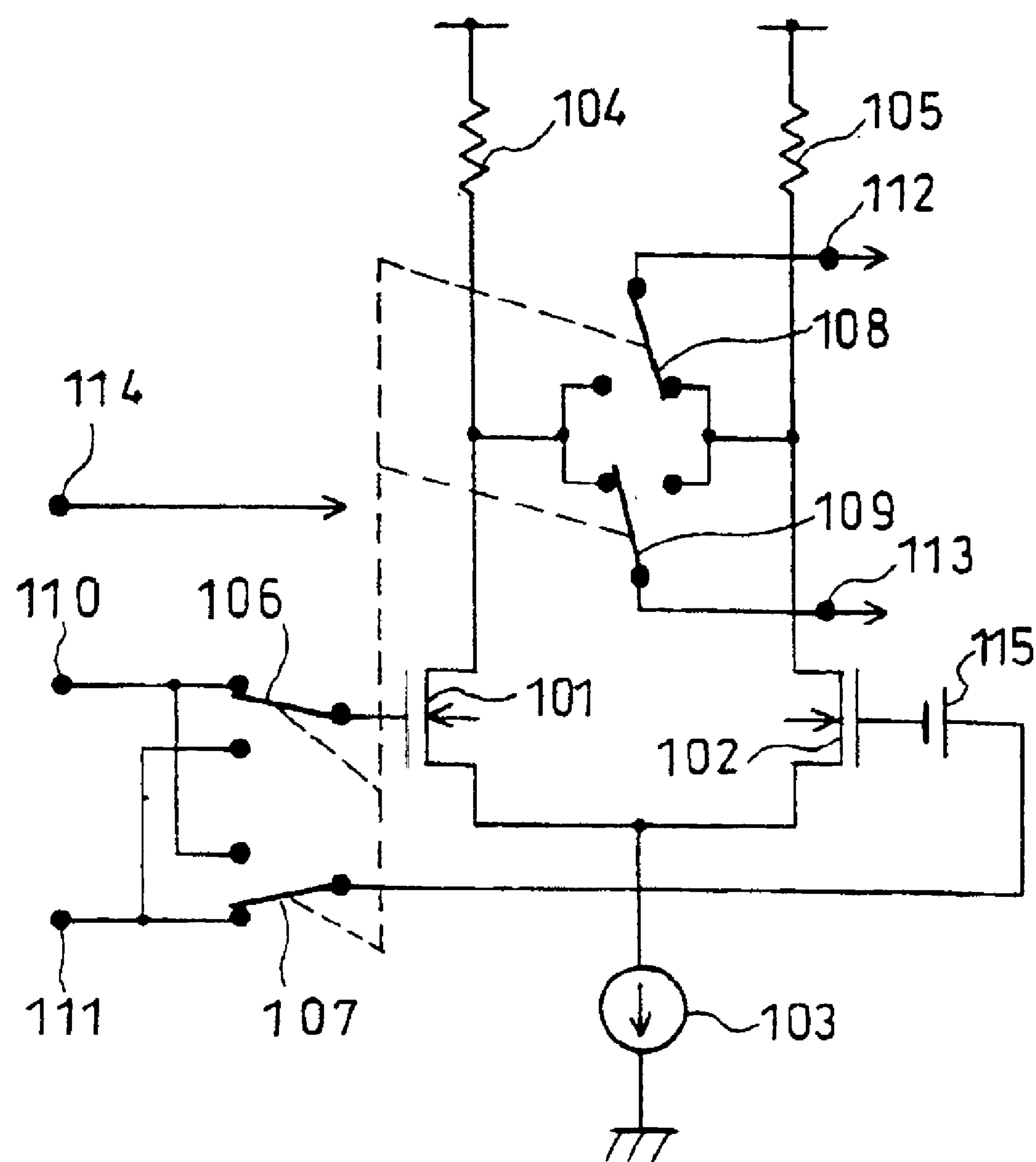
FIG. 25 is an explanatory diagram showing the operation of the case where the discrepancy of characteristics that happens to occur due to the reason of the manufacturing process occurs between the transistors that constitute the differential amplifier circuit shown in FIG. 23 and/or between the load resistors.
Figure 27:
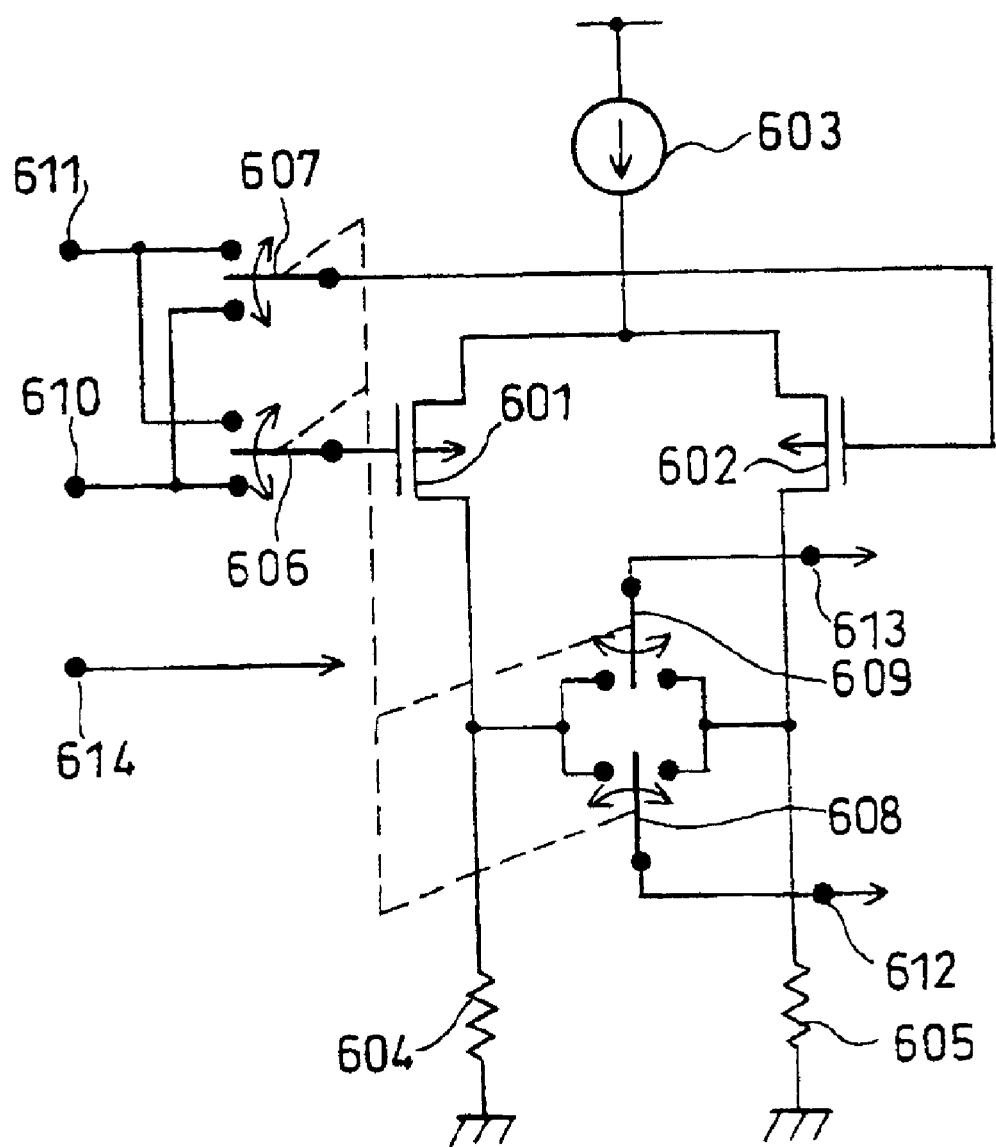
FIG. 27 is a circuit diagram showing another example of the structure of a differential amplifier circuit in accordance with the second conventional art.
Figure 31:
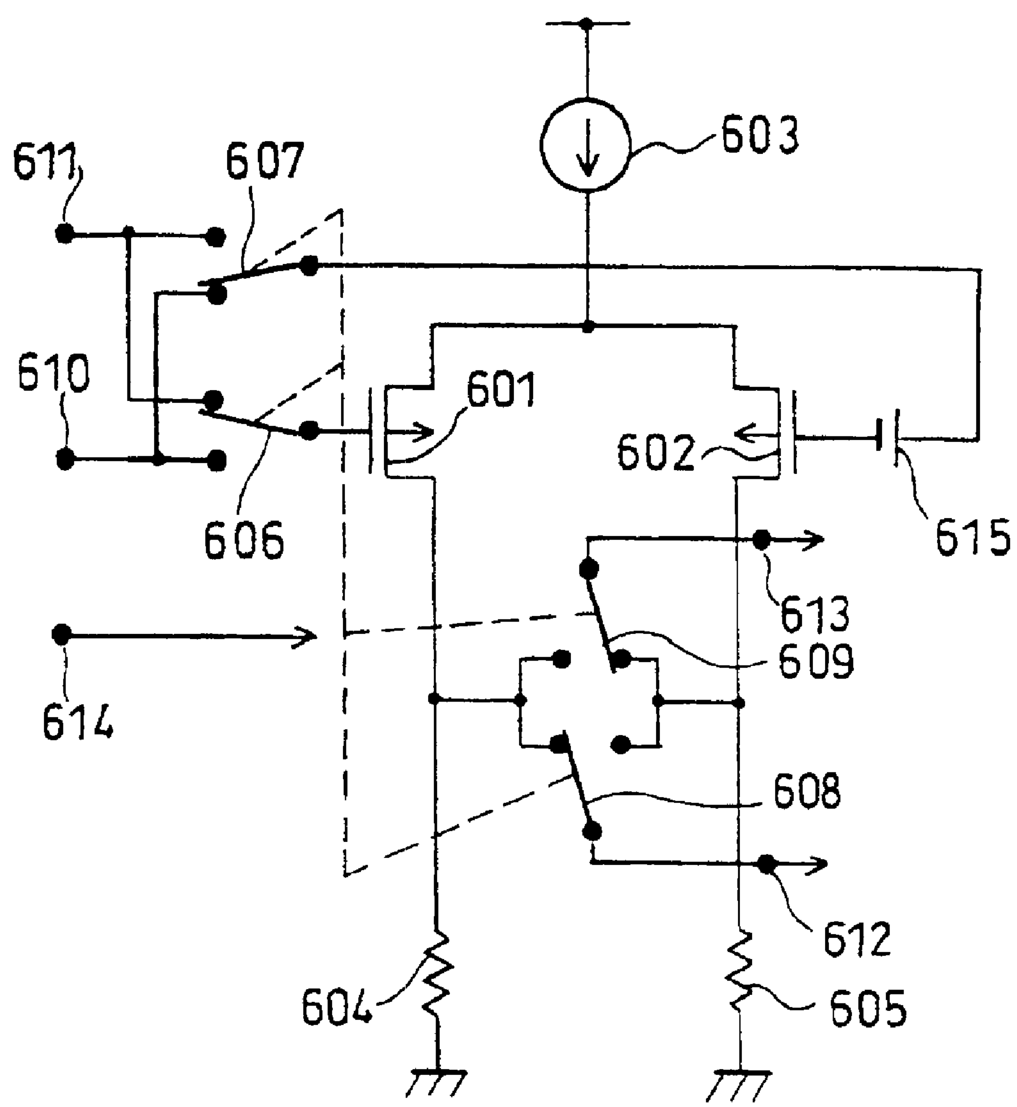
FIG. 31 is an explanatory diagram showing the operation of the case where the discrepancy of characteristics that happens to occur due to the reason of the manufacturing process occurs between the transistors that constitute the differential amplifier circuit shown in FIG. 29 and/or between the load resistors.
Figure 33:
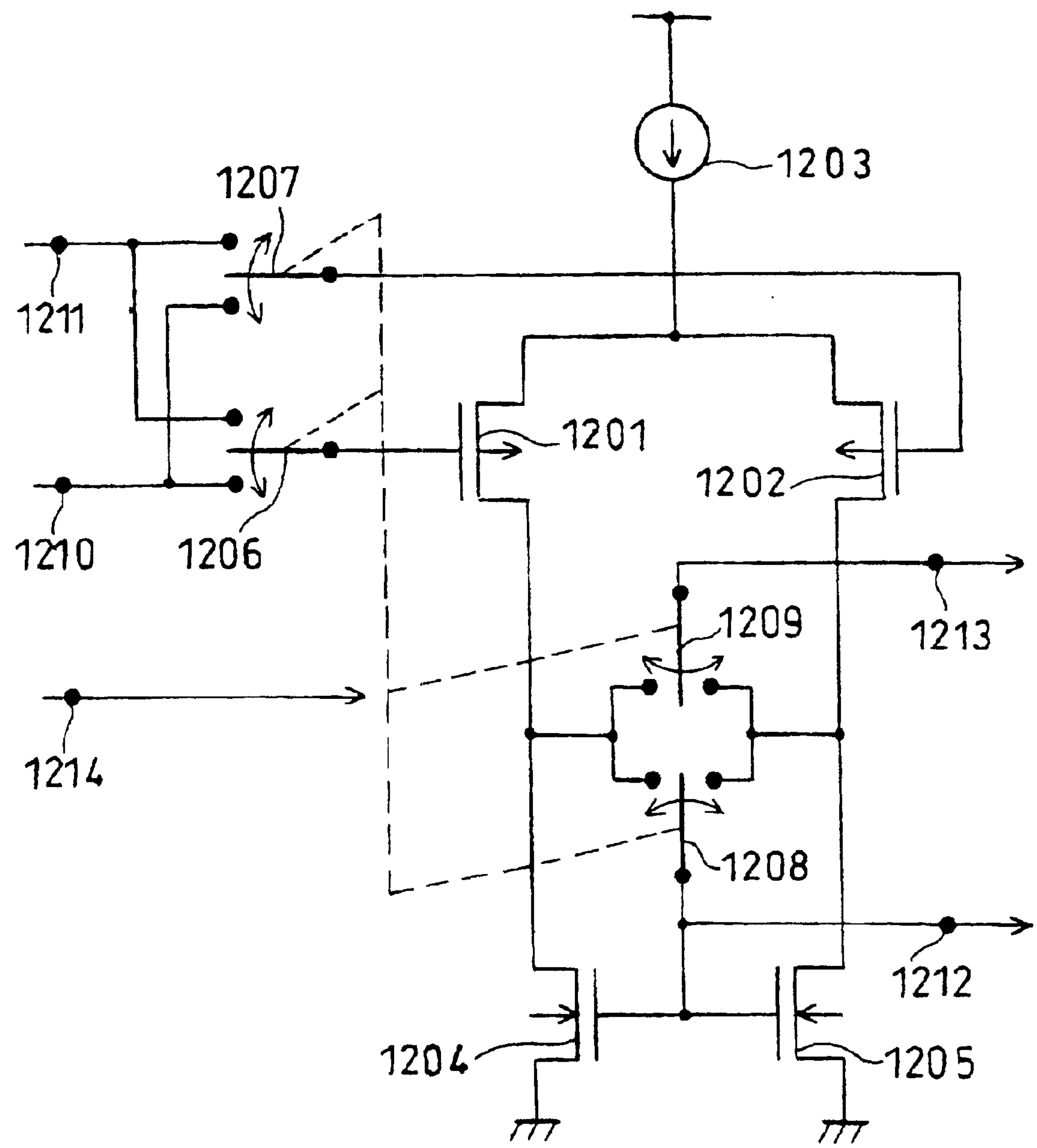
FIG. 33 is a circuit diagram showing a structure of the circuit in which the load element of the differential amplifier circuit shown in FIG. 27 is replaced with the active load having a current mirror structure.
Figure 34:
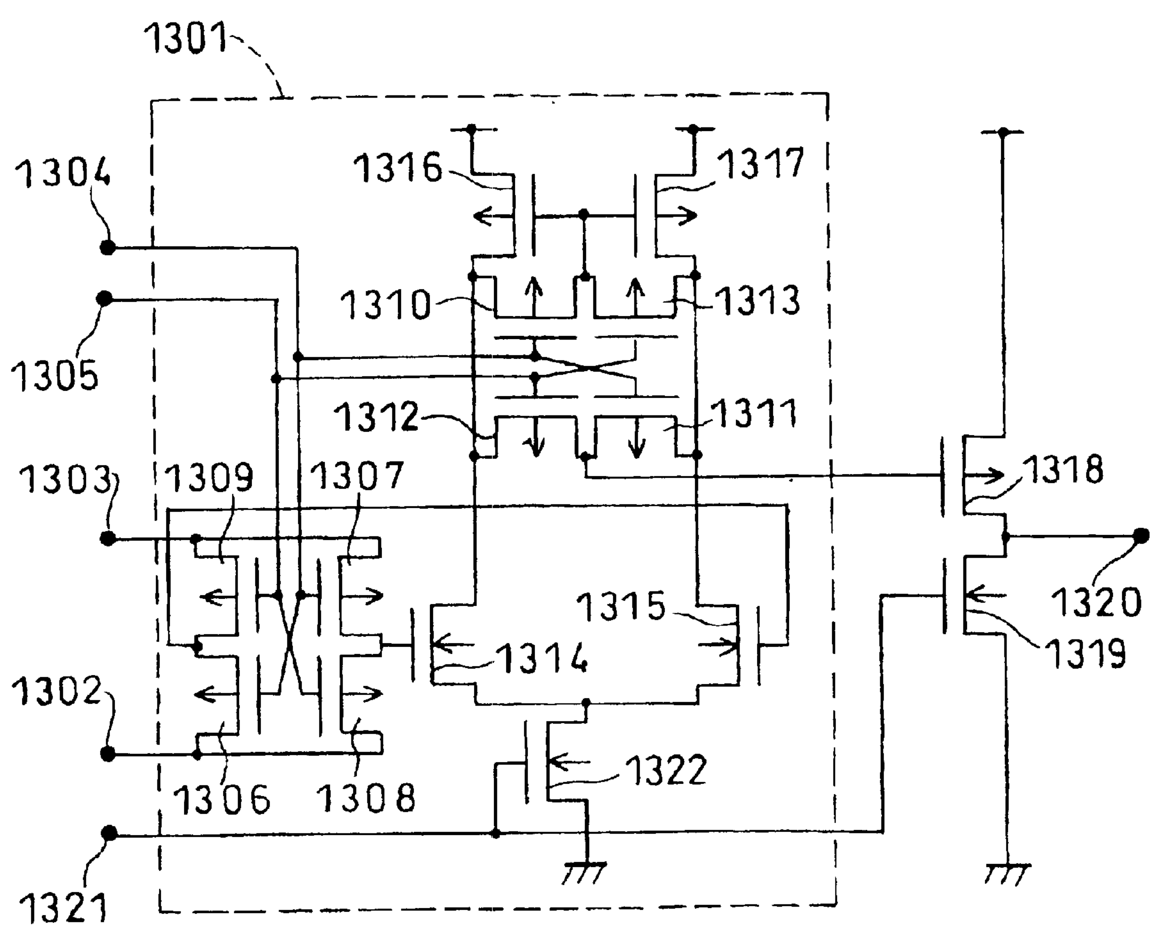
FIG. 34 is a circuit diagram showing an example which embodies a differential amplifier circuit equivalent to that shown in FIG. 32, switches, and an output section.
Figure 35:
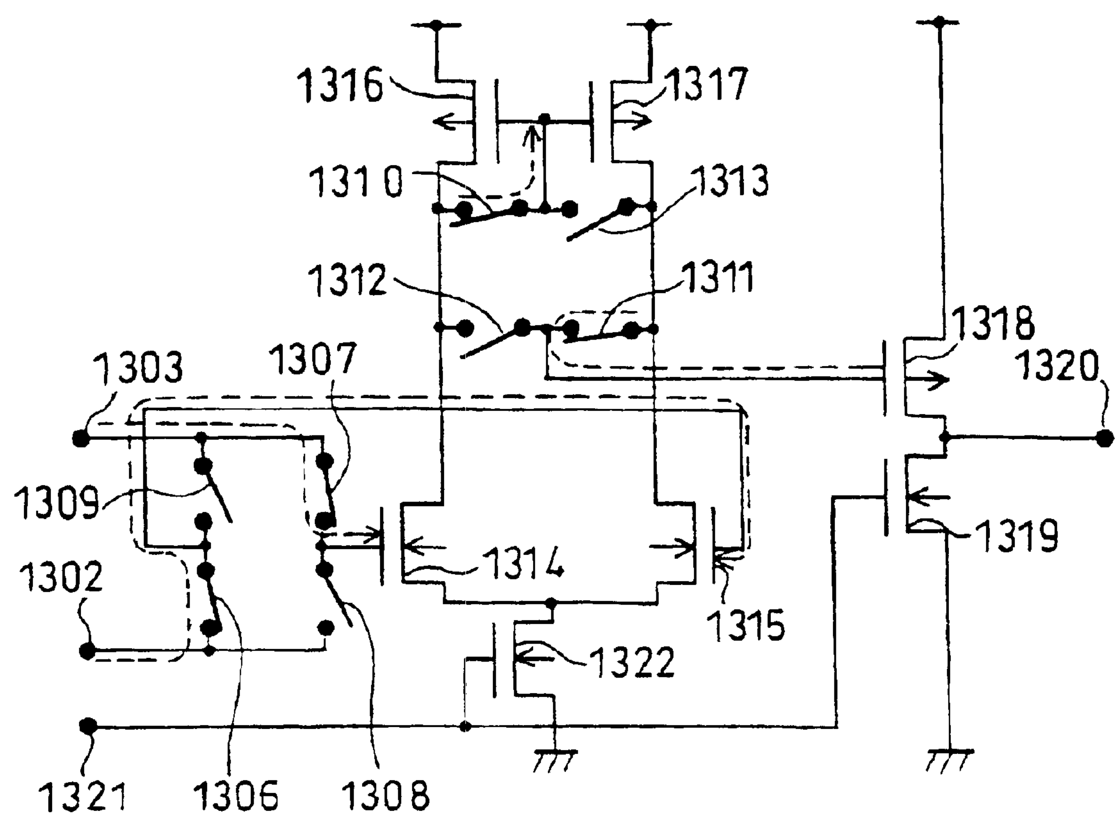
FIG. 35 is a circuit diagram showing an operation of an operational amplifier shown in FIG. 34.
Figure 38:
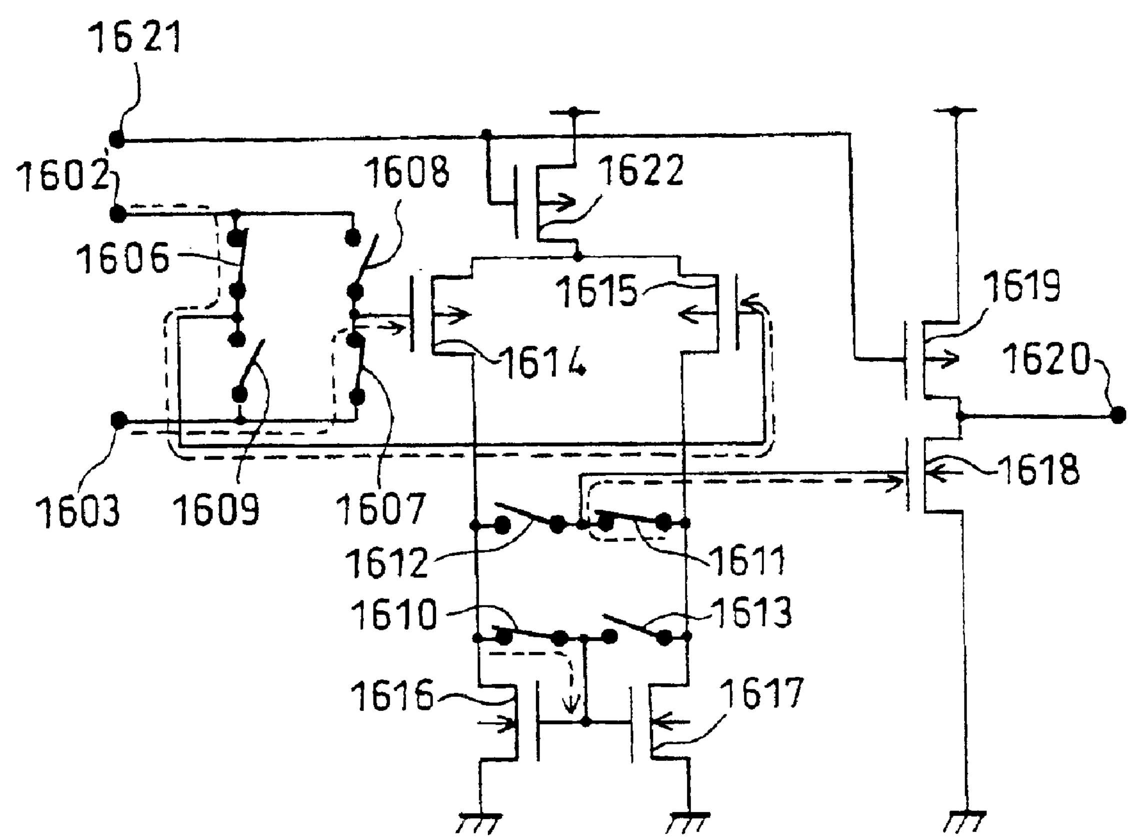
FIG. 38 is a circuit diagram showing an operation of an operational amplifier shown in FIG. 37.
Figure 41:
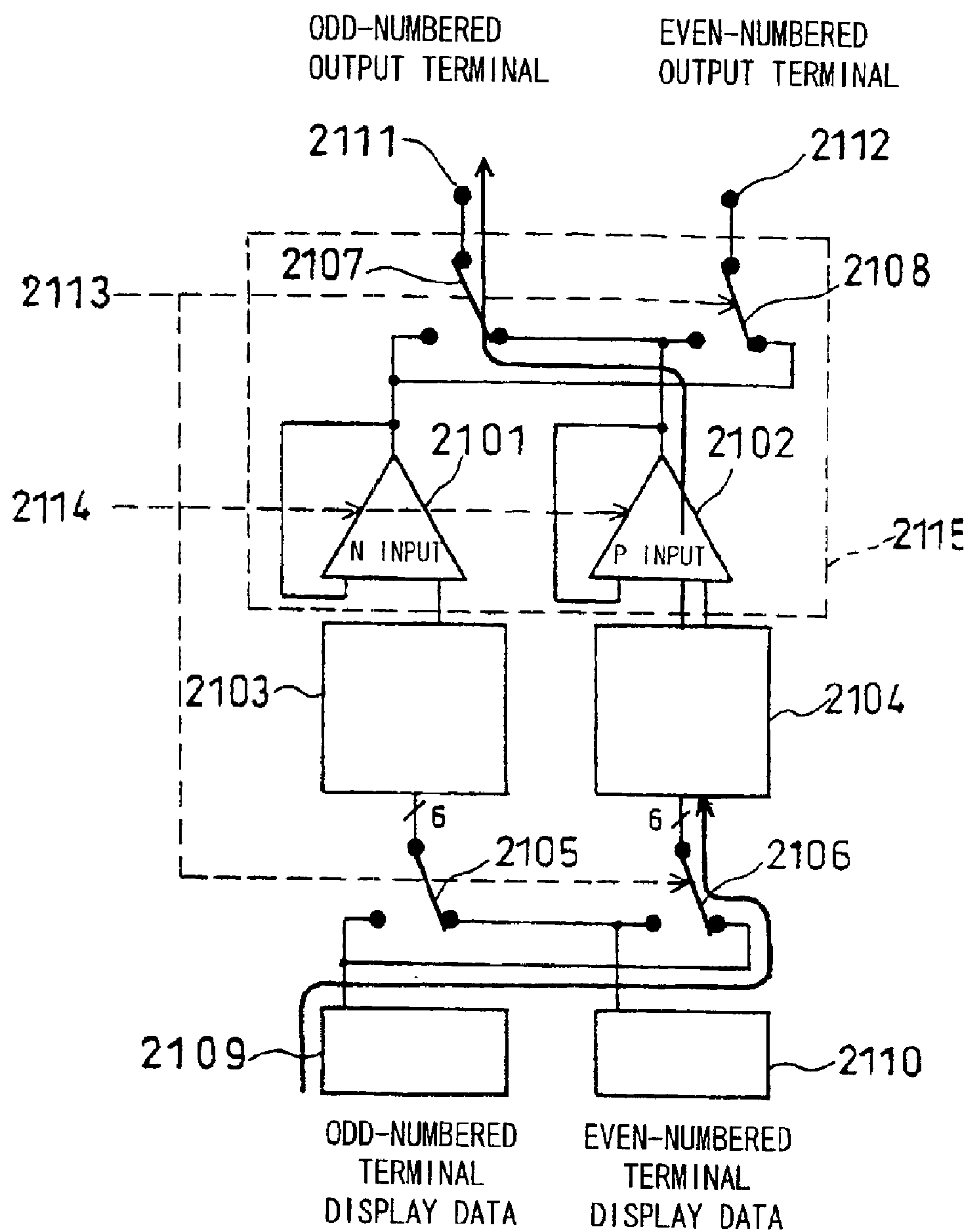
FIG. 41 is an output block diagram showing a liquid crystal driving circuit that adopts the differential amplifier circuit and carries out the dot inversion driving, and shows the case where a driving voltage having negative polarity is outputted via an odd-numbered output terminal while a driving voltage having positive polarity is outputted via an even-numbered output terminal.
Figure 42:
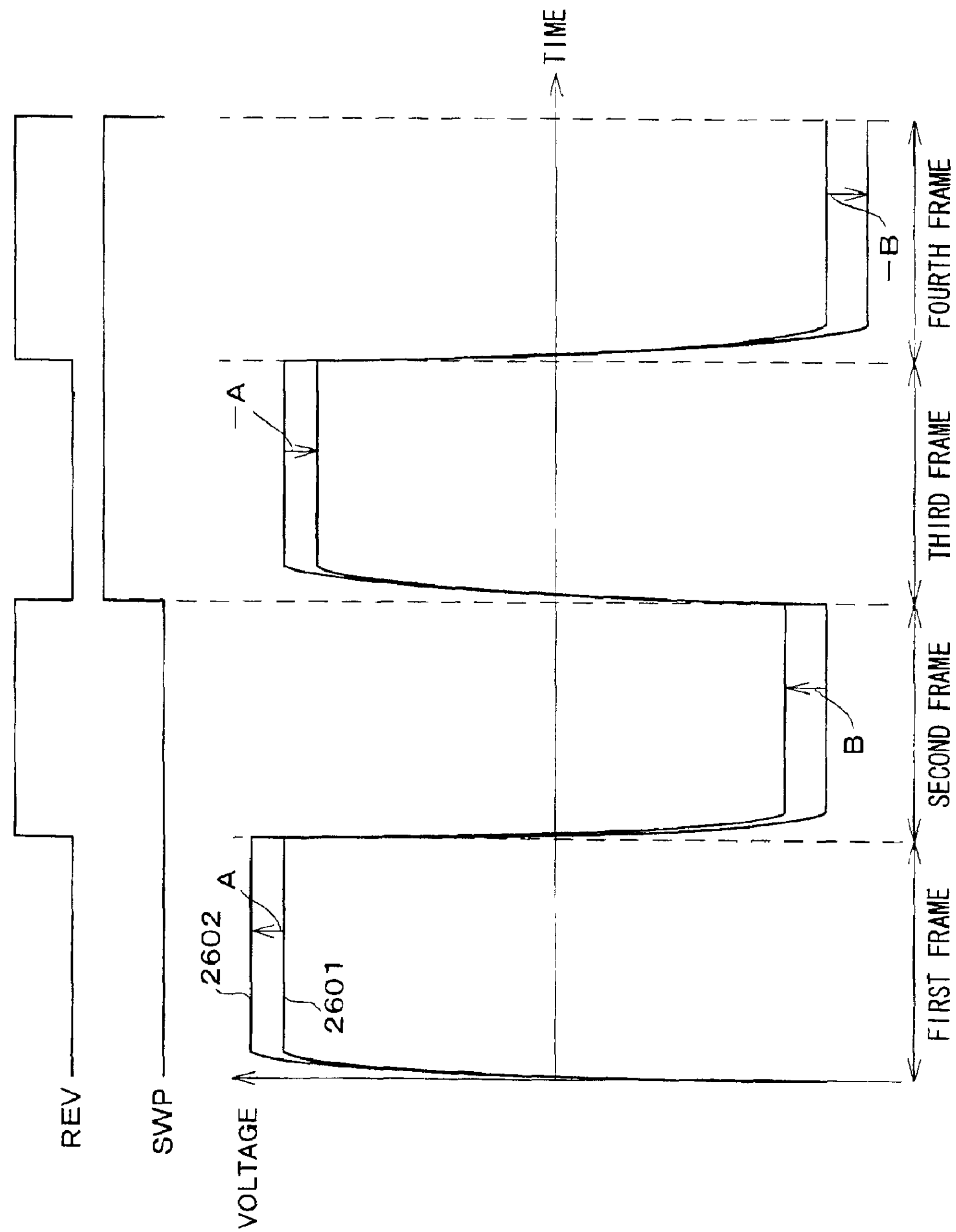
FIG. 42 is an explanatory diagram showing the conventional relation among an alternation switch changeover signal REV, a switch changeover signal SWP of the operational amplifier, and an output signal.

A shift register circuit 4403, a sampling memory circuit 4404, a hold memory 4405, a level shifter circuit 4406, a D/A converter circuit 4407, a reference voltage generation circuit 4402, and an input latch circuit 4401 have the same functions as those shown in FIG. 17, respectively. Accordingly, the explanation thereof is omitted here. An output circuit 4408 has a circuit configuration in which an operational amplifier for outputting a voltage having positive polarity and an operational amplifier for outputting a voltage having negative polarity are provided, separately. FIG. 3 is a detailed circuit configuration of the output circuit 4408.

FIG. 1 is an example of a structure of a changeover control circuit 4409 that is realized by a counter circuit shown in FIG. 2. In the changeover control circuit 4409, an SWP/REV changeover switch circuit (later described) is also included. The SWP indicates a switch changeover signal for the above two operational amplifiers, and the REV indicates an alternation switch changeover signal.

Figure 4:
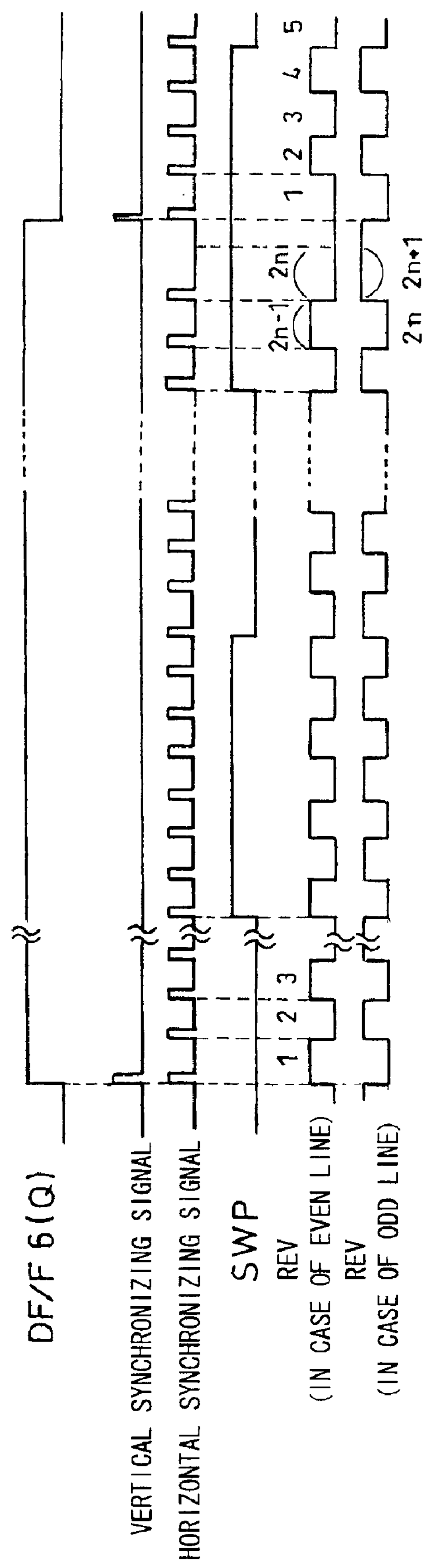
FIG. 4 is a diagram showing wave forms of input and output signals of the changeover control circuit.
Figure 12:
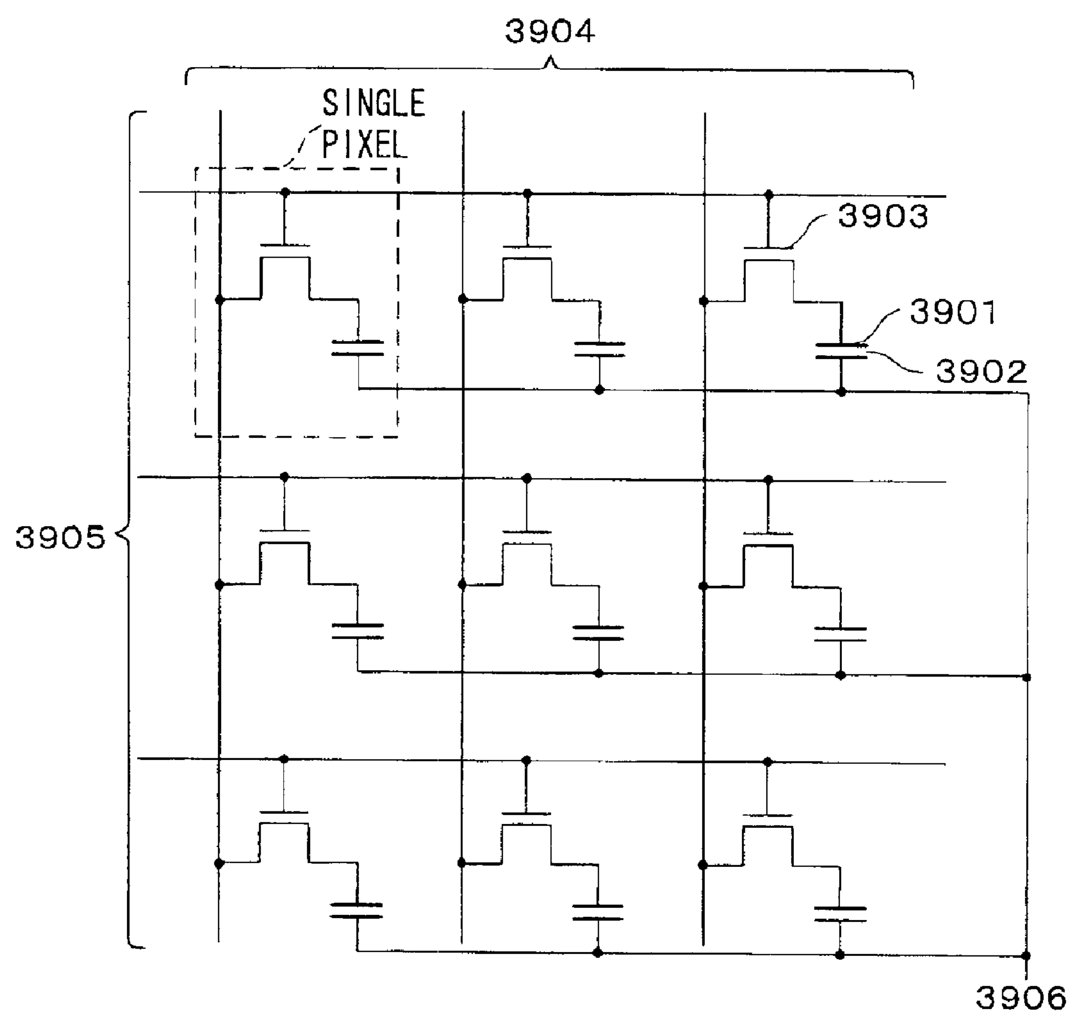
FIG. 12 is an explanatory diagram showing a structure of a conventional TFT liquid crystal panel.
Figure 13:
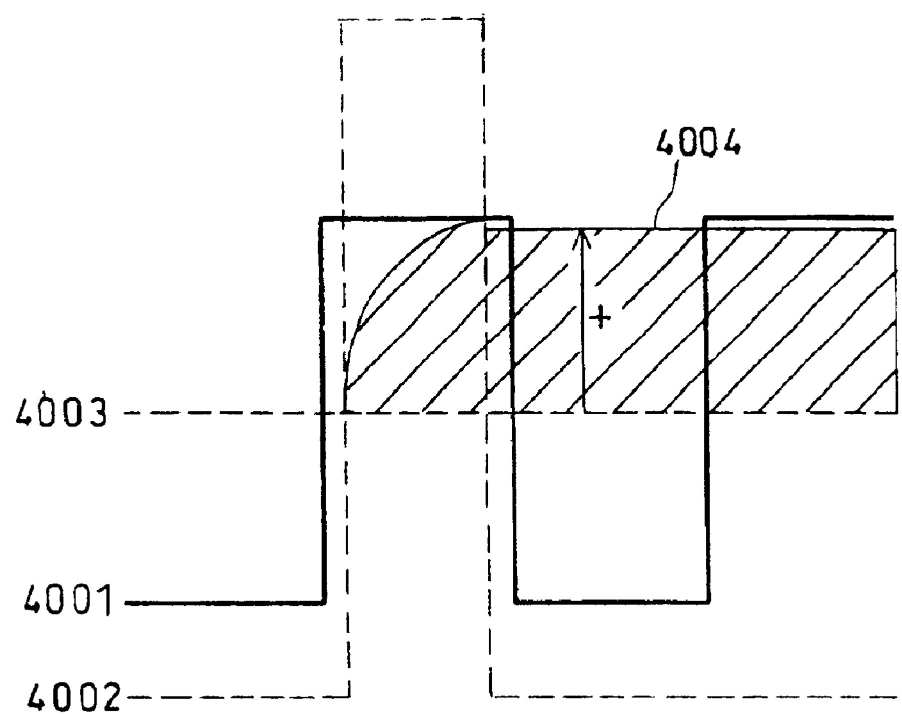
FIG. 13 is a diagram showing one example of a conventional liquid crystal wave forms, and shows the case where the TFT is turned on in response to the output signal of the gate driver when the output voltage of the source driver is greater than the voltage of the opposite electrode so that a voltage having positive polarity with respect to the opposite electrode is applied to the pixel electrode.
Figure 14:
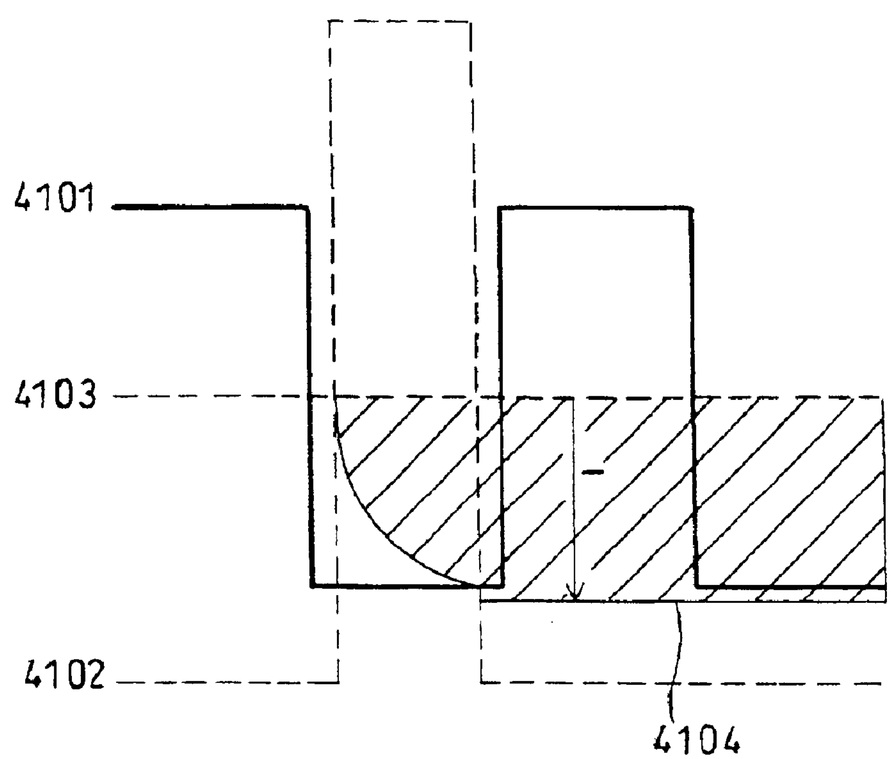
FIG. 14 is the wave form diagram showing an example of a conventional liquid crystal driving wave form, and shows that an output signal of the gate driver causes the TFT to be turned on when an output voltage of the source driver is smaller than the voltage of the opposite electrode so that a voltage showing a negative polarity with respect to the opposite electrode is applied to the pixel electrode.
Figure 15:
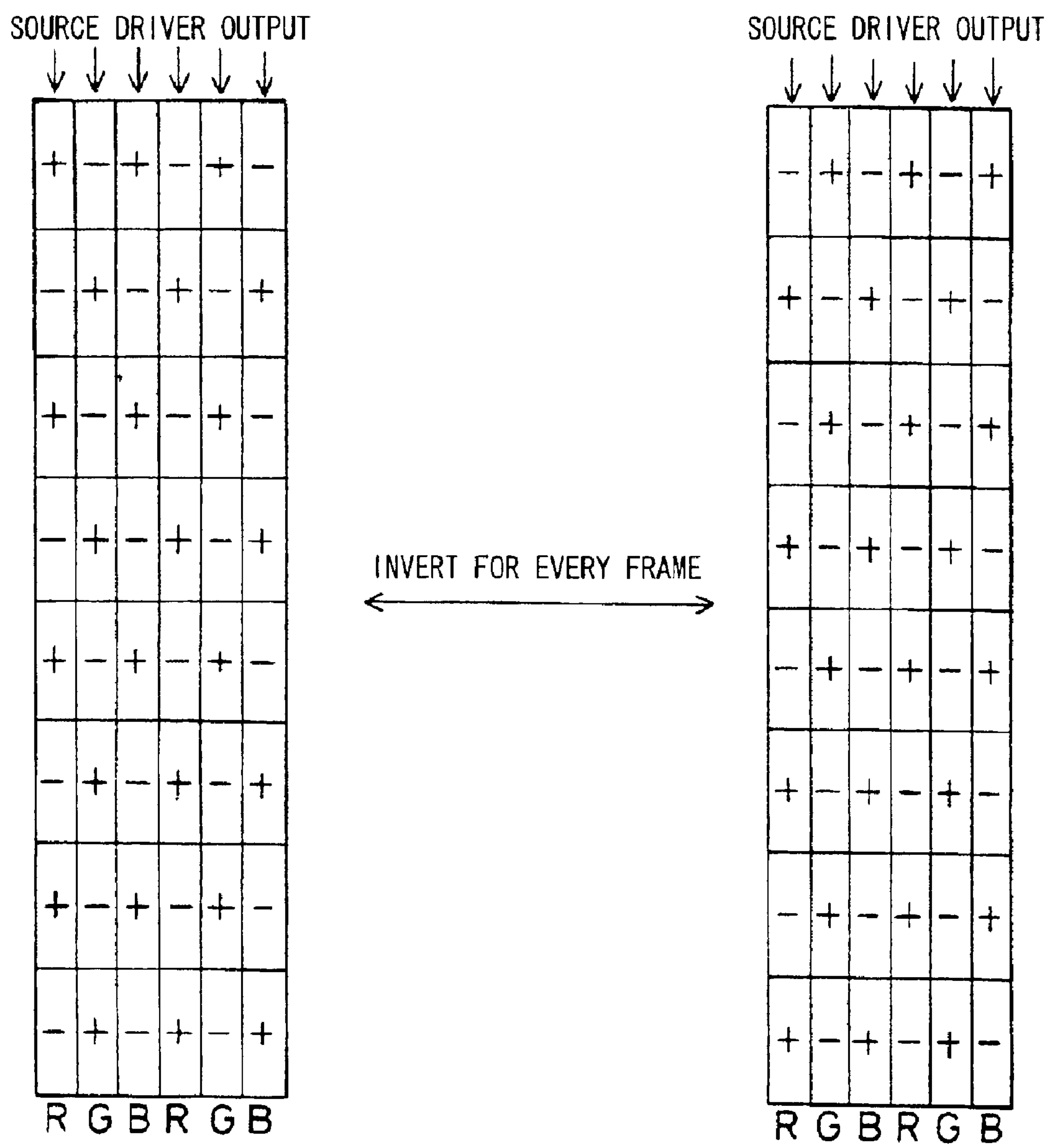
FIG. 15 is an explanatory diagram showing a conventional example of polarity arrangement of the alternation on a liquid crystal panel during the alternation of a liquid crystal driving voltage.
Figure 16:
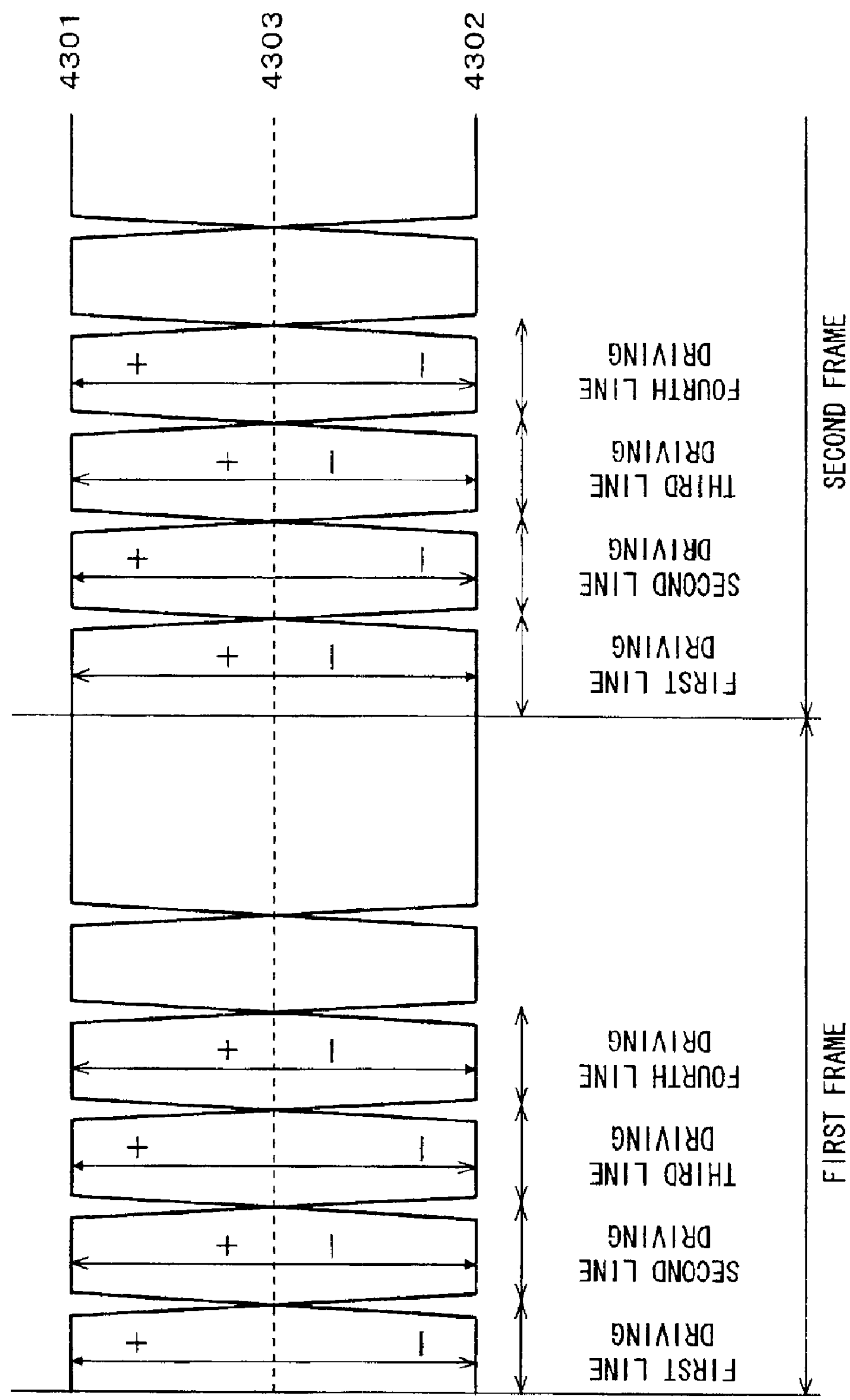
FIG. 16 is an explanatory diagram showing the wave form diagram of the source driver in a conventional dot inversion driving.

FIG. 4 shows the input signal wave form and the output signal wave forms of the changeover control circuit 4409. FIGS. 5 and 6 show how offset voltages, outputted from the output circuit 4408, disperse of the pixels on the liquid crystal display panel. Note that FIG. 5 shows the case where the number of the horizontal lines, which is the number of the row lines corresponding to the gate signal lines 3905 shown in FIG. 12, is an even number (i.e., an even number line panel).

According to FIG. 5, the display is carried out provided that the number of the row lines is eight. According to FIG. 5, the display is carried out provided that the number of the column lines is eight. This is for convenience sake of explanation. Namely, the present invention is not limited to this.

Note that in the case where the number of the horizontal lines is an odd number, for example, a line ⑨ following a line ⑧ shown in FIG. 5 is required to be further provided. The arrangement of deviations of the lines ① through ⑧ is not changed. Accordingly, the description with reference to drawings is omitted.

According to the present embodiment, the horizontal synchronizing signals are counted (are subjected to the frequency division) so that the deviation of the offsets is canceled by frames. FIG. 1 shows, for example, a case where the switch changeover signal SWP is switched for every seven horizontal lines.

In the changeover control circuit 4409, DF/F1 through DF/F4, that are realized by a D-type flip-flop, respectively, constitute a frequency divider circuit (14-frequency divider) that divides the frequency of the horizontal synchronizing signal so as to be 1/14. In each of the DF/F1 through DF/F4, an input terminal D is connected with an output terminal /Q. The horizontal synchronizing signal is applied to a clock input terminal CK of the DF/F1. An output terminal Q of the DF/F1 is connected with an inverted clock input terminal /CK of the DF/F2 following the DF/F1 (the next stage). An output terminal Q of the DF/F2 is connected with an inverted clock input terminal /CK of the DF/F3 following the DF/F2. The output terminals Q of the respective DF/F1 through DF/F3 are connected with input terminals of a 3-input NAND gate 5001, respectively.

An output terminal of the 3-input NAND gate 5001 is connected with respective reset input terminals R and a clock input terminal CK of the DF/F4 that realize a frequency divider circuit (2-frequency divider circuit) for dividing the frequency of the input signal to be ½. This allows the circuit to realize, with a simple circuit configuration, the frequency divider circuit that divides the frequency of the horizontal synchronizing signal so as to be 1/14. The output signals of the respective output terminals /Q and Q of the DF/F4 are outputted as the switch changeover signals SWP and /SWP for the operational amplifiers via inverters 5005 and 5006. Thus, the switch changeover signal SWP for the operational amplifier, that is inverted in synchronization with the rising of the horizontal synchronizing signal, is generated. Note that the /SWP in FIG. 1 is a resultant of inversion of the switch changeover signal SWP for the operational amplifier.

The vertical synchronizing signal is applied to a clock input terminal CK of a DF/F6, an output terminal Q of the DF/F6 is connected with one input terminal of an AND gate 5002 (logical product circuit). An even/odd line discrimination signal (a high level for the case where the number of the horizontal lines is an even number while a low level for the case where the number of the horizontal lines is an odd number) is applied to the other input terminal of the AND gate 5002. In the DF/F6, an input terminal D is connected with an output terminal /Q.

An output terminal of the AND gate 5002 is connected with each one input terminal of EX-OR gates 5003 and 5004. The other input terminal of the EX-OR gate 5003 is connected with the output terminal Q of the DF/F5. The other input terminal of the EX-OR gate 5004 is connected with the output terminal /Q of the DF/F5. Output signals of the respective EX-OR gates 5003 and 5004 are inverted by inverters 5007 and 5008 so as to be outputted as the alternation switch changeover signals REV and /REV, respectively.

Thus, the alternation switch changeover signals REV is also a signal that is inverted in synchronization with the rising of the horizontal synchronizing signal. Note that the /REV in FIG. 1 is a resultant of inversion of the alternation switch changeover signal REV.

The generation of the alternation switch changeover signal REV varies depending on whether the liquid crystal display panel is an even number line panel (the number of the horizontal lines is an even number) or an odd number line panel (the number of the horizontal lines is an odd number) as follows.

In the case of the even number line panel (corresponding to FIG. 5), the even/odd discrimination signal is high level. This causes to output, at the node A, a signal (corresponding to the output signal of the AND gate 5002) that has been subjected to the frequency division in which the frequency of the vertical synchronizing signal is divided so as to be ½. More specifically, upon receipt of the first vertical synchronizing signal, the DF/F6 outputs a signal of high level to the AND gate 5002 via the output terminal Q. Upon receipt of the second vertical synchronizing signal, the DF/F6 outputs a signal of low level to the AND gate 5002 via the output terminal Q.

When the output signal of the AND gate 5002 is high level (when receiving the first vertical synchronizing signal), the signal at the output terminal Q of the DF/F5 is outputted as the alternation switch changeover signal REV via the EX-OR gate 5003 and the inverter 5007. In contrast, when the output signal of the AND gate 5002 is low level (when receiving the second vertical synchronizing signal), a signal that is the resultant of inversion of the signal at the output terminal Q of the DF/F5 is outputted as the alternation switch changeover signal REV via the EX-OR gate 5003 and the inverter 5007 (see FIG. 4). Thereafter, the similar operation is carried out with respect to the following third, fourth, . . . , n-th (n: a natural number) vertical synchronizing signals. Note that the alternation switch changeover signal /REV is basically the same as the alternation switch changeover signal REV. Accordingly, the description thereof is omitted.

In the even number line panel, as has been described above, the alternation switch changeover signal REV is inverted for every frame in accordance with the output signal of the DF/F6. This causes that the REV and /REV are alternately outputted like REV43/REV→REV→/REV.

In contrast, in the odd number line panel, since the even/odd line discrimination signal is low level, the AND gate 5002 always outputs a signal of low level, irrespective of the signal at the output terminal Q of the DF/F6. The signal that is the resultant of inversion of the signal at the output terminal Q of the DF/F5 is outputted as the alternation switch changeover signal REV via the EX-OR gate 5003 and the inverter 5007 (see FIG. 4). This causes the alternation switch changeover signal REV not to change for every frame.

The wiring of the respective reset input terminals R of the DF/F4 through DF/F6 is omitted in FIG. 1. However, it is preferable that a reset signal is applied to the respective reset input terminals R when turning on the power source so that the respective switch changeover signals SWP and REV have the same phase in each source driver when a plurality of source drivers are provided.

Note that VBN and VBP shown in FIG. 3 indicate the bias voltage input terminals for providing the operating points of the operational amplifiers, respectively, and via the VBN and VBP appropriate bias voltages are applied so as to carry out the amplification without any distortion in the operational amplifier.

In FIG. 3, "from "H" side DAC" indicates an input signal from the positive-polarity D/A converter circuit 2103 shown in FIG. 40, and "from "L" side DAC" indicates an input signal from the negative-polarity D/A converter circuit 2104 shown in FIG. 40, respectively. The foregoing Table 1 shows the offset voltages of the output signals at the output terminals that have been generated in response to the switch changeover signals SWP and /SWP for the operational amplifiers and the alternation switch changeover signals REV and /REV.

The following description deals in detail with how the offset voltages are canceled by the frames, when the switch signals are used, with reference to FIG. 5.

In a row line ① in a frame ① shown in FIG. 5 when it is assumed that the alternation switch changeover signal REV is low level ("L") and the switch changeover signal SWP for the operational amplifier is low level ("L"), a signal in which an offset voltage +A is included is applied to the odd-numbered pixels, while a signal in which an offset voltage +B is included is applied to the even-numbered pixels.

In the next row line ②, the alternation switch changeover signal REV is inverted to be high level ("H") and the switch changeover signal SWP for the operational amplifier remains low level ("L") in the first through seventh row lines. This causes that a signal in which an offset voltage +B is included is applied to the odd-numbered pixels, while a signal in which an offset voltage +A is included is applied to the even-numbered pixels.

Thereafter, as shown in FIG. 5, the operation similar to the above are repeated, and then the switch changeover signal SWP for the operational amplifier changes into high level ("H") in a row line ⑧. And, the switch changeover signal SWP for the operational amplifier remains high level in the following seven lines bridging the next frame ②. Thereafter, the switch changeover signal SWP for the operational amplifier changes in a similar manner.

In contrast, the alternation switch changeover signal REV changes from low level to high level for every horizontal line (i.e., for every horizontal synchronizing signal), and further changes so as to be inverted for every frame (like REV→/REV). Thereafter, the alternation switch changeover signal REV changes in a similar manner.

According to the example shown in FIG. 5, in a frame ⑧, the polarities (+,–) of the respective offset voltages A and B of the operational amplifiers in which a P-channel MOS transistor is adopted as its input stage and the operational amplifier in which an N-channel MOS transistor is adopted as its input stage, respectively, are changed. Based on this, FIG. 6 shows the offset voltages that are included in the voltages to be applied to the pixel in the respective frames.

FIG. 6 shows the offset voltages that are included in the pixel ①-① specified by the first row line and the first column line in the respective fourteen frames. As is clear from FIG. 6, (a) it takes seven frames to change the polarity of the deviation and (b) it takes fourteen frames to cancel the deviation of the polarities. Thus, the offset voltages included in the pixel ①-① are canceled. The same description is made for the odd number panel line. This is because the deviation output relation of the odd number panel line based on the signal conditions of the alternation switch changeover signal REV and the switch changeover signal SWP for the operational amplifier is same as that of the even number panel line. Accordingly, the description thereof is omitted.

The foregoing description deals with the case where the switch changeover signal SWP for the operational amplifier is changed for every seven horizontal lines and one frame is constituted by eight horizontal lines. This causes that (a) it takes seven frames to change the polarity of the deviation and (b) it takes fourteen frames to cancel the deviation of the polarities. However, the present invention is not limited to this. When selecting the counting number of the horizontal synchronizing signals with respect to the number of the horizontal lines of the screen based on the above concept, it becomes possible to change the polarity of the offset voltage for every n frames. As is clear from FIG. 1, it is easy to change the counting number of the horizontal synchronizing signal.

When the number of the horizontal lines of the screen is an integral multiple of the counting number of the horizontal synchronizing signals, the offset voltages having the same polarity are applied to the pixel. Accordingly, the polarity is not reversed. For this reason, it is necessary to set the number of the horizontal lines of the screen so as not to be equal to an integral multiple of the number of the horizontal lines that have been counted.

The following description deals with another embodiment of the present invention with reference to FIGS. 3, 7, 8, 9, and 10. When compared with the foregoing embodiment, the object of the present invention is achieved by a simpler circuit configuration.

As shown in FIG. 7, the distinction resides in a changeover control circuit 4410 that is realized by a counter circuit. The changeover control circuit 4410 has a circuit configuration shown in FIG. 8. According to the circuit configuration shown in FIG. 8, the switch changeover signal SWP for the operational amplifier is changed for every two frames in accordance with the horizontal synchronizing signal, for example.

In the changeover control circuit 4410, DF/F11 and DF/F12 that are realized by a D-type flip-flop constitute a frequency divider circuit (4-frequency divider circuit) that divides the frequency of the vertical synchronizing signal so as to be ¼. In each of the DF/F11 through DF/F12, an input terminal D is connected with an output terminal /Q. The vertical synchronizing signal is applied to a clock input terminal CK of the DF/F11. An output terminal Q of the DF/F11 is connected with a clock input terminal CK of the DF/F12 following the DF/F11 (the next stage). The output signals at the respective output terminals /Q and Q of the DF/F12 are outputted as the switch changeover signals SWP and /SWP for the operational amplifiers via inverters 3105 and 3106. Thus, the switch changeover signal SWP for the operational amplifier, that is inverted for every two frames in synchronization with the rising of the vertical synchronizing signal, is generated (see FIG. 10).

An output terminal Q of the DF/F11 is connected with one input terminal of an AND gate 3102 (logic product circuit). An even/odd line discrimination signal (a high level for the case where the number of the horizontal lines is an even number while a low level for the case where the number of the horizontal lines is an odd number) is applied to the other input terminal of the AND gate 3102.

An output terminal of the AND gate 3102 is connected with each one input terminal of respective EX-OR gates 3103 and 3104. The other input terminal of the EX-OR gate 3103 is connected with the output terminal Q of the DF/F13. The other input terminal of the EX-OR gate 3104 is connected with the output terminal /Q of the DF/F13. Output signals of the respective EX-OR gates 3103 and 3104 are inverted by inverters 3107 and 3108 so as to be outputted as the alternation switch changeover signals REV and /REV.

The generation of the alternation switch changeover signal REV varies depending on whether the liquid crystal display panel is an even number line panel (the number of the horizontal lines is an even number) or an odd number line panel (the number of the horizontal lines is an odd number) as follows.

In the case of the even number line panel (corresponding to FIG. 9), the even/odd discrimination signal is high level. This causes the output signal of the AND gate 3102 to vary depending on a signal at the output terminal Q. More specifically, upon receipt of the first vertical synchronizing signal, the DF/F11 outputs a signal of high level to the AND gate 3102 via the output terminal Q. Upon receipt of the second vertical synchronizing signal, the DF/F11 outputs a signal of low level to the AND gate 3102 via the output terminal Q.

When the output signal of the AND gate 3102 is high level (when receiving the first vertical synchronizing signal), the signal at the output terminal Q of the DF/F13 is outputted as the alternation switch changeover signal REV via the EX-OR gate 3103 and the inverter 3107 (the frequency of the horizontal synchronizing signal is divided by 2 and the resultant signal thus divided is outputted as the alternation switch changeover signals REV). In contrast, when the output signal of the AND gate 3102 is low level (when receiving the second vertical synchronizing signal), a signal that is the resultant of inversion of the signal at the output terminal Q of the DF/F13 is outputted as the alternation switch changeover signal REV via the EX-OR gate 3103 and the inverter 3107. Thereafter, the similar operation is carried out with respect to the following third, fourth, . . . , n-th vertical synchronizing signals. Note that the alternation switch changeover signal /REV is basically the same as the alternation switch changeover signal REV. Accordingly, the description thereof is omitted.

In the even number line panel, as has been described above, the alternation switch changeover signal REV is inverted for every frame in accordance with the output signal of the DF/F11. This causes that the REV and /REV are alternately outputted like REV→/REV→REV→/REV.

In contrast, in the odd number line panel, since the even/odd line discrimination signal is low level, the AND gate 3102 always outputs a signal of low level, irrespective of the signal at the output terminal Q of the DF/F11. The signal that is the resultant of inversion of the signal at the output terminal Q of the DF/F13 is outputted as the alternation switch changeover signal REV via the EX-OR gate 3103 and the inverter 3107. This causes the alternation switch changeover signal REV not to change for every frame.

Figure 8:
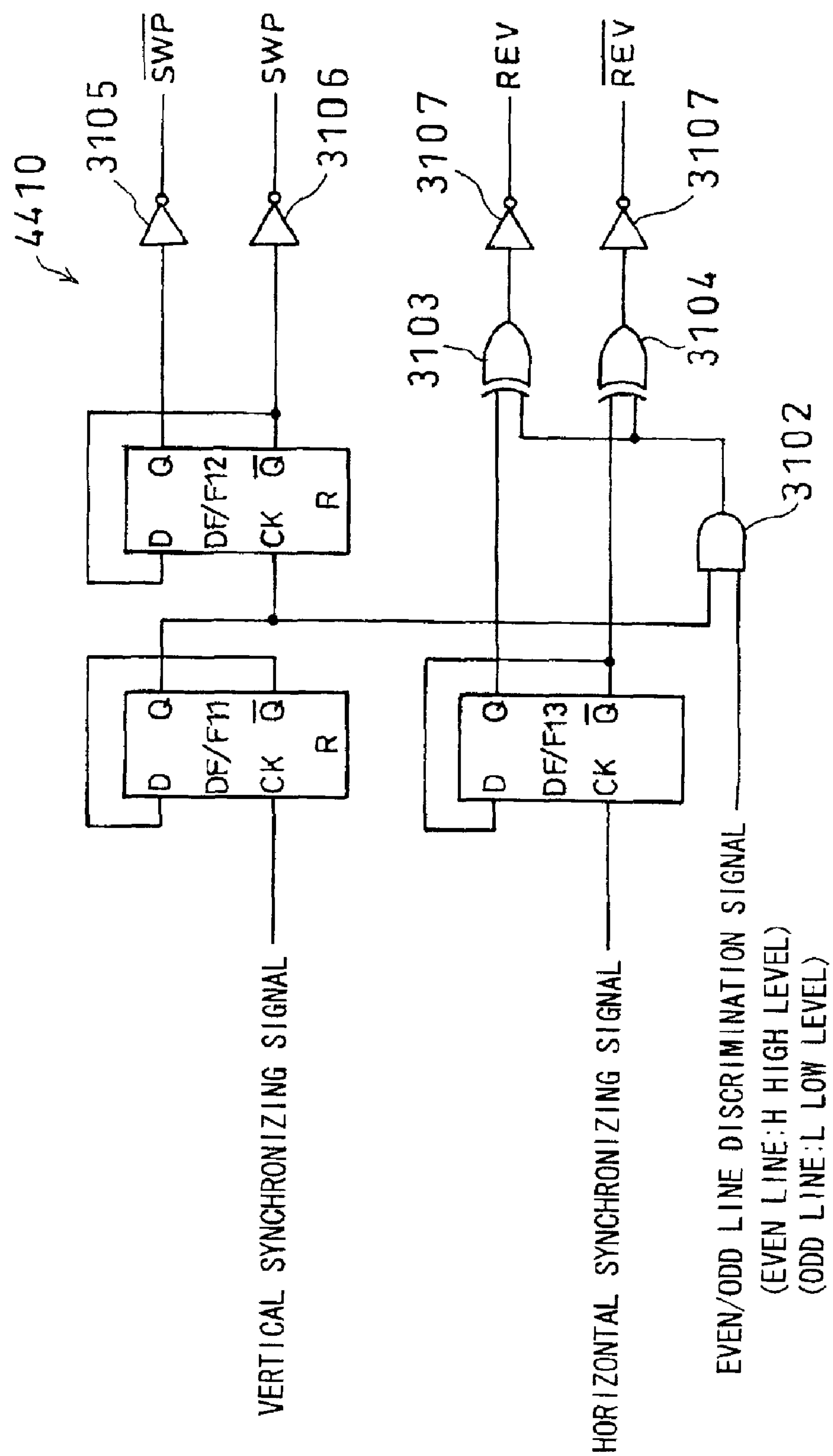
FIG. 8 is a circuit diagram showing a structure of another changeover control circuit in a driving apparatus of liquid crystal display apparatus in accordance with the present invention.
Figure 10:
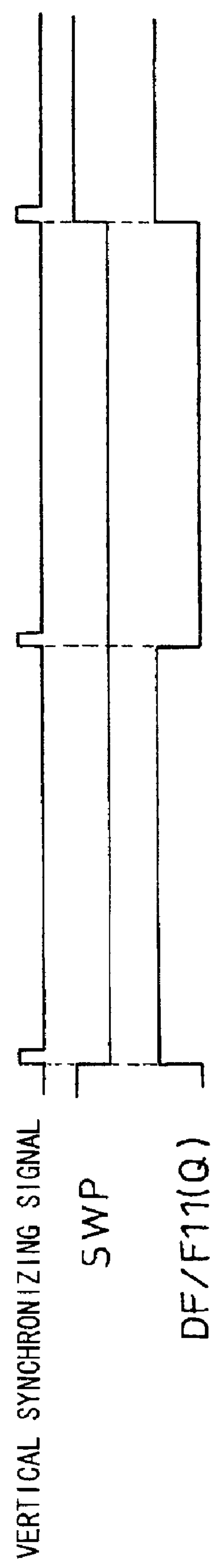
FIG. 10 is a diagram showing wave forms of input and output signals of the changeover control circuit shown in FIG. 8.

As has been described above, the alternation switch changeover signal REV shown in FIG. 8 is also inverted in synchronization with the rising of every horizontal synchronizing signal. Note that FIG. 10 shows wave forms of the main part of the changeover control circuit 4410 and the alternation switch changeover signal REV is not shown therein because it is the same as that in FIG. 4.

FIG. 9 shows how offset voltages of the output circuit disperse in the pixels on a liquid crystal display panel. FIG. 9 shows the case where the number of the horizontal lines (the number of the row lines corresponding to the gate signal lines 3905 in FIG. 12) is an even number. The way how the offset voltage is included in the pixel in accordance with the conditions of the switch changeover signal SWP for the operational amplifier and the alternation switch changeover signal REV is the same way as that of FIG. 4.

In FIG. 9, the polarity of the offset voltage included in a signal that is applied to a pixel is reversed (inverted) for every two frames, and it takes four frames to cancel the offset voltage (the offset voltage is canceled by four frames).

In the present embodiment, unlike the previous embodiment, even when the number of the horizontal lines is changed, it is not necessary to reconsider the counting number of the horizontal synchronizing signals. Therefore, it is possible to realize a source driver having high general-purpose properties.

The above description deals with the case where the switch changeover signal SWP for the operational amplifier is inverted for every two frames. By inverting the switch changeover signal SWP for the operational amplifier for every even number of frames 2 m, the offset voltages (A,B) are appropriately canceled with bridging the frames. Therefore, the deviation occurs in the appearance of the polarities, when inverting the switch changeover signal SWP for the operational amplifier for every odd number of frames 2(m−1).

Accordingly, it is necessary to invert the switch changeover signal SWP for the operational amplifier for every even number of frames 2 m (m: a natural number).

The way to concretely realize the driving method of liquid crystal display panel (driving method in which the polarity of the offset voltage is reversed for every frame) that has been described is only an example. The present invention is not limited to this. It is needless to say that the changes in many ways can be made provided that they fall within the scope of the present invention.

For example, in the changeover circuit shown in FIG. 1, the horizontal synchronizing signal (may be referred to as a latch signal) is used. A start pulse signal (corresponding to, in this case, a signal just after outputted from the controller 3804 shown in FIG. 11, such a signal not transmitting through the shift register circuit 4403 in the source driver) that is generated at a substantially the same timing as the horizontal synchronizing signal may be substituted for the horizontal synchronizing signal while the circuit configuration remains substantially the same.

Further, the foregoing description deals with the case where the changeover control circuit 4409 shown in FIG. 1 is provided in the source driver. Alternatively, the changeover control circuit 4409 may be provided in the controller 3804 shown in FIG. 11 so that the switch changeover signal SWP for the operational amplifier and the alternation switch changeover signal REV are outputted to the source driver. Alternatively, a frequency divider circuit section for the horizontal synchronizing signal or a 2-frequency divider circuit section that divides the frequency of the vertical synchronizing signal so as to be ½ and a changeover section associated with the frequency divider circuit section are separately provided either in the source driver or the controller, while considering the circuit scale of the source driver and the controller and the wiring between circuits. The similar description may be made for the case of the changeover control circuit 4410 shown in FIG. 8.

According to a driving apparatus of liquid crystal display apparatus, as has been described earlier, in accordance with the present invention, an output stage of the liquid crystal driving apparatus that drives the liquid crystal display apparatus based on a dot reverse driving is constituted by first and second differential amplifier sections that (a) switch and amplify noninverted and inverted display input signals in response to first changeover means and (b) further switch and output in response to second changeover means, and is further provided with: (1) count means for counting the horizontal synchronizing signals that scan the liquid crystal display apparatus or a signal outputted for each horizontal synchronizing period and counting a value n satisfying $k \neq c \times n$ (c and n are natural numbers), (2) control means for switching the first changeover means in accordance with the result of the count means, (3) control means for switching the second changeover means for each horizontal synchronizing period in synchronization with the horizontal synchronizing signals that scan the liquid crystal display apparatus or the signal outputted for each horizontal synchronizing period.

According to another driving apparatus of liquid crystal display apparatus, as has been described earlier, in accordance with the present invention, an output stage of the liquid crystal driving apparatus that drives the liquid crystal display apparatus based on a dot reverse driving is constituted by first and second differential amplifier sections that (a) switch and amplify noninverted and inverted display input signals in accordance with first changeover means and (b) further switch and output in response to second changeover means, and is further provided with (1) count means for counting a vertical synchronizing signal indicative of the head part of a frame so as to find a value f satisfying the relation f=2 m (m is a natural number and indicates the number of the vertical synchronizing signals), (2) control means for switching the first changeover means in accordance with the result of the count means, and (3) control means for switching the second changeover means for every horizontal synchronizing period in synchronization with the horizontal synchronizing signal for scanning the liquid crystal display apparatus or a signal that is outputted for every horizontal synchronizing period.

It is preferable that the control means further includes switching means for discriminating whether the liquid crystal display apparatus is an even number line panel or an odd number line panel and for switching, in accordance with the discriminated result, the signal of the second changeover means (a) to noninverted signal each time the vertical synchronizing signal is inputted or (b) to noninverted/inverted signal for every frame.

A driving method of liquid crystal display apparatus in accordance with the present invention, as has been described earlier, an output stage of the liquid crystal driving apparatus that drives the liquid crystal display apparatus based on a dot reverse driving is constituted by first and second differential amplifier sections that (a) switch and amplify noninverted and inverted display input signals in accordance with first changeover means and (b) further switch and output in response to second changeover means, and is arranged so that when the deviations included in the output signals of the respective first and second differential amplifier sections are added to signal voltages to be applied to pixels of the liquid crystal display apparatus, $k \neq c \times n$ (c and n are natural numbers is satisfied, k indicating the number of the horizontal scanning lines), and deviations, that have the same absolute value and a polarity reverse as and to the deviations, are applied to the pixels for every n horizontal lines in which the scanning is successively carried out within a frame or with bridging the next frame.

Another driving method of liquid crystal display apparatus in accordance with the present invention, as has been described earlier, an output stage of the liquid crystal driving apparatus that drives the liquid crystal display apparatus based on a dot reverse driving is constituted by first and second amplifier sections that (a) switch and amplify noninverted and inverted display input signals in accordance with first changeover means and (b) further switch and output in response to second changeover means, and is arranged so that when the deviations included in the output signals of the respective first and second differential amplifier sections are added to signal voltages to be applied to pixels of the liquid crystal display apparatus, deviations, that has the same absolute value and a polarity reverse as and to the deviations, are applied to the pixels for every 2 m (m: a natural number) frames.

It is preferable to further discriminate whether the liquid crystal display apparatus is an even number line panel or an odd number line panel and to drive in accordance with the discriminated result by switching the output signal in the output section to an noninverted signal or to noninverted/inverted for every frame.

With the method, to the utmost, it is possible to avoid the addition of a simple circuit, the increasing of the wiring between the controller and the source driver, and the increasing of the wiring between the respective source drivers. This does not affect the miniaturization of the liquid crystal display module and the low power consumption, accordingly.

As has been earlier described, it is possible to maintain the merit of the low power consumption obtained by being adapted to a type in which the number of the amplifiers of great power consumption is reduced.

Thus, the present invention allows to avoid the display unevenness, to realize the display with high quality, and to develop to a portable devices with ease.

A driving apparatus of liquid crystal display apparatus in accordance with the present invention is provided with (a) first and second amplifier circuits that amplify a noninverted input signal or an inverted input signal, (b) a first changeover circuit that selectively switches and outputs the noninverted and inverted input signals to be outputted to the first and second amplifier circuits, (c) a second changeover circuit that selectively switches and outputs output signals of the respective first and second amplifier circuits to pixels provided in a matrix manner in accordance with an alternation signal, and (d) a changeover, control circuit that controls switching of the first and second changeover circuits so that polarity of an offset voltage to be applied to the pixel by the first and second changeover circuits is changed for every predetermined number of frames and the offset voltage is canceled by frames whose number is twice as many as the predetermined number of frames.

When the driving apparatus, the noninverted input signal and the inverted input signal are switched by the first changeover circuit, and the output signals of the first and second amplifier circuits are switched by the second changeover circuit, respectively. This allows the circuit to output the output signals that have been switched to the pixels provided in a matrix manner so as to drive the liquid crystal display apparatus.

When the difference of the circuit characteristics occurs between the two circuits that should have originally the same characteristic due to the characteristic unevenness occurred by the manufacturing process, it is most likely that an offset voltage occurs.

In view of the deficiency, according to the present invention, the first and second changeover circuits are switched by the changeover control circuit so that (a) the polarity of the offset voltage to be applied to the pixel is changed for every predetermined number of frames and (b) the offset voltage is canceled by frames whose number is twice as many as the predetermined number of frames.

The unevenness of the offset voltages for the respective liquid crystal output terminals is thus indiscernible by the human eyes. This is because the offset voltage is canceled in each pixel for the predetermined number of frames. This allows the circuit to carry out the display with good quality. Thus, it is possible to provide a driving apparatus of liquid crystal display apparatus with extremely high reliability.

It is preferable that the changeover control circuit (a) counts the horizontal synchronizing signals or the signals each of which is outputted for every horizontal synchronizing period, (b) controls the switching of the first changeover circuit in accordance with the first changeover signal that has been subjected to the frequency division so that an integral multiple of the value thus counted is not equal to the number of the horizontal lines, and (c) discriminates whether the number of the horizontal lines is an even number or an odd number and generates, in accordance with the result thus discriminated and a vertical synchronizing signal, the second changeover signal that varies in synchronization with the horizontal synchronizing signal or the signal that is outputted for every horizontal synchronizing period so as to control the switching of the second changeover circuit in accordance with the second changeover signal.

It is preferable that the changeover control circuit includes (a) the first frequency divider circuit that outputs the first changeover signal, (b) the second frequency divider circuit that outputs the signal that varies in synchronization with the horizontal synchronizing signal or the signal that is outputted for every horizontal synchronizing period, (c) the third frequency divider circuit that outputs the signal which varies in synchronization with the vertical synchronizing signal, (d) a logical product circuit that conducts logical product operation with respect to the discriminated result indicative of whether the number of the horizontal lines is an even number or an odd number and an output signal of the third frequency divider circuit, and (e) an exclusive OR circuit that conducts exclusive OR operation with respect to the output signal of the logical product circuit and an output signal of the second frequency divider circuit, the second changeover signal being outputted from the exclusive OR circuit.

In this case, in response to the output signal of the logical product circuit, the signal (the output signal of the second frequency divider circuit), that varies in synchronization with the signal that is outputted for every horizontal synchronizing signal or for every horizontal synchronizing period, is outputted as it is as the second changeover signal or is inverted and outputted as the second changeover signal. In other words, the second changeover signal varies in synchronization with the horizontal synchronizing signal and reflects both (a) the discriminated result indicative of whether the number of the horizontal lines is an even number or an odd number and (b) the vertical synchronizing signal carrying the information about the frames. In accordance with the first and second changeover signals, the changeover control is carried out with respect to the inputs and outputs of the first and second amplifier circuits. This allows the offset voltage to be applied to the pixel and is changed in its polarity for a predetermined number of frames and is canceled for the frames whose number is twice as many as the predetermined number of frames.

Another driving apparatus of liquid crystal display apparatus in accordance with the present invention is provided with (a) first and second amplifier circuits that amplify a noninverted input signal or an inverted input signal, (b) a first changeover circuit that selectively switches and outputs the noninverted and inverted input signals to be outputted to the first and second amplifier circuits, (b) a second changeover circuit that selectively switches and outputs output signals of the respective first and second amplifier circuits to pixels provided in a matrix manner in accordance with an alternation signal, and (c) a changeover control circuit that controls switching of the first and second changeover circuits so that polarity of an offset voltage to be applied to the pixel is changed for every 2 m frames (m: a natural number) and the offset voltage is canceled by 4 m frames.

With the driving apparatus, the noninverted input signal and the inverted input signal are switched by the first changeover circuit, and the output signals of the first and second amplifier circuits are switched by the second changeover circuit, respectively. This allows the circuit to output the output signals that have been switched to the pixels provided in a matrix manner so as to drive the liquid crystal display apparatus.

When the difference of the circuit characteristics occurs between the two circuits that should have originally the same characteristic due to the characteristic unevenness occurred by the manufacturing process, it is most likely that an offset voltage occurs.

In view of the deficiency, according to the present invention, the first and second changeover circuits are switched by the changeover control circuit so that the polarity of an offset voltage to be applied to the pixel is changed for every 2 m frames (m: a natural number) and the offset voltage is canceled by 4 m frames.

The unevenness of the offset voltages for the respective liquid crystal output terminals is thus indiscernible by the human eyes. This is because the offset voltage is canceled in each pixel for the predetermined number of frames. This allows to carry out the display with good quality. Thus, it is possible to provide a driving apparatus of liquid crystal display apparatus with extremely high reliability.

It is preferable that the changeover control circuit (a) controls the switching of the first changeover circuit in accordance with the third changeover signal that is a resultant of the frequency division in which the frequency of the vertical synchronizing signal is divided so as to be ½m, (b) discriminates whether the number of the horizontal lines is an even number or an odd number, (c) generates, in accordance with a result thus discriminated and the vertical synchronizing signal, the second changeover signal that varies in synchronization with a signal that is outputted for every horizontal synchronizing signal or for every horizontal synchronizing period, and (d) controls the switching of the second changeover circuit in accordance with the second changeover signal. In this case, even when the number of the horizontal lines is changed, it is not necessary to consider the frequency division of the horizontal synchronizing signal. This allows to realize a source driver having high general-purpose properties.

A driving method of liquid crystal display apparatus in accordance with the present invention, as has been earlier described, in which (a) noninverted and inverted input signals of first and second amplifier circuits are switched in accordance with a changeover signal and (b) output signals of the first and second amplifier circuits are switched and outputted to pixels provided in a matrix manner in accordance with an alternation signal, comprises the step of: controlling the changeover signal and the alternation signal (1) so that polarity of each offset voltage to be applied to the pixel is changed for every predetermined number of frames and (2) so that the offset voltage is canceled by frames whose number is twice as many as the predetermined number of frames.

With the driving method of liquid crystal display apparatus, the noninverted and inverted input signals of first and second amplifier circuits are switched in accordance with the changeover signal and the output signals of the first and second amplifier circuits are switched and outputted to the pixels provided in a matrix manner in accordance with the alternation signal, respectively.

By the way, the first and second amplifier circuits originally should have the same circuit characteristic. However, it can not be avoided that there occurs a difference between the circuit characteristics due to the reasons such as the unevenness in the process of manufacturing the amplifier circuits. This causes the occurrence of an offset voltage.

In view of the deficiency, according to the present invention, the changeover signal and the alternation signal are controlled so that the polarity of each offset voltage to be applied to the pixel is changed for every predetermined number of frames, and so that the offset voltage is canceled by frames whose number is twice as many as the predetermined number of frames.

The unevenness of the offset voltages for the respective liquid crystal output terminals is thus indiscernible by the human eyes. This is because the offset voltage is canceled in each pixel for the predetermined number of frames. This allows to carry out the display with good quality. Thus, it is possible to provide a driving method of liquid crystal display apparatus with extremely high reliability.

It is preferable (a) to count the horizontal synchronizing signals or the signals that are outputted for every horizontal synchronizing period, (b) to control the changeover signal in accordance with the first changeover signal that has been subjected to the frequency division so that an integral multiple of the value thus counted is not equal to the number of the horizontal lines, and (c) to discriminate whether the number of the horizontal lines is an even number or an odd number and generates, in accordance with the result thus discriminated and a vertical synchronizing signal, the second changeover signal that varies in synchronization with the horizontal synchronizing signal or the signal that is outputted for every horizontal synchronizing period so as to control the alternation signal in accordance with the second changeover signal.

Another driving method of liquid crystal display apparatus in accordance with the present invention, as has been earlier described, in which (a) noninverted and inverted input signals of first and second amplifier circuits are switched in accordance with a changeover signal and (b) output signals of the first and second amplifier circuits are switched and outputted to pixels provided in a matrix manner in accordance with an alternation signal, comprises the step of: (1) controlling the changeover signal and the alternation signal so that polarity of an offset voltage to be applied to the pixel is changed for every 2 m frames (m: a natural number) and the offset voltage is canceled by 4 m frames.

With the driving method of liquid crystal display apparatus, the noninverted and inverted input signals are switched in accordance with the changeover signal and the output signals of the first and second amplifier circuits are switched and outputted to the pixels provided in a matrix manner in accordance with the alternation signal, respectively.

The first and second amplifier circuits originally should have the same circuit characteristic. However, it can not be avoided that there occurs a difference between the circuit characteristics due to the reasons such as the unevenness in the process of manufacturing the amplifier circuits. This causes the occurrence of an offset voltage.

In view of the deficiency, according to the present invention, the changeover signal and the alternation signal are controlled so that polarity of an offset voltage to be applied to the pixel is changed for every 2 m frames (m: a natural number) and the offset voltage is canceled by 4 m frames.

The unevenness of the offset voltages for the respective liquid crystal output terminals is thus indiscernible by the human eyes. This is because the offset voltage is canceled in each pixel for the predetermined number of frames. This allows to carry out the display with good quality. Thus, it is possible to provide a driving method of liquid crystal display apparatus with extremely high reliability.

There are described above novel features which the skilled man will appreciate give rise to advantages. These are each independent aspects of the invention to be covered by the present application, irrespective of whether or not they are included within the scope of the following claims.

What is claimed is:

1. A driving apparatus for a liquid crystal display apparatus, comprising:

first and second amplifier circuits that amplify a noninverted input signal or an inverted input signal; a first changeover circuit that selectively switches and outputs the noninverted and inverted input signals to be outputted to the first and second amplifier circuits;

a second changeover circuit that selectively switches and outputs output signals of the respective first and second amplifier circuits to pixels provided in a matrix manner in accordance with an alternation signal; and a changeover control circuit that controls switching of the first and second changeover circuits so that a polarity of an offset voltage to be applied to the pixel by the first and second changeover circuits is changed every frame for every predetermined number of frames and the offset voltage is canceled by frames whose number is twice as many as the predetermined number of frames.

2. The driving apparatus as set forth in claim 1, wherein the changeover control circuit counts horizontal synchronizing signals or signals each of which is outputted for every horizontal synchronizing period, controls the switching of the first changeover circuit in accordance with a first changeover signal that has been subjected to frequency division so that an integral multiple of a value thus counted is not equal to the number of horizontal lines, and discriminates whether the number of the horizontal lines is an even number or an odd number and generates, in accordance with a result thus discriminated and a vertical synchronizing signal, a second changeover signal that varies in synchronization with the horizontal synchronizing signal or the signal that is outputted for every horizontal synchronizing period so as to control the switching of the second changeover circuit in accordance with the second changeover signal.

3. The driving apparatus as set forth in claim 2, wherein the changeover control circuit includes:

a first frequency divider circuit that outputs the first changeover signal;

a second frequency divider circuit that outputs the signal that varies in synchronization with the horizontal synchronizing signal or the signal that is outputted for every horizontal synchronizing period;

a third frequency divider circuit that outputs a signal which varies in synchronization with the vertical synchronizing signal;

a logical product circuit that conducts logical product operation with respect to the discriminated result indicative of whether the number of the horizontal lines is an even number or an odd number and an output signal of the third frequency divider circuit; and an exclusive OR circuit that conducts exclusive OR operation with respect to the output signal of the logical product circuit and an output signal of the second frequency divider circuit, and generates the second changeover signal.

4. A driving apparatus for a liquid crystal display apparatus, comprising:

first and second amplifier circuits that amplify a noninverted input signal or an inverted input signal;

a first changeover circuit that selectively switches and outputs the noninverted and inverted input signals to be outputted to the first and second amplifier circuits;

a second changeover circuit that selectively switches and outputs output signals of the respective first and second amplifier circuits to pixels provided in a matrix manner in accordance with an alternation signal; and a changeover control circuit that controls switching of the first and second changeover circuits so that a polarity of an offset voltage to be applied to the pixel is changed every frame for every 2m frames and the offset voltage is canceled by 4m frames, where m is a natural number.

5. The driving apparatus as set forth in claim 4, wherein the changeover control circuit controls the switching of the first changeover circuit in accordance with a first changeover signal that is a resultant of frequency division in which a frequency of a vertical synchronizing signal is divided so as to be ½m, discriminates whether a number of horizontal lines is an even number or an odd number, generates, in accordance with a result thus discriminated and a vertical synchronizing signal, a second changeover signal that varies in synchronization with a signal that is outputted for, every horizontal synchronizing signal or for every horizontal synchronizing period, and controls the switching of the second changeover circuit in accordance with the second changeover signal.

6. The driving apparatus as set forth in claim 5, wherein the changeover control circuit includes:

a first frequency divider circuit that outputs the first changeover signal;

a second frequency divider circuit that outputs the signal that varies in synchronization with the horizontal synchronizing signal or the signal that is outputted for every horizontal synchronizing period;

a logical product circuit that conducts logical product operation with respect to the discriminated result indicative of whether the number of the horizontal lines is an even number or an odd number and a signal that varies in synchronization with the vertical synchronizing signal; and an exclusive OR circuit that conducts exclusive OR operation with respect to an output signal of the logical product circuit and an output signal of the second frequency divider circuit, and generates the second changeover signal.

7. A driving method for a liquid crystal display apparatus, comprising:

amplifying a noninverted input signal or an inverted input signal in accordance with first and second amplifier circuits;

selectively switching the noninverted and inverted input signals of the first and second amplifier circuits in accordance with a changeover signal from a first changeover circuit;

selectively switching and outputting output signals of the first and second amplifier circuits in accordance with a second changeover circuit to pixels provided in a matrix manner in accordance with an alternation signal; and controlling the switching of the first and second changeover circuits in accordance with the changeover signal and the alternation signal so that a polarity of each offset voltage to be applied to the pixel is changed every frame for every predetermined number of frames and so that the offset voltage is canceled by frames whose number is twice as many as the predetermined number of frames.

8. The driving method as set forth in claim 7, wherein horizontal synchronizing signals or signals that are outputted for every horizontal synchronizing period are counted, the changeover signal is controlled in accordance with a first changeover signal that has been subjected to frequency division so that an integral multiple of the value thus counted is not equal to the number of horizontal lines, and it is discriminated whether the number of the horizontal lines is an even number or an odd number and generates, in accordance with a result thus discriminated and a vertical synchronizing signal, a second changeover signal that varies in synchronization with the horizontal synchronizing signal or the signal that is outputted for every horizontal synchronizing period so as to control the alternation signal in accordance with the second changeover signal.

9. A driving method for a liquid crystal display apparatus, comprising:

amplifying a noninverted input signal or an inverted input signal in accordance with first and second amplifier circuits;

selectively switching the noninverted and inverted input signals of the first and second amplifier circuits in accordance with a first changeover signal from a first changeover circuit;

selectively switching and outputting output signals of the first and second amplifier circuits in accordance with a second changeover circuit to pixels provided in a matrix manner in accordance with an alternation signal; and controlling the switching of the first and second changeover circuits in accordance with the first changeover signal and the alternation signal so that a polarity of an offset voltage to be applied to the pixel is changed every frame for every 2m frames and the offset voltage is canceled by 4m frames, where m is a natural number.

10. The driving method as set forth in claim 9, further comprising:

counting horizontal synchronizing signals or signals each of which is outputted for every horizontal synchronizing period;

controlling the switching of the first changeover circuit in accordance with the first changeover signal that has been subjected to frequency division so that an integral multiple of a value thus counted is not equal to a number of horizontal lines; and discriminating whether the number of the horizontal lines is an even number or an odd number and generates, in accordance with a result thus discriminated and a vertical synchronizing signal, a second changeover signal that varies in synchronization with the horizontal synchronizing signal or the signal that is outputted for every horizontal synchronizing period so as to control the switching of the second changeover circuit in accordance with the second changeover signal.

11. The driving method as set forth in claim 9, further comprising:

outputting, by a first frequency divider circuit, the first changeover signal;

outputting, by a second frequency divider circuit, the signal that varies in synchronization with the horizontal synchronizing signal or the signal that is outputted for every horizontal synchronizing period;

outputting, by a third frequency divider circuit, a signal which varies in synchronization with the vertical synchronizing signal;

conducting, by a logical product circuit, logical product operation with respect to the discriminated result indicative of whether the number of the horizontal lines is an even number or an odd number and an output signal of the third frequency divider circuit; and conducting, by an exclusive OR circuit, an exclusive OR operation with respect to the output signal of the logical product circuit and an output signal of the second frequency divider circuit, and generating the second changeover signal.

12. The driving method as set forth in claim 9, further comprising:

discriminating whether a number of horizontal lines is an even number or an odd number;

generating, in accordance with a result thus discriminated and a vertical synchronizing signal, a second changeover signal that varies in synchronization with a signal that is outputted for, every horizontal synchronizing signal or for every horizontal synchronizing period; and controlling the switching of the second changeover circuit in accordance with the second changeover signal.

13. The driving method as set forth in claim 9, further comprising:

outputting, by a fourth frequency divider circuit, a third changeover signal;

outputting, by a fifth frequency divider circuit, the signal that varies in synchronization with the horizontal synchronizing signal or the signal that is outputted for every horizontal synchronizing period;

conducting, by a logical product circuit, logical product operation with respect to the discriminated result indicative of whether the number of the horizontal lines is an even number or an odd number and a signal that varies in synchronization with the vertical synchronizing signal; and conducting, by an exclusive OR circuit, exclusive OR operation with respect to an output signal of the logical product circuit and an output signal of the fifth frequency divider circuit, and generates the second changeover signal.

14. The driving method as set forth in claim 9, wherein horizontal synchronizing signals or signals that are outputted for every horizontal synchronizing period are counted, the first changeover signal is controlled in accordance with a signal that has been subjected to frequency division so that an integral multiple of the value thus counted is not equal to a number of the horizontal lines, and it is discriminated whether the number of the horizontal lines is an even number or an odd number and generates, in accordance with a result thus discriminated and a vertical synchronizing signal, a second changeover signal that varies in synchronization with the horizontal synchronizing signal or the signal that is outputted for every horizontal synchronizing period so as to control the alternation signal in accordance with the second changeover signal.

15. A driving method of liquid crystal display apparatus in which noninverted and inverted input signals of first and second amplifier circuits are switched in accordance with a changeover signal and output signals of the first and second amplifier circuits are switched and outputted to pixels provided in a matrix manner in accordance with an alternation signal, comprising the step of:

controlling the changeover signal and the alternation signal so that polarity of each offset voltage to be applied to the pixel is changed for every predetermined number of frames and so that the offset voltage is canceled by frames whose number is twice as many as the predetermined number of frames, wherein horizontal synchronizing signals or signals that are outputted for every horizontal synchronizing period are counted, the changeover signal is controlled in accordance with a first changeover signal that has been subjected to frequency division so that an integral multiple of the value thus counted as not equal to the number of horizontal lines, and it is discriminated whether the number of the horizontal lines is an even number or an odd number and generates, in accordance with a result thus discriminated and a vertical synchronizing signal, a second changeover signal that varies in synchronization with the horizontal synchronizing signal or the signal that is outputted for every horizontal synchronizing period so as to control the alternation signal in accordance with the second changeover signal.

16. A driving method of liquid crystal display apparatus in which noninverted and inverted input signals of first and second amplifier circuits are switched in accordance with a changeover signal and output signals of the first and second amplifier circuits are switched and outputted to pixels provided in a matrix manner in accordance with an alternation signal, comprising the step of:

controlling the changeover signal and the alternation signal so that polarity of an offset voltage to be applied to the pixel is changed for every 2m frames and the offset voltage is canceled by 4m frames, where m is a natural;

counting horizontal synchronizing signals or signals each of which is outputted for every horizontal synchronizing period;

controlling the switching of the first changeover circuit in accordance with the first changeover signal that has been subjected to frequency division so that an integral multiple of a value thus counted is not equal to a number of horizontal lines; and discriminating whether the number of the horizontal lines is an even number or an odd number and generates, in accordance with a result thus discriminated and a vertical synchronizing signal, a second changeover signal that varies in synchronization with the horizontal synchronizing signal or the signal that is outputted for every horizontal synchronizing period so as to control the switching of the second changeover circuit in accordance with the second changeover signal.

17. A driving method of liquid crystal display apparatus in which noninverted and inverted input signals of first and second amplifier circuits are switched in accordance with a changeover signal and output signals of the first and second amplifier circuits are switched and outputted to pixels provided in a matrix manner in accordance with an alternation signal, comprising the step of:

controlling the changeover signal and the alternation signal so that polarity of an offset voltage to be applied to the pixel is changed for every 2m frames and the offset voltage is canceled by 4m frames, where m is a natural number;

outputting, by a first frequency divider circuit, the first changeover signal;

outputting, by a second frequency divider circuit, the signal that varies in synchronization with the horizontal synchronizing signal or the signal that is outputted for every horizontal synchronizing period;

outputting, by a third frequency divider circuit, a signal which varies in synchronization with the vertical synchronizing signal;

conducting, by a logical product circuit, logical product operation with respect to the discriminated result indicative of whether the number of the horizontal lines is an even number or an odd number and an output signal of the third frequency divider circuit; and conducting, by an exclusive OR circuit, an exclusive OR operation with respect to the output signal of the logical product circuit and an output signal of the second frequency divider circuit, and generating the second changeover signal.

18. A driving method of liquid crystal display apparatus in which noninverted and inverted input signals of first and second amplifier circuits are switched in accordance with a changeover signal and output signals of the first and second amplifier circuits are switched and outputted to pixels provided in a matrix manner in accordance with an alternation signal, comprising the step of:

controlling the changeover signal and the alternation signal so that polarity of an offset voltage to be applied to the pixel is changed for every 2m frames and the offset voltage is canceled by 4m frames, where m is a natural number;

discriminating whether a number of horizontal lines is an even number or an odd number;

generating, in accordance with a result thus discriminated and a vertical synchronizing signal, a second changeover signal that varies in synchronization with a signal that is outputted for, every horizontal synchronizing signal or for every horizontal synchronizing period; and controlling the switching of the second changeover circuit in accordance with the second changeover signal.

19. A driving method of liquid crystal display apparatus in which noninverted and inverted input signals of first and second amplifier circuits are switched in accordance with a changeover signal and output signals of the first and second amplifier circuits are switched and outputted to pixels provided in a matrix manner in accordance with an alternation signal, comprising the step of:

controlling the changeover signal and the alternation signal so that polarity of an offset voltage to be applied to the pixel is changed for every 2m frames and the offset voltage is canceled by 4m frames, where m is a natural number;

outputting, by a fourth frequency divider circuit, a third changeover signal;

outputting, by a fifth frequency divider circuit, the signal that varies in synchronization with the horizontal synchronizing signal or the signal that is outputted for every horizontal synchronizing period;

conducting, by a logical product circuit, logical product operation with respect to the discriminated result indicative of whether the number of the horizontal lines is an even number or an odd number and a signal that varies in synchronization with the vertical synchronizing signal; and conducting, by an exclusive OR circuit, exclusive OR operation with respect to an output signal of the logical product circuit and an output signal of the fifth frequency divider circuit, and generates the second changeover signal.

20. A driving method of liquid crystal display apparatus in which noninverted and inverted input signals of first and second amplifier circuits are switched in accordance with a changeover signal and output signals of the first and second amplifier circuits are switched and outputted to pixels provided in a matrix manner in accordance with an alternation signal, comprising the step of:

controlling the changeover signal and the alternation signal so that polarity of an offset voltage to be applied to the pixel is changed for every 2m frames and the offset voltage is canceled by 4m frames, where m is a natural number, wherein horizontal synchronizing signals or signals that are outputted for every horizontal synchronizing period are counted, the first changeover signal is controlled in accordance with a signal that has been subjected to frequency division so that an integral multiple of the value thus counted is not equal to a number of the horizontal lines, and it is discriminated whether the number of the horizontal lines is an even number or an odd number and generates, in accordance with a result thus discriminated and a vertical synchronizing signal, a second changeover signal that varies in synchronization with the horizontal synchronizing signal or the signal that is outputted for every horizontal synchronizing period so as to control the alternation signal in accordance with the second changeover signal.

* * * * *